United States Patent
Yamamoto et al.

(10) Patent No.: US 10,061,150 B2
(45) Date of Patent: Aug. 28, 2018

(54) LIGHT CONTROL FILM, DISPLAY DEVICE, AND METHOD FOR MANUFACTURING LIGHT CONTROL FILM

(71) Applicant: Sharp Kabushiki Kaisha, Osaka-shi, Osaka (JP)

(72) Inventors: Emi Yamamoto, Osaka (JP); Tsuyoshi Maeda, Osaka (JP); Toru Kanno, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 190 days.

(21) Appl. No.: 14/387,895

(22) PCT Filed: Mar. 15, 2013

(86) PCT No.: PCT/JP2013/057419
§ 371 (c)(1),
(2) Date: Sep. 25, 2014

(87) PCT Pub. No.: WO2013/146353
PCT Pub. Date: Oct. 3, 2013

(65) Prior Publication Data
US 2015/0042935 A1 Feb. 12, 2015

(30) Foreign Application Priority Data
Mar. 28, 2012 (JP) .................. 2012-074766

(51) Int. Cl.
*G02F 1/1335* (2006.01)
*G02B 5/02* (2006.01)
*G03F 7/20* (2006.01)

(52) U.S. Cl.
CPC ...... *G02F 1/133504* (2013.01); *G02B 5/0231* (2013.01); *G02B 5/0236* (2013.01); *G02B 5/0242* (2013.01); *G02B 5/0294* (2013.01); *G02F 1/133512* (2013.01); *G03F 7/20* (2013.01); *G02F 2001/133562* (2013.01)

(58) Field of Classification Search
CPC ......... G02F 1/133504; G02F 1/133512; G02F 2001/133562; G02B 5/0226; G02B 5/0231; G02B 5/0247
See application file for complete search history.

(56) References Cited

U.S. PATENT DOCUMENTS

| 5,521,726 | A | 5/1996 | Zimmerman et al. |
| 6,636,355 | B2 * | 10/2003 | Moshrefzadeh ..... G03B 21/625 359/453 |

(Continued)

FOREIGN PATENT DOCUMENTS

| JP | 08-220519 A | 8/1996 |
| JP | 2000-352608 A | 12/2000 |
| JP | 2003-050307 A | 2/2003 |

(Continued)

*Primary Examiner* — Paisley L Arendt
(74) *Attorney, Agent, or Firm* — Keating & Bennett, LLP

(57) ABSTRACT

A light control film includes a light shielding layer and a light diffusion portion, and, when an area of a part where the light shielding layer is in contact with one surface of the base material is set to S1, and an area of a part where a low refractive index portion is exposed between light incidence end surfaces is set to S2, the light shielding layer and the light diffusion portion are formed so as to satisfy $(S1-S2)/S1 \times 100 \geq 50$.

20 Claims, 35 Drawing Sheets

(56) References Cited

U.S. PATENT DOCUMENTS

2008/0303777 A1* 12/2008 Inoue .................. G02B 3/0056
                                                        345/102
2012/0200930 A1*  8/2012 Yamamoto ........... G02B 5/0231
                                                        359/599

FOREIGN PATENT DOCUMENTS

| JP | 2003-066206 A | 3/2003 | |
|----|---------------|--------|---|
| JP | 2005-114953 A | 4/2005 | |
| JP | 4129991 B2 | 8/2008 | |
| JP | WO 2011052255 A1 * | 5/2011 | ........... G02B 5/0231 |

* cited by examiner

40C

40

40K

40L

40M

40N

40P

141

141G

141H

141I

141J

141K

141L

141M

141N

141P

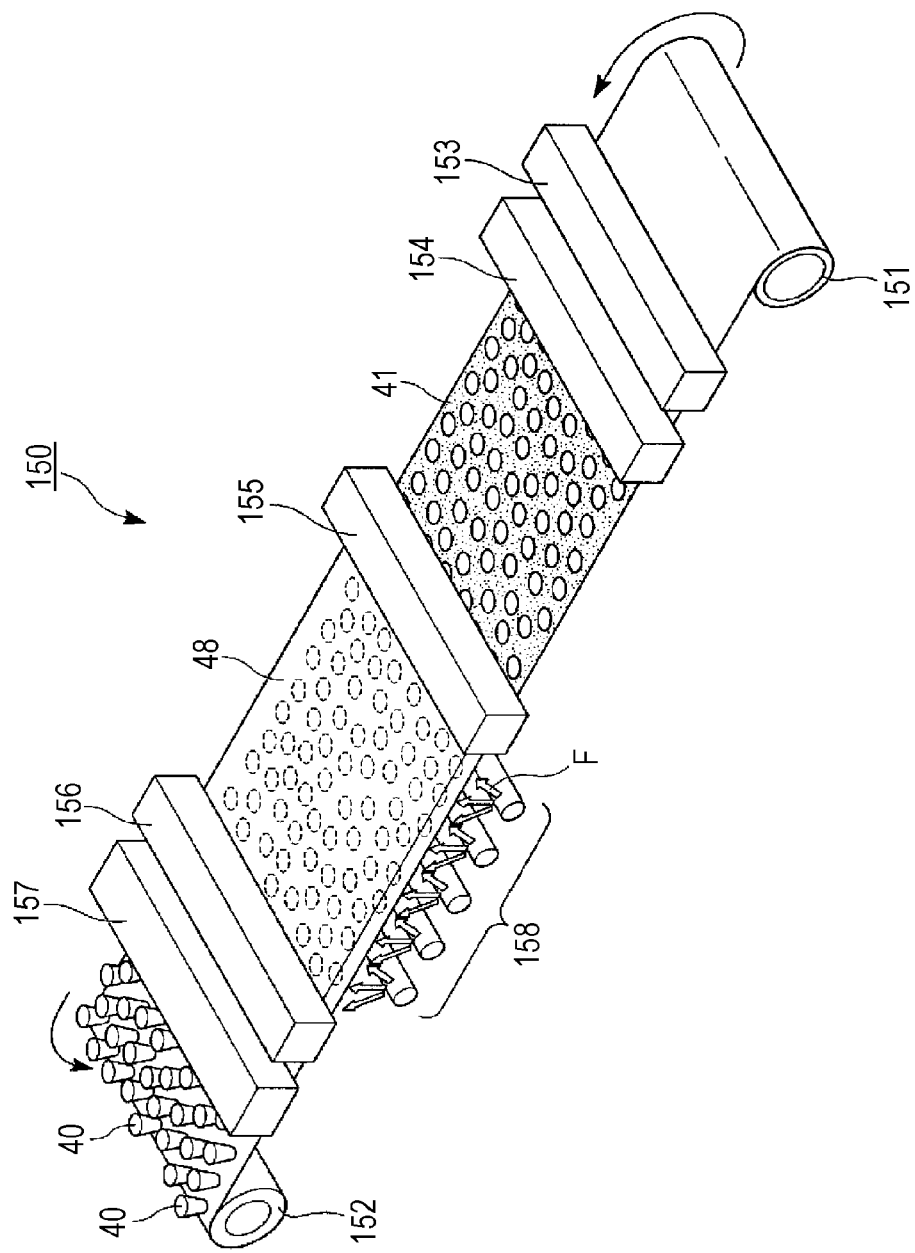

LIGHT CONTROL FILM, DISPLAY DEVICE, AND METHOD FOR MANUFACTURING LIGHT CONTROL FILM

TECHNICAL FIELD

The present invention relates to a light control film, a display device, and a method for manufacturing the light control film capable of improving display quality by improving contrast.

The present application is based upon and claims the benefit of priority from Japanese Patent Application No. 2012-074766, filed Mar. 28, 2012, the entire contents of which are incorporated herein by reference.

BACKGROUND ART

A liquid crystal display device is widely used in a display unit or the like of a thin television set or a mobile phone. In relation to performance of the liquid crystal display device, the liquid crystal display device has a good display performance when a display surface is viewed from a front side, but contrast decreases and thus visibility tends to degrade when viewed in an oblique direction. In addition, there is a case where, in grayscale display, grayscale inversion in which brightness is inverted occurs, and thus a display performance is degraded. For this reason, there is a problem in that a so-called viewing angle at which a screen can be observed with favorable visibility is narrow.

Therefore, in the related art, various methods of widening a viewing angle range in which a screen can be observed with favorable visibility have been proposed.

For example, PTL 1 discloses a light diffusion sheet provided with a plurality of unit lenses. The unit lenses in the light diffusion sheet are formed in a one-dimensional direction or two-dimensional directions, each of which includes a total reflection portion in which some incident light is totally reflected at an inner surface, and a high refractive index portion which is made of a material with a predetermined refractive index N1. In addition, a low refractive index portion which is filled with a material having a predetermined refractive index N2 is formed between the unit lenses.

Each unit lens has an approximately trapezoidal shape as a cross-sectional shape; and a lower side of the trapezoid is a light incidence portion, oblique sides form the total reflection portion, and an upper side forms a light emission portion. When an angle formed between an oblique side forming the total reflection portion and a normal to the light emission portion is set to θ, θ is set to have a specific relationship with N1 and N2, the cross sectional shape of the low refractive index portion interposed between the adjacent unit lenses is a substantially triangular shape, an edge of the light incidence portion has a curved shape with a predetermined curvature or is substantially trapezoidal, and the upper side of the light incidence portion has a shape which is parallel to or diagonal with respect to the lower side.

With the light diffusion sheet having this configuration, incident light which is parallel to a normal to a light emission surface is totally reflected at the oblique sides of the unit lens, and thus the light can be emitted toward an observer side without the occurrence of reflection of light on the light emission surface. Therefore, it is considered that a light diffusion sheet with high luminance and contrast can be obtained.

CITATION LIST

Patent Literature

PTL 1: Japanese Unexamined Patent Application Publication No. 2005-114953

SUMMARY OF INVENTION

Technical Problem

However, in the invention disclosed in the above PTL 1, in a case where a cross-sectional shape of the low refractive index portion interposed between the adjacent unit lenses is a curved shape in which the edge of the light incidence portion has a predetermined curvature, or has a width on the light incidence portion side as a substantially trapezoidal shape, light which is directly incident to the low refractive index portion is absorbed by the colored low refractive index portion, and thus the light is not emitted from the emission surface side. For this reason, there is a problem in that an amount of emitted light is reduced due to degradation of light use efficiency of the light diffusion sheet, and thus a screen is darkened when used in a display device.

The present invention has been made in consideration of the circumstances, and an object thereof is to provide a light control film, a display device, and a method for manufacturing the light control film capable of improving contrast in a wide viewing angle range and improving display quality.

In order to solve the problems, several aspects of the present invention propose the following light control film, display device, and method for manufacturing the light control film.

In other words, a light control film of the present invention includes at least a light-transmissive base material; a light diffusion portion that is disposed in a partial region which makes up part of one surface of the base material; and a light shielding layer that is disposed in a remaining region excluding the partial region, in which the light diffusion portion is formed so as to be thicker than the light shielding layer between a light emission end surface which is in contact with one surface of the base material and a light incidence end surface which is separated from the light emission end surface in a thickness direction, and an area of the light emission end surface is smaller than an area of the light incidence end surface, in which low refractive index portion which is filled with a material having a refractive index lower than a refractive index of a material forming the light diffusion portion is formed in a space partitioned by the light shielding layer and outer circumferential surfaces of the light diffusion portion, and in which the light shielding layer and the light diffusion portion are formed in a shape satisfying Expression (1) when an area of a part where the light shielding layer is in contact with one surface of the base material is set to S1, and an area of a part where the low refractive index portion is exposed between the light incidence end surfaces is set to S2.

[Math. 1]

$$(S1-S2)/S1 \times 100 \geq 50 \qquad \text{Expression (1)}$$

The outer circumferential surface of the light diffusion portion forms a tilted surface which spreads from the light emission end surface to the light incidence end surface, and the tilted surface is tilted in a range of 41 degrees to 89 degrees with respect to the light incidence end surface.

A planar shape of the part where the light shielding layer is in contact with one surface of the base material is an anisotropic shape having at least a major axis and a minor axis.

A planar shape of the part where the light shielding layer is in contact with one surface of the base material is formed so as to be a mixture of an isotropic shape and an anisotropic shape.

A planar shape of the part where the light shielding layer is in contact with one surface of the base material is a polygonal shape.

A planar shape of the part where the light shielding layer is in contact with one surface of the base material is a shape formed by a curve and a straight line.

The low refractive index material is air or an inert gas.

The light diffusion portion is disposed in a plurality on one surface of the base material, and a tilt angle of a tilted surface of at least one light diffusion portion is different from tilt angles of tilted surfaces of other light diffusion portions.

A tilt angle of the tilted surface of the light diffusion portion gradually increases or gradually decreases between the light emission end surface and the light incidence end surface.

A light scattering layer including a light scattering body is further provided between the base material and the light diffusion portion.

A light scattering layer including a light scattering body is further provided so as to overlap the other surface side of the base material.

The light shielding layer is made of a black resin containing at least one of a light absorption pigment, a light absorption dye, and carbon black, or a metal, or is formed of a multilayer film of metal oxides.

A display device according to the present invention includes the light control film according to the above description; and a display body joined to the light control film.

The display body includes a plurality of pixels forming a display image, and, each of the plurality of pixels includes at least a part of the light shielding layer of a light diffusion member.

The display body includes a plurality of pixels forming a display image, and the light diffusion portion is disposed so that a maximum pitch between the light diffusion portions adjacent to each other is smaller than a pitch between the pixels of the display body.

The display body includes a light source and a light modulation element that modulates light from the light source, and the light source emits directive light.

The display body is a liquid crystal display element.

A method for manufacturing a light control film of the present invention is a method for manufacturing the light control film according to the above description, the method including a step of forming the light shielding layer so as to overlap the base material; a step of forming an opening through which the base material is exposed to the light shielding layer; and a step of forming a light diffusion portion in which the light scattering body is dispersed and disposed in a plurality in the opening, by using the light shielding layer as a mask.

The light shielding layer is formed by using any one of a black resin, a black ink, a metal, and a multilayer film of a metal and a metal oxide.

Advantageous Effects of Invention

According to the present invention, it is possible to provide a light control film, a display device, and a method for manufacturing the light control film capable of improving contrast in a wide viewing angle range and improving display quality.

BRIEF DESCRIPTION OF DRAWINGS

FIG. 28 is a perspective view illustrating an example of a manufacturing device of a light control film.

DESCRIPTION OF EMBODIMENTS

Hereinafter, with reference to the drawings, description will be made of a light control film, a display device, and a method for manufacturing the light control film according to the present invention. In addition, the following embodiments are described in detail for better understanding of the spirit of the invention, and do not limit the present invention unless particularly stated. Further, for convenience, the drawings used in the following description illustrate parts that constitute a main portion in an enlarged manner to allow better understanding of the features of the present invention in some cases, and dimensional ratios of the constituent elements cannot be said to be the same as actual ones.

Hereinafter, a first embodiment of a liquid crystal display device provided with a light control film according to the present invention will be described with reference to FIGS. 1A to 5E. In addition, in the present embodiment, a liquid crystal display device provided with a transmissive liquid crystal panel will be described as an example of the display device.

Figure 1A:
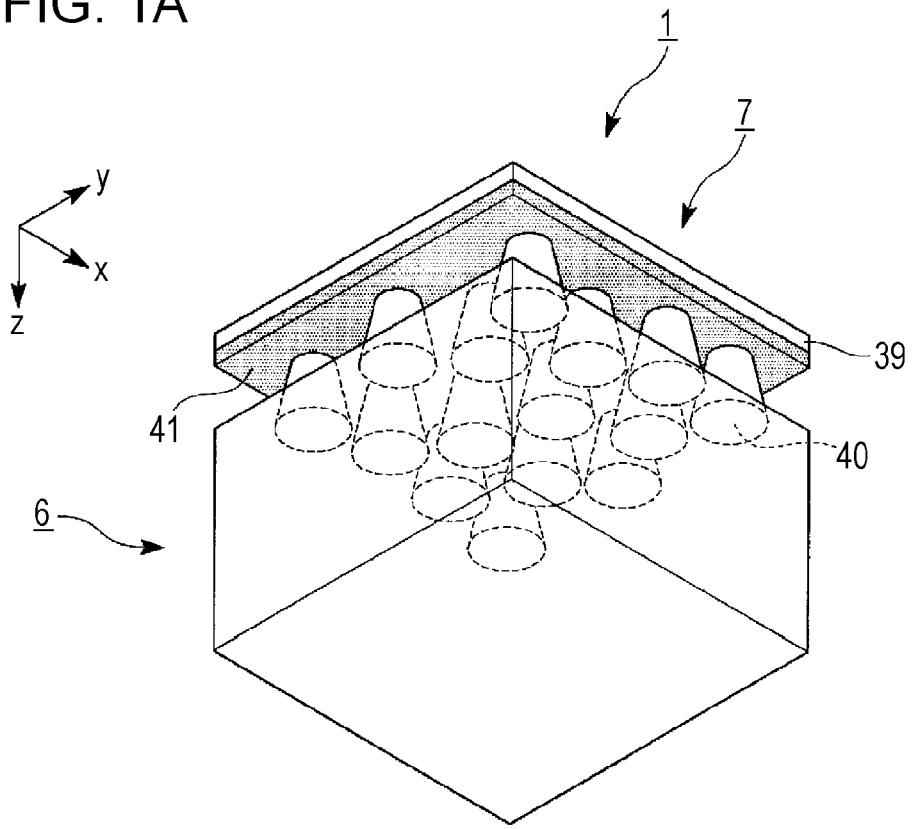
FIG. 1A is a schematic perspective view illustrating a liquid crystal display device of a first embodiment of the present invention.
Figure 1B:
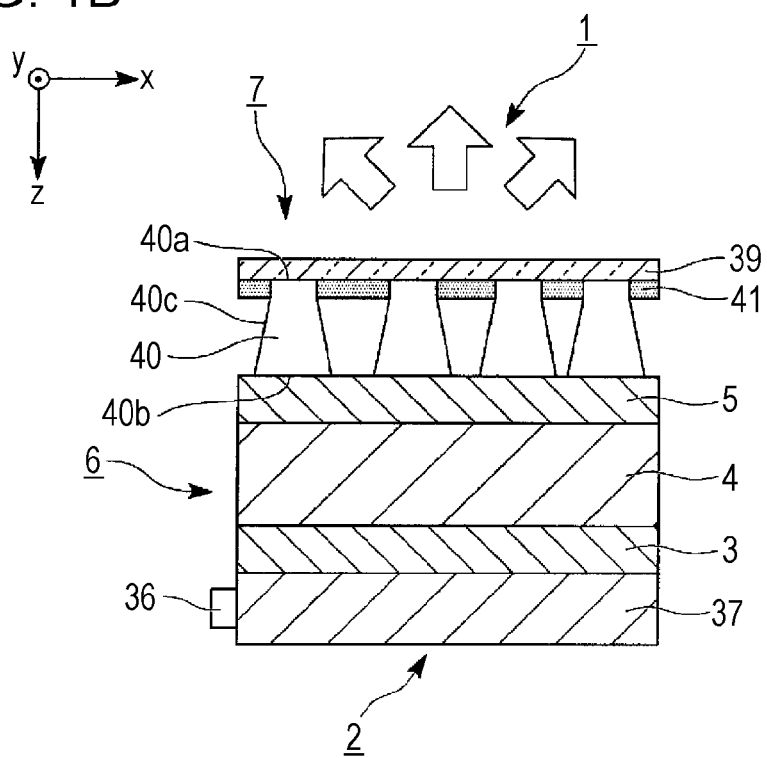
FIG. 1B is a schematic cross-sectional view illustrating the liquid crystal display device of the first embodiment of the present invention.

FIGS. 1A and 1B are schematic diagrams illustrating the liquid crystal display device of the present embodiment. FIG. 1A is a perspective view in which the liquid crystal display device 1 of the present embodiment is obliquely viewed from a lower side (rear surface side), and FIG. 1B is a cross-sectional view of the liquid crystal display device of the present embodiment.

The liquid crystal display device 1 (display device) of the present embodiment includes, as illustrated in FIGS. 1A and 1B, a liquid crystal display body 6 (display body) provided with a backlight 2 (light source), a first polarization plate 3, a liquid crystal panel 4 (light modulation element), and a second polarization plate 5, and a light control film 7 (a viewing angle widening member or a light diffusion member). In FIG. 1B, the liquid crystal panel 4 is schematically illustrated in a plate shape, and a detailed structure thereof will be described later. An observer views a display from the upper side of the liquid crystal display device 1 in FIG. 1B in which the light control film 7 is disposed. Therefore, in the following description, the side on which the light control film 7 is disposed is referred to as a viewing side, and the side on which the backlight 2 is disposed is referred to as a rear surface side.

In the liquid crystal display device 1 of the present embodiment, light emitted from the backlight 2 which emits directive light (illumination light) is modulated by the liquid crystal panel 4, and predetermined images or characters, or the like are displayed with the modulated light. In addition, if light emitted from the liquid crystal panel 4 is transmitted through the light control film 7, the light is emitted from the light control film 7 in a state in which an angle distribution of the emitted light is more widely spread than that before being incident to the light control film 7. Accordingly, the observer can view the display with a wide viewing angle.

Hereinafter, a specific configuration example of the liquid crystal panel 4 will be described.

Herein, an active matrix transmissive liquid crystal panel will be described as an example, but liquid crystal panels applicable to the present invention are not limited to an active matrix transmissive liquid crystal panel. Liquid crystal panels applicable to the present invention may be, for example, a transflective (transmissive and reflective) liquid crystal panel, or a reflective liquid crystal panel, and further may be a passive matrix liquid crystal panel in which each pixel does not include a switching thin film transistor (hereinafter, abbreviated to a TFT).

Figure 2:
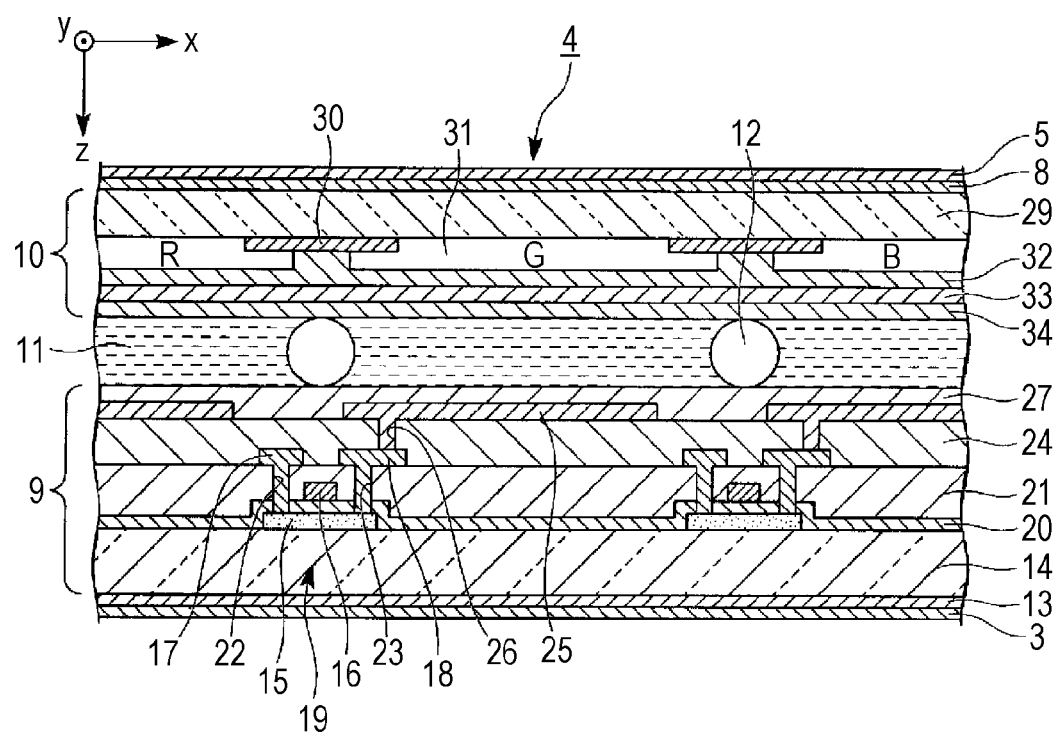
FIG. 2 is a cross-sectional view illustrating a liquid crystal panel in the liquid crystal display device of the first embodiment of the present invention.

FIG. 2 is a longitudinal cross-sectional view of the liquid crystal panel 4.

The liquid crystal panel 4 includes, as illustrated in FIG. 2, a TFT substrate 9 as a switching element substrate, a color filter substrate 10 which is disposed so as to oppose the TFT substrate 9, and a liquid crystal layer 11 interposed between the TFT substrate 9 and the color filter substrate 10. The liquid crystal layer 11 is sealed in a space surrounded by the TFT substrate 9, the color filter substrate 10, and a frame-shaped seal member (not illustrated) which joins the TFT substrate 9 to the color filter substrate 10 with a predetermined gap therebetween.

The liquid crystal panel 4 of the present embodiment performs display, for example, in a vertical alignment (VA) mode, and vertical alignment liquid crystal with negative dielectric anisotropy is used in the liquid crystal layer 11.

Spherical spacers 12 for maintaining the gap between the substrates constant are disposed between the TFT substrate 9 and the color filter substrate 10. In addition, a display mode is not limited to the VA mode, and may employ a twisted nematic (TN) mode, a super twisted nematic (STN) mode, an in-plane switching (IPS) mode, a fringe field switching (FFS) mode, and the like.

A plurality of pixels (not illustrated) each of which is the minimum unit region of display are arranged in a matrix on the TFT substrate 9. A plurality of source bus lines (not illustrated) are formed so as to extend parallel to each other, and a plurality of gate bus lines (not illustrated) are formed so as to extend parallel to each other and to be perpendicular to the plurality of source bus lines, on the TFT substrate 9.

Therefore, the plurality of source bus lines and the plurality of gate bus lines are formed in a lattice shape on the TFT substrate 9, and a rectangular region partitioned by adjacent source bus lines and adjacent gate bus lines becomes a single pixel. Each source bus line is connected to a source electrode of a TFT described later, and the corresponding gate bus line is connected to a gate electrode of the TFT.

A TFT 19 having a semiconductor layer 15, a gate electrode 16, a source electrode 17, and a drain electrode 18 is formed on a surface of a transparent substrate 14 included in the TFT substrate 9 on the liquid crystal layer 11 side.

For example, a glass substrate may be used as the transparent substrate 14. The semiconductor layer 15 which is made of a semiconductor material such as continuous grain silicon (CGS), low-temperature poly-silicon (LPS), or amorphous silicon (a-Si) is formed on the transparent substrate 14.

In addition, a gate insulating film 20 is formed so as to cover the semiconductor layer 15 on the transparent substrate 14. As a material of the gate insulating film 20, for example, a silicon oxide film, a silicon nitride film, or a multilayer film composed of these films may be used. The gate electrode 16 is formed so as to oppose the semiconductor layer 15 on the gate insulating film 20. As a material of the gate electrode 16, for example, a multilayer film composed of tungsten (W)/tantalum nitride (TaN), molybdenum (Mo), titanium (Ti), or aluminum (Al) is used.

A first interlayer insulating film 21 is formed so as to cover the gate electrode 16 on the gate insulating film 20. As a material of the first interlayer insulating film 21, for example, a silicon oxide film, a silicon nitride film, or a multilayer film composed of these films may be used.

The source electrode 17 and the drain electrode 18 are formed on the first interlayer insulating film 21. The source electrode 17 is connected to a source region of the semiconductor layer 15 via a contact hole 22 which penetrates through the first interlayer insulating film 21 and the gate insulating film 20. Similarly, the drain electrode 18 is connected to a drain region of the semiconductor layer 15 via a contact hole 23 which penetrates through the first interlayer insulating film 21 and the gate insulating film 20. As a material of the source electrode 17 and the drain electrode 18, the same material as the above-described conductive material of the gate electrode 16 may be used.

A second interlayer insulating film 24 is formed so as to cover the source electrode 17 and the drain electrode 18 on the first interlayer insulating film 21. As a material of the second interlayer insulating film 24, the same material as the above-described material of the first interlayer insulating film 21, or an organic insulating material may be used.

A pixel electrode 25 is formed on the second interlayer insulating film 24. The pixel electrode 25 is connected to the drain electrode 18 via a contact hole 26 which penetrates through the second interlayer insulating film 24. Therefore, the pixel electrode 25 is connected to the drain region of the semiconductor layer 15 by using the drain electrode 18 as a relay electrode. As a material of the pixel electrode 25, for example, a transparent conductive material such as indium tin oxide (ITO) or indium zinc oxide (IZO) may be used.

With this configuration, when a scanning signal is supplied via the gate bus line, and thus the TFT 19 is turned on, an image signal which is supplied to the source electrode 17 via the source bus line is supplied to the pixel electrode 25 via the semiconductor layer 15 and the drain electrode 18. In addition, an alignment film 27 is formed so as to cover the pixel electrode 25 over the entire surface of the second interlayer insulating film 24. The alignment film 27 has an alignment restricting force for vertically aligning liquid crystal molecules forming the liquid crystal layer 11. Further, the type of TFT may be a bottom gate type TFT illustrated in FIG. 2, and may be a top gate type TFT.

On the other hand, black matrices 30, color filters 31, a planarization layer 32, a counter electrode 33, and an alignment film 34 are sequentially formed on a surface of a transparent substrate 29 forming the color filter substrate 10 on the liquid crystal layer 11 side. The black matrix 30 has a function of blocking transmission of light in regions between the pixels. The black matrix 30 is made of, for example, a metal such as chromium (Cr), or a multilayer film of Cr/chromium oxide, or a photoresist in which carbon particles are dispersed in a photosensitive resin.

Coloring matters of respective colors including red (R), green (G), and blue (B) are included in the color filters 31. Any one of the R, G and B color filters 31 is disposed so as to oppose a single pixel electrode 25 on the TFT substrate 9. In addition, the color filters 31 may have a multi-color configuration of three or more colors including R, G, and B.

The planarization layer 32 is formed of an insulating film which covers the black matrices 30 and the color filters 31. The planarization layer 32 has a function of smoothing and planarizing step differences due to the black matrices 30 and the color filters 31. The counter electrode 33 is formed on the planarization layer 32. As a material of the counter electrode 33, the same material as the transparent conductive material of the pixel electrode 25 is used. In addition, the alignment film 34 having a vertical alignment restricting force is formed over the entire surface of the counter electrode 33.

As illustrated in FIG. 1B, the backlight 2 includes a light source 36 such as a light emitting diode or a cold cathode tube, and a light guide plate 37 which emits light toward the liquid crystal panel 4 by using internal reflection of the light emitted from the light source 36. The backlight 2 may be of an edge light type in which a light source is disposed on an end surface of a light guide body, and may be of a direct type in which a light source is disposed directly under a light guide body.

As the backlight 2 used in the present embodiment, a backlight which has directivity as a result of a light emitting direction thereof being controlled, a so-called directive backlight is preferably used. By using a directive backlight which allows collimated or approximately collimated light to be incident to a light diffusion portion of the light control film 7 described later, blurring is reduced, and thus light use efficiency can be increased.

The directive backlight 2 may be implemented by optimizing a shape or an arrangement of reflective patterns formed in the light guide plate 37. Alternatively, the directivity can be realized by disposing louvers on the backlight. In addition, the first polarization plate 3 which functions as a polarizer is provided between the backlight 2 and the liquid crystal panel 4. Further, the second polarization plate 5 which functions as a polarizer is provided between the liquid crystal panel 4 and the light control film 7.

Next, the light control film according to an embodiment of the present invention will be described in detail.

Figure 3A:
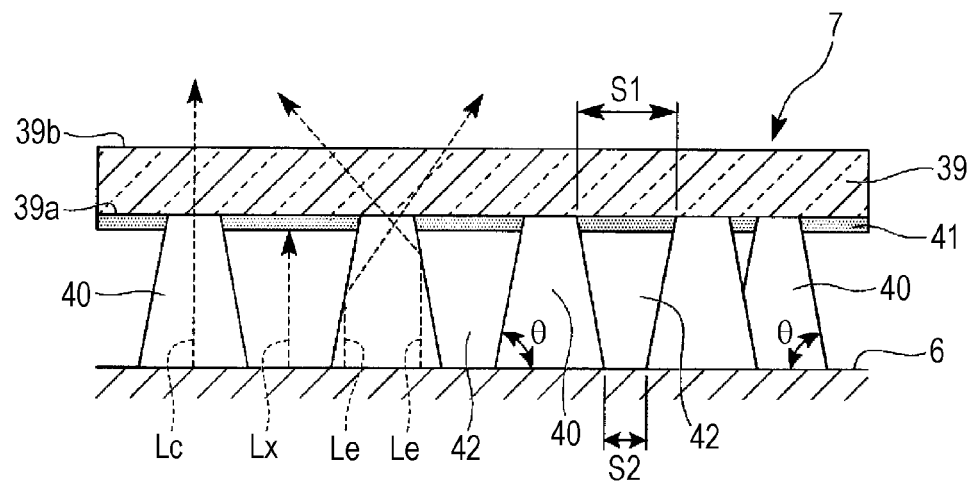
FIG. 3A is a schematic cross-sectional view illustrating an operation of a light control film of the first embodiment of the present invention.
Figure 3B:
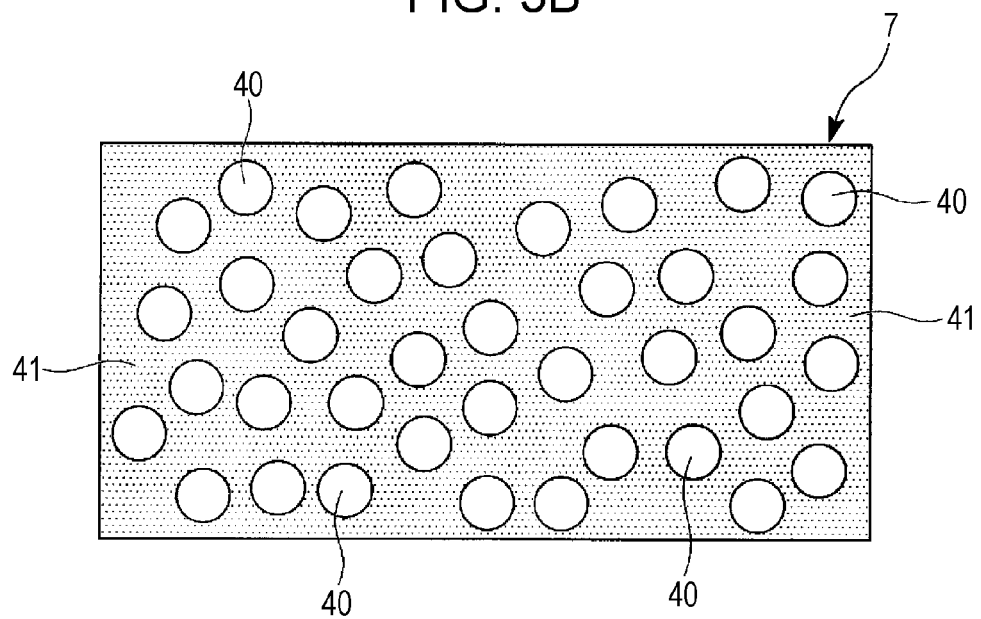
FIG. 3B is a schematic plan view illustrating an operation of the light control film of the first embodiment of the present invention.

FIG. 3A is a cross-sectional view illustrating the light control film. In addition, FIG. 3B is a plan view in which the light control film is viewed from the emission surface side.

The light control film 7 includes, as illustrated in FIGS. 1A, 1B and 3A, a light-transmissive base material 39, light diffusion portions 40 which are disposed in a partial region that makes up part of one surface 39a (a surface on an opposite side to the viewing side) of the base material 39, a light shielding layer 41 which is disposed in a remaining region excluding the partial region in which the light diffusion portions 40 are disposed, and a low refractive index portion 42 which is partitioned by a tilted surface (outer circumferential surface) 40c of each light diffusion portion 40 and the light shielding layer 41. As illustrated in FIG. 1B, the light control film 7 is disposed on the second polarization plate 5 so that the side on which the light diffusion portions 40 are provided is directed toward the second polarization plate 5, and the base material 39 side is directed toward the viewing side. In other words, the other surface 39b side of the base material 39 is an emission side on which light (image light) from the liquid crystal display body 6 (display body) is emitted toward the observer.

As the light-transmissive base material 39, a light-transmissive material such as resins including thermoplastic polymer, a heat curable resin, and a photopolymerizable resin is generally used. A base material made of an appropriate transparent resin consisting of acryl-based polymer, olefin-based polymer, vinyl-based polymer, cellulose-based polymer, amide-based polymer, fluorine-based polymer, urethane-based polymer, silicone-based polymer, imide-based polymer, and the like may be used. For example, a base material made of a transparent resin such as a triacetyl cellulose (TAC) film, a polyethylene terephthalate (PET) film, a cyclo olefin polymer (COP) film, a polycarbonate (PC) film, a polyethylene naphthalate (PEN) film, a polyethersulfone (PES) film, or a polyimide (PI) film, is preferably used.

The base material 39 serves as a foundation when a subsequent material of the light shielding layer 41 or the light diffusion portions 40 is coated in a manufacturing process described later, and is thus required to have heat resistance and mechanical strength in a heat treatment step of the manufacturing process. Therefore, not only a base material made of resin but also a base material made of glass may be used as the base material 39. However, the base material 39 is preferably thin to an extent to which heat resistance or mechanical strength is not impaired. The reason is that there is a concern that display blurring may occur as the base material 39 is thickened. In addition, a total light transmittance of the base material 39 is preferably 90% or more in accordance with regulations of JIS K7361-1. If the total light transmittance is 90% or more, sufficient transparency can be obtained. In the present embodiment, as an example, a PET film which is 100 μm thick is used.

The light diffusion portions 40 are made of, for example, a light-transmissive and photosensitive organic material such as an acrylic resin, an epoxy resin, or a silicone resin. A transparent resin mixture in which the resin is mixed with a polymerization initiator, a coupling agent, a monomer, an organic solvent, or the like may be used. In addition, the polymerization initiator may contain various additive components such as a stabilizer, an inhibitor, a plasticizer, a fluorescent brightening agent, a release agent, a chain transfer agent, and other photopolymerizable monomers. In addition, materials disclosed in Japanese Patent No. 4129991 may be used. Further, a total light transmittance of the light diffusion portion 40 is preferably 90% or more in accordance with regulations of JIS K7361-1. If the total light transmittance is 90% or more, sufficient transparency can be obtained.

As illustrated in FIG. 1A, a horizontal cross-section in which the light diffusion portion 40 is cut along a plane (xy plane) parallel to one surface of the base material 39, has, for example, a circular shape. A diameter of the light diffusion portion 40 is, for example, about 20 μm. The plurality of light diffusion portions 40 may all have the same diameter, and light diffusion portions with different diameters may be mixed. In addition, a horizontal cross-section of the light diffusion portion 40 does not only have a circular shape, but may also have any shape such as an elliptical shape, a rectangular shape, or an irregular shape.

In this light diffusion portion 40, an area of a light emission end surface 40a which is in contact with one surface 39a of the base material 39 is smaller than an area of a light incidence end surface 40b which is in contact with the liquid crystal display body 6 (display body), and, an area of the horizontal cross-section gradually increases with increasing distance from the base material 39. In addition, the light diffusion portion 40 becomes thicker than the light shielding layer 41 toward the light incidence end surface 40b from the light emission end surface 40a. In other words, the light diffusion portion 40 has a truncated cone shape which is reversely tapered when viewed from the base material 39 side.

The light diffusion portion 40 is a portion which contributes to light transmission in the light control film 7. In other words, light which is incident to the light diffusion portion 40 is totally reflected at the tilted surface (outer circumferential surface) 40c having a tapered shape which spreads from the light emission end surface 40a of the light diffusion portion 40 toward the light incidence end surface 40b, that is, a tilt angle gradually increases, and is guided in a state of being substantially confined in the light diffusion portion 40 so as to be emitted.

As illustrated in FIGS. 1A and 1B, in a case where a plurality of light diffusion portions 40 are provided, the light diffusion portions may be disposed so as to be dotted on the base material 39. The plurality of light diffusion portions 40 are formed so as to be dotted on the base material 39, and thus the light shielding layer 41 is formed in a state of being connected in a series on the base material 39.

In addition, the plurality of light diffusion portions 40 are randomly (aperiodically) arranged when viewed from a direction normal to the main surface of the base material 39. Therefore, a pitch between the adjacent light diffusion portions 40 is not constant, but an average pitch which averages pitches between the adjacent light diffusion portions 40 is set to 25 μm.

As illustrated in FIGS. 1A, 1B, 3A and 3B, the light shielding layer 41 is formed so as to cover a remaining region excluding a partial region in which the light diffusion portions 40 are formed on one surface 39a of the base material 39. The light shielding layer 41 is made of, for example, a light-absorbing and photosensitive organic material such as a black resist. The light shielding layer 41 may use a light shielding material such as, a metal simple substance, for example, chromium (Cr), or a multilayer film of Cr/chromium oxide, a metal oxide, a metal film such as a multilayer film of a metal simple substance and a metal oxide, pigments or dyes used in a black ink, a black resin, or a black ink obtained by mixing multiple-color inks.

A thickness of the light shielding layer 41 is set to be smaller than a thickness (height) from the light incidence end surface 40b of the light diffusion portion 40 to the light emission end surface 40a. In a case of the present embodiment, a thickness of the light shielding layer 41 is, for example, about 150 nm, and a height from the light incidence end surface 40b of the light diffusion portion 40 to the light emission end surface 40a is, for example, about 25 μm.

The low refractive index portion 42 is formed by filling a material with a refractive index lower than a refractive index of the light diffusion portion 40 into a space partitioned by the tilted surface 40c of the light diffusion portion 40 and the light shielding layer 41, that is, gaps between the plurality of light diffusion portions 40. Such a low refractive index material may be selected depending on a material forming the light diffusion portion 40, and may include a gas, for example, air or an inert gas such as argon or nitrogen.

In addition, a refractive index of the base material 39 is preferably substantially the same as a refractive index of the light diffusion portion 40.

The reason is that, for example, if the refractive index of the base material 39 is greatly different from the refractive index of the light diffusion portion 40, unnecessary refraction or reflection of light occurs at an interface between the light diffusion portion 40 and the base material 39 when light which is incident from the light incidence end surface 40b is emitted from the light diffusion portion 40, and thus there is a concern that defects may occur, for example, a desired light diffusion angle may not be obtained or an amount of emitted light may be reduced.

As illustrated in FIG. 1B, since the base material 39 is disposed so as to be suitable for the viewing side, in the light control film 7, of two opposing surfaces of the light diffusion portion 40 with a truncated cone shape, a surface with a smaller area is the light emission end surface 40a, and a surface with a larger area is the light incidence end surface 40b. In addition, a tilt angle θ (an angle formed between the light incidence end surface 40b and the tilted surface 40c) of the tilted surface 40c of the light diffusion portion 40 is set in a range of 41 degrees to 89 degrees. As an example, a tilt angle θ of the tilted surface 40c is set to 80°. However, a tilt angle of the tilted surface 40c of the light diffusion portion 40 is not particularly limited as long as the angle allows incident light to be sufficiently diffused when the light is emitted from the light control film 7.

In a case of the present embodiment, since the air is interposed between the adjacent light diffusion portions 40, for example, if the light diffusion portion 40 is made of an acrylic resin, the tilted surface 40c of the light diffusion portion 40 is an interface between the acrylic resin and the air. Even if the vicinity of the light diffusion portion 40 is filled with other low refractive index materials, a refractive index difference of an interface between inside and outside of the light diffusion portion 40 becomes the maximum in a case where air is present in the outside than in a case where any low refractive index material is present. Therefore, from the Snell's law, in the configuration of the present embodiment, a critical angle becomes the smallest, and an incidence angle range in which light is totally reflected at the tilted surface 40c of the light diffusion portion 40 becomes the widest. As a result, a light loss is further minimized, and thus high luminance can be obtained.

However, light, which is incident to the light incidence end surface 40b of the light diffusion portion 40 at an angle which greatly deviates from 90 degrees, is incident to the tilted surface 40c of the light diffusion portion 40 at an angle equal to or less than a critical angle, and is thus transmitted through the tilted surface 40c of the light diffusion portion 40 without total reflection. However, the light shielding layer 41 is provided in the region other than the formation region of the light diffusion portion 40, and thus the light transmitted through the tilted surface 40c of the light diffusion portion 40 is absorbed by the light shielding layer 41. For this reason, there is no occurrence of display blurring or no reduction in contrast. However, if an amount of light transmitted through the tilted surface 40c of the light diffusion portion 40 increases, a light amount loss occurs, and thus an image with high luminance cannot be obtained. Therefore, in the liquid crystal display device 1 of the present embodiment, a backlight emitting light at an angle which allows the light not to be incident to the tilted surface 40c of the light diffusion portion 40 at a critical angle or less, that is, a so-called directive backlight is preferably used.

Figure 30A:
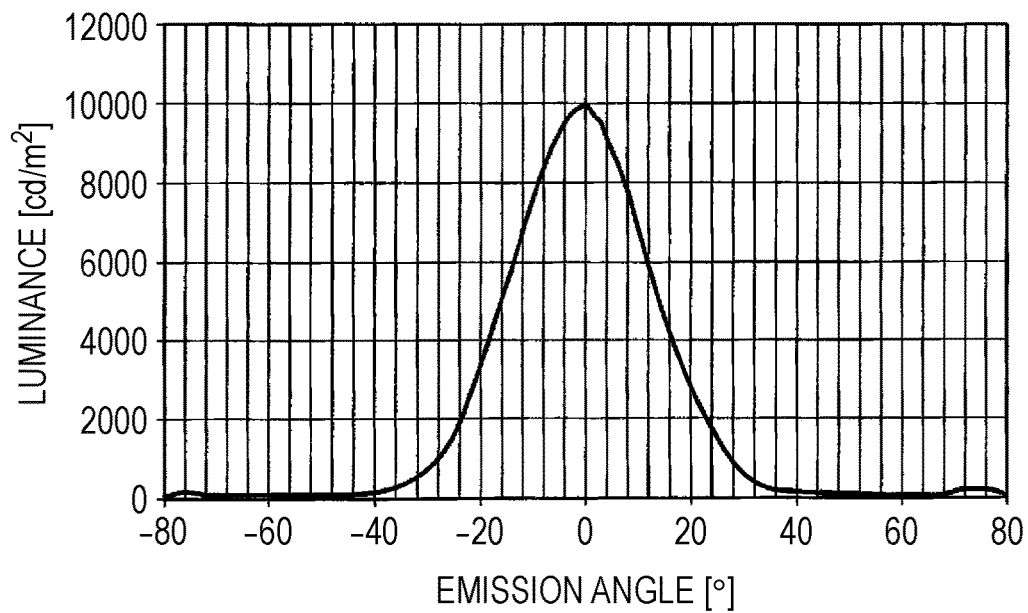
FIG. 30A is a diagram illustrating a luminance angle performance of a directive backlight.

FIG. 30A is a diagram illustrating a luminance-angle performance of a directive backlight. In FIG. 30A, the transverse axis expresses an emission angle (°), and the longitudinal axis expresses luminance (cd/m$^2$) in relation to light emitted from the directive backlight. In the directive backlight which is used this time, it can be seen that almost all light beams which are emitted are stable within an emission angle ±30°. By combining the directive backlight with the light control film, it is possible to reduce blurring and thus to realize a configuration in which light use efficiency is high.

Figure 30B:
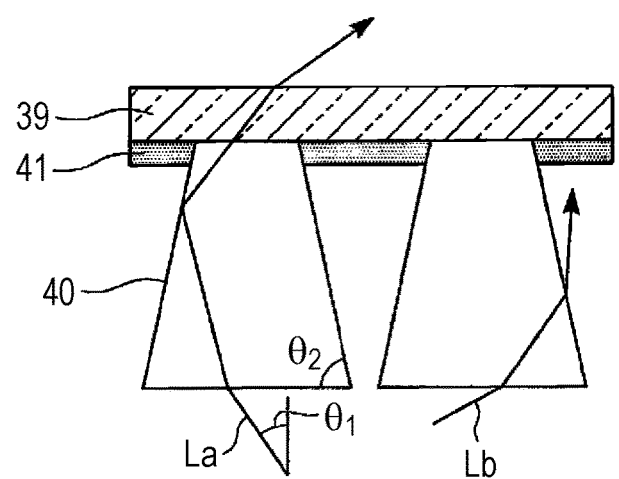
FIG. 30B is a schematic cross-sectional view of a light control film.

As illustrated in FIG. 30B, an emission angle from a backlight is set to $\theta_1$ and a taper angle of the light diffusion portion 40 is set to $\theta_2$. Light La which is incident to the light diffusion portion 40 is totally reflected at the tapered portion and is emitted from the front surface of the base material 39 toward the viewing side, but light Lb with a large incidence angle is not totally reflected at the tapered portion but is transmitted therethrough, and thus a loss of incident light may occur.

Figure 30C:
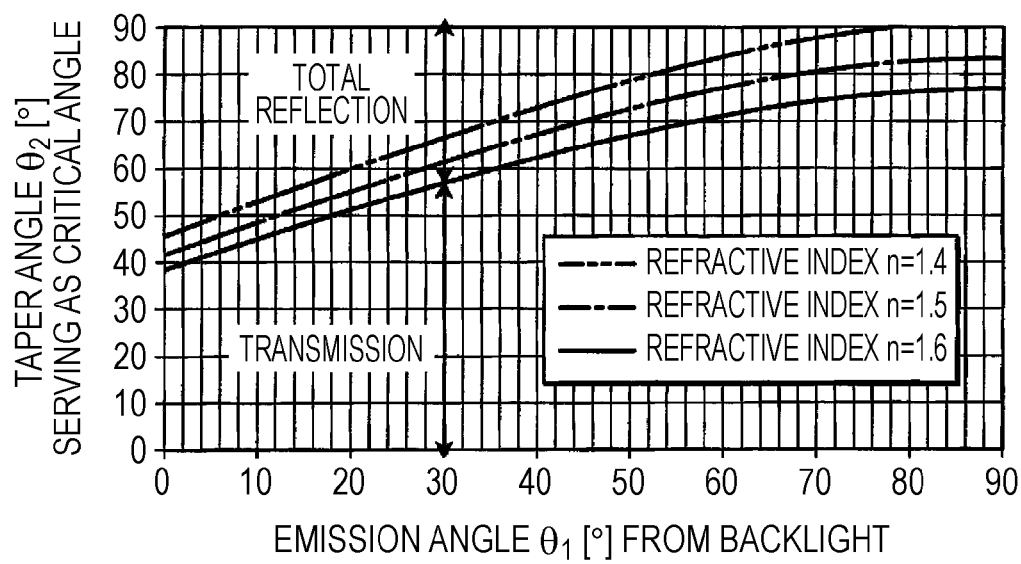
FIG. 30C is a diagram illustrating a relationship between an emission angle from the backlight and a taper angle serving as a critical angle.

FIG. 30C illustrates a relationship between an emission angle from the backlight and a taper angle serving as a critical angle.

For example, in a case where the light diffusion portion 40 with a transparent resin refractive index of n=1.6 has a taper angle less than 57°, light with an emission angle of 30° from the backlight is not totally reflected at the tapered shape but is transmitted therethrough, and thus a light loss occurs. In order to totally reflect light within an emission angle ±30° at the tapered shape without losses, a taper angle of the light diffusion portion 40 is preferably equal to or more than 57° and less than 90°.

As illustrated in FIGS. 3A and 3B, in the light control film 7, the light shielding layer 41 and the light diffusion portion 40 are formed so as to satisfy Expression (1) when an area of the part where the light shielding layer 41 is in contact with one surface 39a of the base material 39 is set to S1, and an area of the part where the low refractive index portion 42 is exposed between the light incidence end surfaces 40b is set to S2.

[Math. 2]

$$(S1-S2)/S1 \times 100 \geq 50 \quad \text{Expression (1)}$$

As illustrated in FIG. 3A, among light beams (image light) L which is incident to the light control film 7 from the backlight 2 via the liquid crystal panel, a light beam Lc which is incident to the center of the light diffusion portion 40 travels straight through the light diffusion portion 40 as it is so as to be transmitted therethrough, and is emitted from the other surface 39b (emission surface) of the base material 39 toward a viewer. On the other hand, a light beam Le, which is incident from a position near the end portion of the light diffusion portion 40, that is, a position overlapping the light shielding layer 41 in a plan view from the base material 39, is totally reflected due to a refractive index difference between the light diffusion portion 40 and the low refractive index portion 42, and is emitted toward the viewer side at a predetermined angle. However, a light beam Lx, which is incident to a position at which there is no light diffusion portion 40, that is, a position at which the low refractive index portion 42 is exposed between the light incidence end surfaces 40b of the light diffusion portions 40, is transmitted through the low refractive index portion 42, and is absorbed by the light shielding layer 41, so that a loss of light use efficiency occurs.

In addition, the light use efficiency (%) described here is defined as (total luminous flux emitted toward the viewer side/total luminous flux emitted from a display unit including the backlight)×100. In order to reduce a loss of the light use efficiency, the light diffusion portion 40 is necessary which has a specific thickness with respect to an area of the light shielding layer 41 and the tilted surface (outer circumferential surface) 40c of the light diffusion portion 40.

Further, there are cases where light is not emitted toward the viewer side although the light is totally reflected inside the tilted surface 40c of the light diffusion portion 40, and the light escapes from the light diffusion portion 40 and is absorbed by the light shielding layer 41 without being totally reflected. For this reason, it is necessary to define a relationship (aspect) between a thickness (height) of the light diffusion portion 40 and the light emission end surface 40a with respect to a tilt angle of the tilted surface 40c.

In a case where not only the tilted surface 40c of the light diffusion portion 40 is linear, but also, for example, a tilt angle is different depending on a location, or a tilt angle of the tilted surface 40c of at least one light diffusion portion 40 is different from tilt angles of the tilted surfaces 40c of other light diffusion portions 40, an angle determined from an average value or a peak value through optical measurement may be set as a tilt angle of the tilted surface 40c. As an example, when a refractive index of the light diffusion portion 40 is 1.5, a tilt angle range of the tilted surface 40c is equal to or more than 69° and less than 90° so that light is totally reflected on the oblique sides of the light diffusion portion and is emitted toward the viewer side.

In the light control film 7 of the present embodiment, in a case where the light Lc is incident to the inside of the light diffusion portion 40 at an angle of 0°, the light Lc travels straight through the light diffusion portion 40 and is emitted toward the viewer side. Since the light diffusion portion 40 has an increasing cross-section area from the light emission end surface 40a toward the light incidence end surface 40b, the light Le which is incident from a position near the end portion of the light diffusion portion 40, that is, a position overlapping the light shielding layer 41 in a plan view from the base material 39, is totally reflected at the tilted surface 40c, and is emitted from the light emission end surface 40a of the light diffusion portion 40 toward the viewer side in a diffusion manner.

Accordingly, if a loss of light which is incident to and absorbed by the light shielding layer 41 is reduced to 50% or less, it is possible to minimize a reduction in the light use efficiency without reducing a total luminous flux amount and contrast of the liquid crystal display device 1 (display device) provided with the light control film 7. In other words, it is necessary to set a height (that is, a thickness between the light emission end surface 40a and the light incidence end surface 40b) of the light diffusion portion 40 so that S2 which is an area (that is, an area of a part where the low refractive index portion 42 is exposed between the light incidence end surfaces 40b) in which light from the backlight 2 (light source) having passed through the liquid crystal panel 4 is directly incident to the light shielding layer 41 is equal to or less than 50% of a ratio of S1 which is an area (that is, an area of a part where the light shielding layer 41 is in contact with one surface 39a of the base material 39) of a single dot of the light shielding layer 41.

As an example of the liquid crystal display device 1 (display device) provided with the light control film 7 of the present embodiment, for example, when a proportion of the light shielding layer 41 taking up the base material 39 is 50%, a radius of a single dot of the light shielding layer 41 is 10 μm, and a tilt angle θ of the tilted surface 40c of the light diffusion portion 40 is 80°, a height of the light diffusion portion 40 is required to be set to 20 μm or more in order to reduce a loss of light absorbed by the light shielding layer 41 to 50% or less. If a height of the light diffusion portion 40 is 20 μm, a proportion of absorbed light beams relative to light beams incident to a position overlapping the light shielding layer 41 is 42% (light use efficiency of the light control film 7 is 79%), and it is possible to implement a display device which is bright, has high light use efficiency, and has a high viewing angle, by using the light control film 7 of the present embodiment. On the other hand, if a thickness of the light diffusion portion is 15 μm, a proportion thereof is 54% (light use efficiency of the light control film is 73%), light use efficiency is reduced, and thus the display device is darkened.

In the light control film 7 of the above-described embodiment, light (image light) is directly emitted toward the viewer from the other surface 39b of the base material 39, but there may be a configuration in which a diffusion film is additionally provide so as to overlap the other surface 39b of the base material 39, and thus light is more efficiently diffused.

Figure 4A:
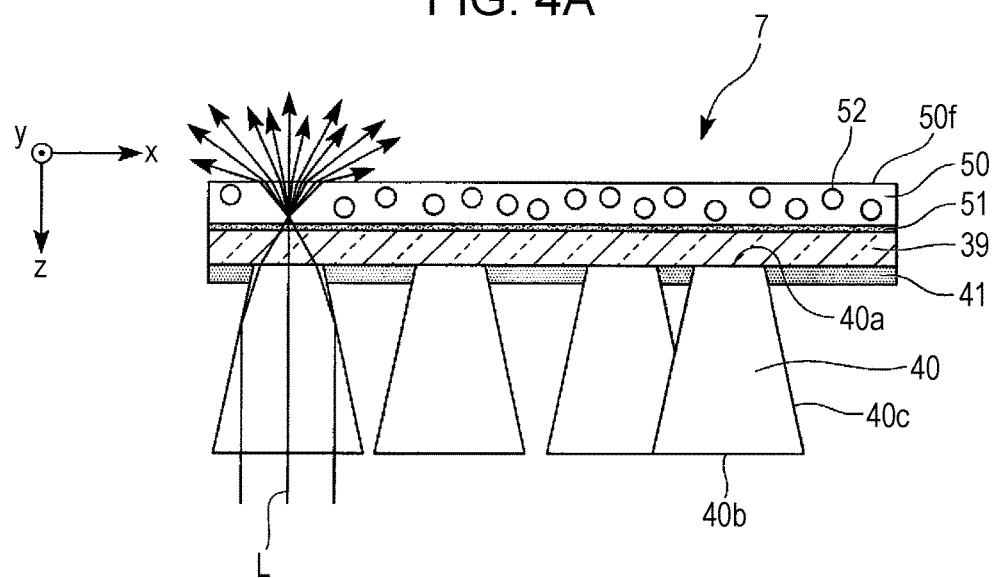
FIG. 4A is a diagram illustrating a behavior of light in a modification example of the light control film of the liquid crystal display device.
Figure 4B:
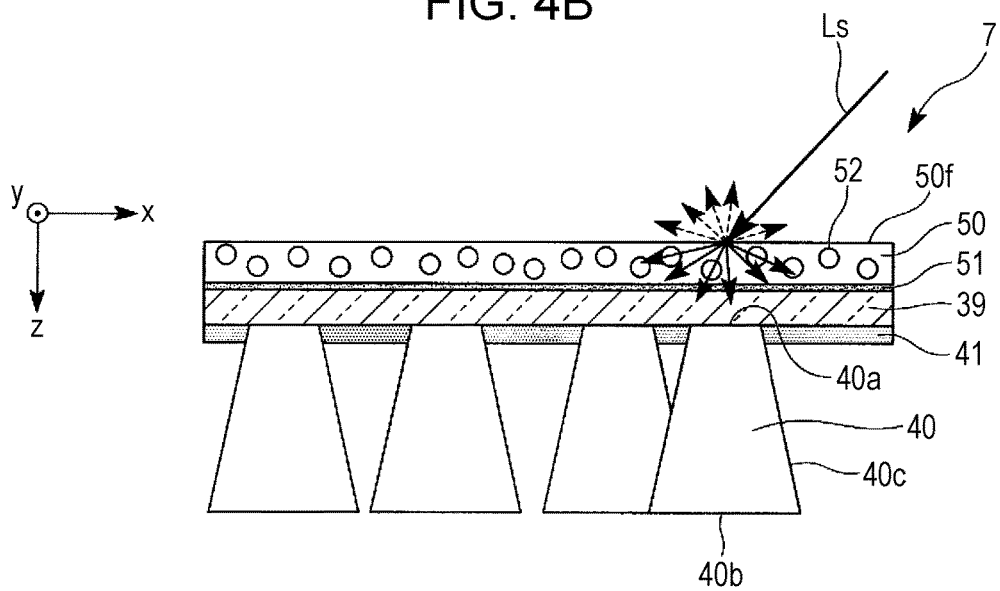
FIG. 4B is a diagram illustrating a behavior of light in the modification example of the light control film of the liquid crystal display device.

FIGS. 4A and 4B are cross-sectional views illustrating an operation of the light control film in a modification example of the first embodiment.

As illustrated in FIG. 4A, a diffusion film (light scattering layer) 50 is additionally formed so as to overlap the other surface 39b of the base material 39 in the light control film 7. The diffusion film 50 is fixed to the other surface (a surface on the viewing side) 39b of the base material 39 via an adhesive layer 51. The diffusion film 50 is formed by dispersing a plurality of light scattering bodies 52 such as acryl beads into a binder resin such as an acrylic resin. A thickness of the diffusion film 50 is, for example, about 20 μm, a diameter of the spherical light scattering body 52 is about 0.5 μm to 20 μm, and a thickness of the adhesive layer 51 is, for example, about 25 μm. In addition, the diffusion film 50 is an isotropic diffusion material. The diffusion film 50 isotropically diffuses light which is diffused by the light diffusion portion 40, so as to further increase a diffusion angle.

Further, the light scattering body 52 is not limited thereto, and may be made of an appropriate transparent substance such as, a resin piece consisting of acryl-based polymer, olefin-based polymer, vinyl-based polymer, cellulose-based polymer, amide-based polymer, fluorine-based polymer, urethane-based polymer, silicone-based polymer, imide-based polymer, and the like, or glass beads.

In addition, not only the transparent substance but also a scattering body or a reflective body which does not absorb light may be used. Alternatively, air bubbles in which the light scattering bodies 52 are dispersed in the light diffusion portion 40 may be used. A shape of each light scattering body 52 may be, for example, various shapes such as a spherical shape, an ellipsoidal shape, a plate shape, a polygonal shape, and a cubic shape. A size of the light scattering body 52 may be uniform or nonuniform.

In the present embodiment, the diffusion film (light scattering layer) 50 is also used as an anti-glare layer. The anti-glare layer is formed, for example, by performing a sandblast process or an embossing process on the base material 39, but, in the present embodiment, an anti-glare process is performed by forming a layer including a plurality of light scattering bodies 52 on the base material 39. According to this configuration, the diffusion film 50 functions as an anti-glare layer, and thus a new anti-glare layer is not required to be provided. Therefore, it is possible to implement a simple and thin device.

In addition, in the present embodiment, the diffusion film (light scattering layer) 50 is formed on the other surface 39b (a surface on the viewing side) of the base material 39, but is not limited thereto. For example, the diffusion film (light scattering layer) 50 may be provided between one surface 39a of the base material 39 and the light diffusion portion 40. In this case, there may be a configuration in which the diffusion film 50 itself has rigidness and also functions as a base material. Alternatively, the adhesive layer 51 itself may be light-transmissive. For example, the light transmission may be realized by dispersing a plurality of light scattering bodies into the adhesive layer 51.

The adhesive layer 51 may use an appropriate adhesive substance depending on an adhesive target, such as a rubber-based or acryl-based adhesive, a silicone-based or a vinyl alkyl ether-based adhesive, polyvinyl alcohol-based or polyvinyl pyrrolidone-based adhesive, or polyacrylamide-based or cellulose-based adhesive. Particularly, an adhesive substance with good transparency, weather resistance, or the like is preferably used. In addition, the adhesive layer 51 is temporarily attached with a separator so as to be protected until the adhesive layer is practically used.

In a case of the present embodiment, the light Lc which is vertically incident to the light incidence end surface 40b of the light diffusion portion 40 is diffused by the light diffusion portion 40, and is then further diffused by the diffusion film 50. For this reason, light beams are emitted at various angles from the diffusion film 50.

As mentioned above, in a case of the present embodiment, the diffusion film 50 is disposed on the outermost surface of the light control film 7, and thus concentration on a single light diffusion angle does not occur. As a result, a light diffusion performance of the light control film 7 can be made smoother, and thus bright display can be obtained at a wide viewing angle.

Further, in the present embodiment, in the light control film 7, the diffusion film 50 is configured so that light is incident from a surface 50f of the diffusion film 50 on an opposite side to the light diffusion portion 40, and is reflected at an interface between the base material such as a binder resin and the light scattering body 52 or is refracted by the light scattering body 52 so as to change its travel direction and to be scattered forward.

In addition, in FIG. 4B, external light beams Ls which are incident to the surface 50f of the diffusion film 50 and are scattered forward in the diffusion film 50 are indicated by solid arrows. For comparison, light beams which are scattered backward are indicated by dashed arrows, but this kind of light is not made to occur. Such a total reflection condition can be satisfied, for example, by appropriately changing a size of a particle of the light scattering body 52 included in the diffusion film 50.

Next, a method for manufacturing the light control film illustrated in FIGS. 1A and 1B will be described with reference to FIGS. 5A to 5E.

Hereinafter, manufacturing steps of the light control film 7 will be mainly described.

Figure 5A:
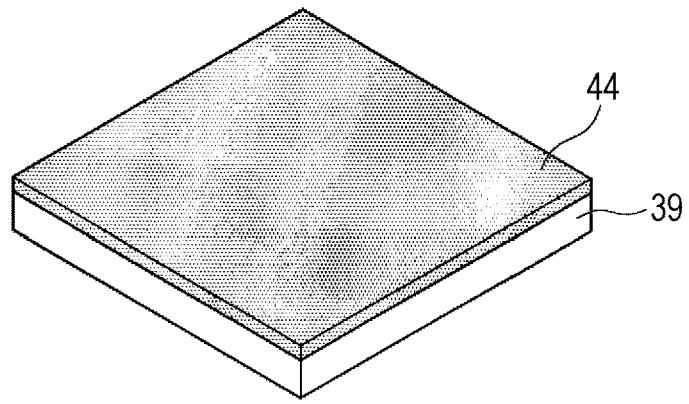
FIG. 5A is a perspective view illustrating the light control film of the liquid crystal display device of the first embodiment of the present invention in a manufacturing step order.

First, as illustrated in FIG. 5A, the base material 39 of polyethylene terephthalate, with 10 centimeter square and a thickness of 100 μm is prepared, and a black negative resist containing carbon as a material of the light shielding layer is coated on one surface of the base material 39 by using a spin coating method, so as to form a coating film 44 which is 150 nm thick.

Next, the base material 39 provided with the coating film 44 is placed on a hot plate, and the coating film is prebaked at a temperature of 90° C. Accordingly, a solvent in the black negative resist evaporates.

Figure 5B:
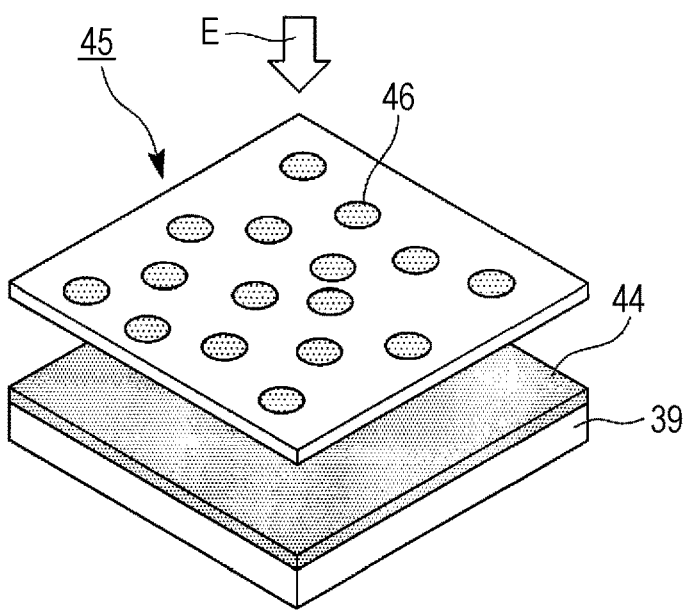
FIG. 5B is a perspective view illustrating the light control film of the liquid crystal display device of the first embodiment of the present invention in a manufacturing step order.

Next, as illustrated in FIG. 5B, the coating film 44 is irradiated with light E via a photomask 45 provided with a plurality of light shielding patterns 46 by using an exposure device, so as to perform exposure. At this time, the exposure device which uses mixed rays including i rays of a wavelength of 365 nm, h rays of a wavelength of 404 nm, and g rays of a wavelength of 436 nm is used. An exposure amount is 100 mJ/cm². In a case of the present embodiment, exposure of a transparent negative resist is performed by using the light shielding layer 41 as a mask in a subsequent step so as to form the light diffusion portion 40, and thus positions of the light shielding patterns 46 of the photomask 45 correspond to formation positions of the light diffusion portions 40. The plurality of light shielding patterns 46 are all circular patterns with a diameter of 20 μm, and are randomly disposed.

For this reason, gaps (pitches) between the adjacent light shielding patterns 46 are not constant, but an average gap which averages the gaps between the plurality of light shielding patterns 46 is 25 μm.

Figure 31:
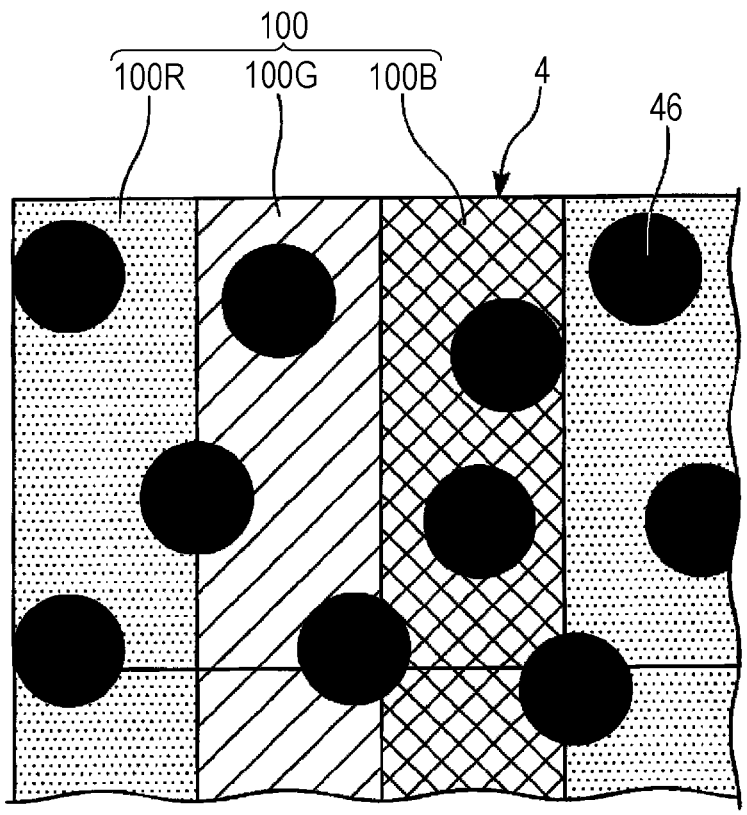
FIG. 31 is a diagram illustrating an arrangement relationship between a pixel of a liquid crystal panel and a light shielding pattern.

FIG. 31 is a diagram illustrating an arrangement relationship between pixels 100 of the liquid crystal panel 4 and the light shielding patterns 46. As illustrated in FIG. 31, when the pixels 100 of the liquid crystal panel 4 and the light shielding patterns 46 are viewed in a plane, at least one of some of the light shielding patterns 46 is preferably located at a part corresponding to a single dot of the liquid crystal panel 4. In this case, a single pixel 100 of the liquid crystal panel 4 includes three dots 100R, 100G and 100B of red (R), green (G), and blue (B). Accordingly, at least one light diffusion portion 40 is formed in a single pixel 100, and thus light can be emitted toward a viewer side in a state in which information of a single dot 100R, 100G, or 100B is reliably spread.

An average gap of the light shielding patterns 46 may be smaller than a gap (pitch) of the pixels of the liquid crystal panel 4. Accordingly, at least one light diffusion portion 40 is formed in the pixel, and thus it is possible to achieve a wide viewing angle, for example, when combined with a liquid crystal panel which is used in a mobile apparatus or the like and has a small pixel pitch.

Figure 5C:
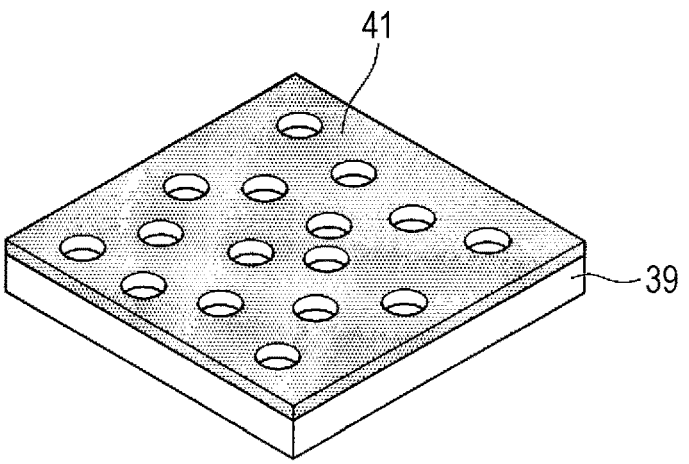
FIG. 5C is a perspective view illustrating the light control film of the liquid crystal display device of the first embodiment of the present invention in a manufacturing step order.

After exposure is performed by using the photomask 45, the coating film 44 formed from the black negative resist is developed by using a dedicated developer, and is dried at 100° C., so as to form the light shielding layer 41 with a plurality of circular openings on one surface of the base material 39 as illustrated in FIG. 5C. The circular openings correspond to formation regions of the light diffusion portions 40 in the subsequent step.

In addition, in the present embodiment, the light shielding layer 41 is formed according to a photolithography method using the black negative resist, but, alternatively, if a photomask in which the light shielding patterns 46 of the present embodiment and a light transmission portion are reversed to each other, a positive resist may be used. Alternatively, the light shielding layer 41 which is patterned by using a deposition method, a printing method, or an ink jet method may be directly formed.

Figure 5D:
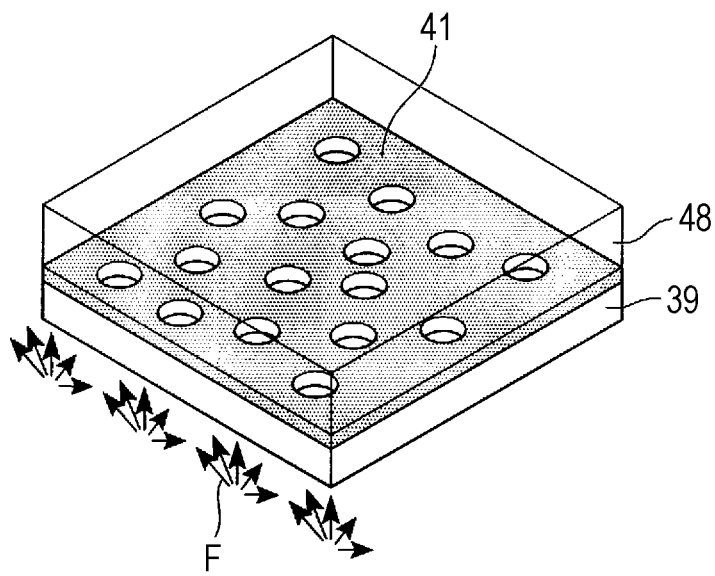
FIG. 5D is a perspective view illustrating the light control film of the liquid crystal display device of the first embodiment of the present invention in a manufacturing step order.

Next, as illustrated in FIG. 5D, a transparent negative resist made of an acrylic resin is coated as a material of the light diffusion portion on the upper surface of the light shielding layer 41 by using a spin coating method, so as to form a coating film 48 which is 25 μm thick. Next, the base material 39 provided with the coating film 48 is placed on a hot plate, and the coating film 48 is prebaked at a temperature of 95° C. Accordingly, a solvent in the transparent negative resist evaporates.

Next, the coating film 48 is irradiated with diffused light F from the base material 39 side by using the light shielding layer 41 as a mask, so as to perform exposure. At this time, the exposure device which uses mixed rays including i rays of a wavelength of 365 nm, h rays of a wavelength of 404 nm, and g rays of a wavelength of 436 nm is used. An exposure amount is 600 mJ/cm². In the exposure step, parallel light or diffused light is used. In addition, as means for irradiating the base material 39 with the diffused light F using parallel light which is emitted from the exposure device, a diffusion plate with a haze of about 50 may be disposed on a path of light emitted from the exposure device. The exposure is performed with the diffused light F, and thus the coating film 48 is radially exposed from the openings of the light shielding layer 41 so that a reverse tapered side surface of the light diffusion portion 40 is formed.

Then, the base material 39 provided with the coating film 48 is placed on the hot plate, and post exposure baking (PEB) is performed on the coating film 48 at a temperature of 95° C.

Figure 5E:
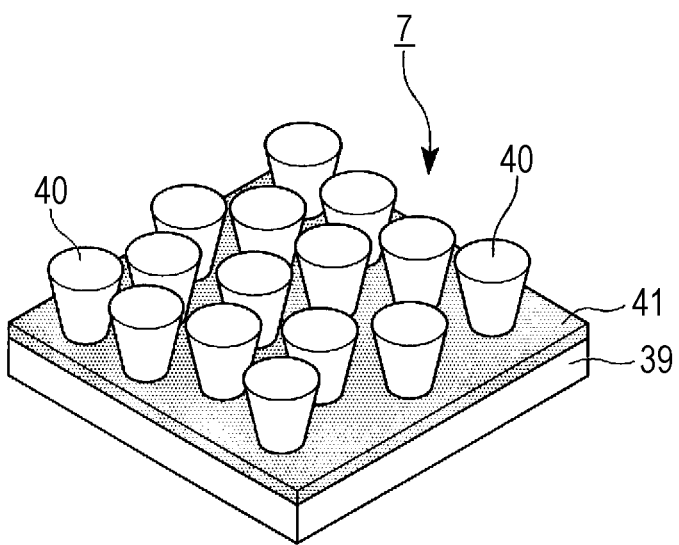
FIG. 5E is a perspective view illustrating the light control film of the liquid crystal display device of the first embodiment of the present invention in a manufacturing step order.

Subsequently, the coating film 48 formed from the transparent negative resist is developed by using a dedicated developer, and is post-baked at 100° C., so that a plurality of light diffusion portions 40 are formed on one surface of the base material 39 as illustrated in FIG. 5E.

Through the above-described steps, the light control film 7 of the present embodiment is completed. In addition, in the above-described example, a liquid resist is coated when the light shielding layer 41 or the light diffusion portion 40 is formed, but, alternatively, a film-like resist may be attached to one surface of the base material 39.

In a case where a display device is subsequently manufactured, the light control film 7 which is completed through the above-described steps is attached to the liquid crystal display body 6 by using an optical adhesive or the like in a state in which the base material 39 is directed toward the viewing side and the light diffusion portion 40 opposes the second polarization plate 5 as illustrated in FIG. 2.

The liquid crystal display device 1 of the present embodiment is completed due to the above-described steps.

According to the light control film of the present embodiment and the display device including the same, as illustrated in FIG. 3A, the light beam Le, which is incident from a position near the end portion of the light diffusion portion 40, that is, a position overlapping the light shielding layer 41 in a plan view from the base material 39, is totally reflected at the tilted surface 40c, and is emitted from the light emission end surface 40a of the light diffusion portion 40 toward the viewer side in a state in which an angle distribution further spreads than before being incident. Therefore, even if an observer tilts a line of sight from a front direction (normal direction) of the liquid crystal display body (display device) 6, the observer can visually recognize favorable display. Particularly, in a case of the present embodiment, since a planar shape of the light diffusion portion 40 is a circular shape, an angle distribution spreads in all orientations centering on a direction normal to a screen of the liquid crystal display body 6. For this reason, the observer can visually recognize favorable display in all orientations.

In addition, in the light control film 7, the light shielding layer 41 and the light diffusion portion 40 are formed so as to satisfy Expression (1) when an area of the part where the light shielding layer 41 is in contact with one surface 39a of the base material 39 is set to S1, and an area of the part where the low refractive index portion 42 is exposed between the light incidence end surfaces 40b is set to S2. Therefore, a loss of light which is incident to and absorbed by the light shielding layer 41 can be reduced to 50% or less, and thus it is possible to minimize a reduction in the light use efficiency without reducing a total luminous flux amount and contrast of the liquid crystal display device 1 (display device) provided with the light control film 7.

[Math. 3]

$$(S1-S2)/S1 \times 100 \geq 50 \qquad \text{Expression (1)}$$

In addition, at least some of the plurality of light diffusion portions 40 may be connected to each other. Accordingly, each light diffusion portion 40 hardly falls down, and thus form stability of the light control film 7 is improved. Further, a ratio in which light incident to the light control film 7 is absorbed by the light shielding layer 41 is reduced, and thus light use efficiency can be further improved.

First Modification Example of First Embodiment

Figure 6A:
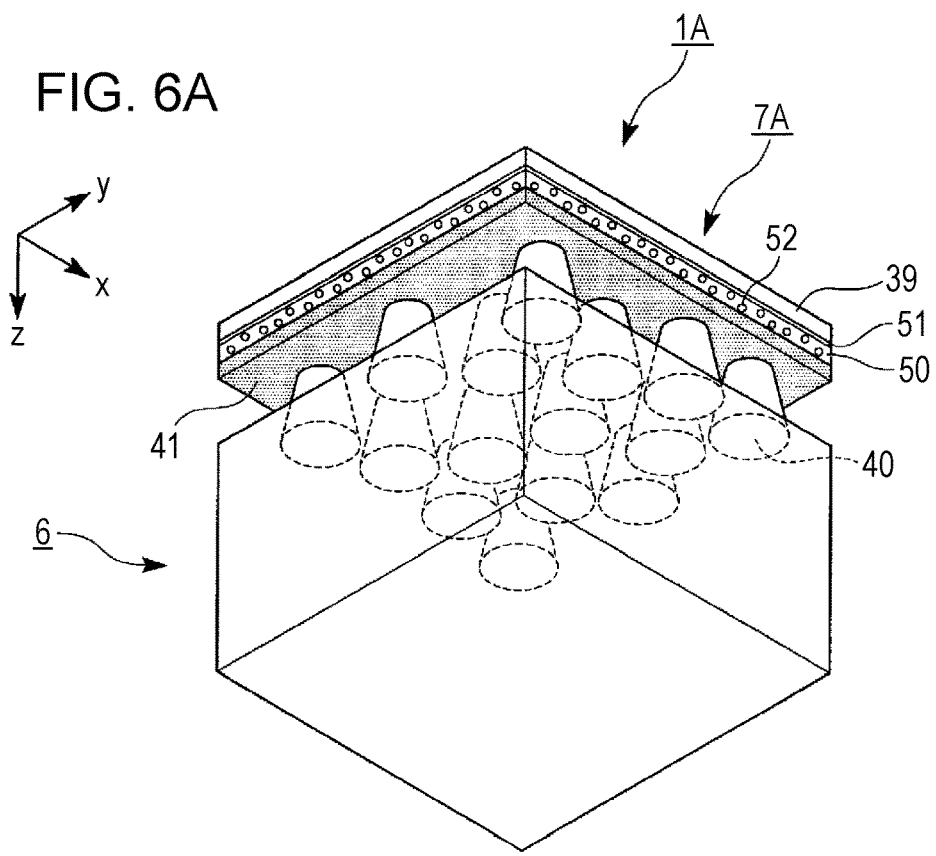
FIG. 6A is a schematic perspective view illustrating a first modification example of the liquid crystal display device of the first embodiment of the present invention.
Figure 6B:
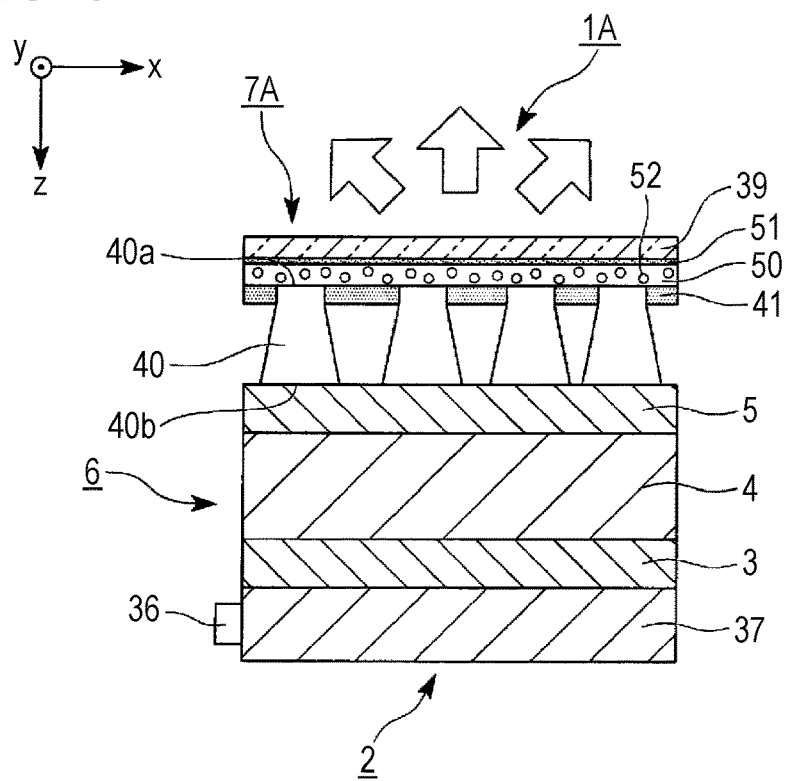
FIG. 6B is a schematic cross-sectional view illustrating the first modification example of the liquid crystal display device of the first embodiment of the present invention.

FIGS. 6A and 6B are schematic diagrams illustrating a first modification example of the liquid crystal display device of the embodiment. FIG. 6A is a perspective view of a liquid crystal display device 1A of the present modification example, and FIG. 6B is a cross-sectional view of the liquid crystal display device 1A of the present modification example.

In the above-described embodiment, the diffusion film 50 is disposed on the other surface (a surface on the viewing side) of the base material 39, but, as in a light control film 7A illustrated in FIGS. 6A and 6B, the diffusion film 50 may be disposed on one surface (a surface on an opposite side to the viewing side) of the base material 39. In other words, the diffusion film 50 may be further disposed toward the light emission side than the light diffusion portion 40. In the present modification example, the diffusion film 50 is fixed to one surface of the base material 39 via the adhesive layer 51, and the light diffusion portion 40 and the light shielding layer 41 are formed on one surface (a surface on an opposite side to the viewing side) of the diffusion film 50.

Also in this configuration, the same effect as the effect in the first embodiment, in which moire does not occur, and display quality can be maintained.

Second Embodiment

Hereinafter, a second embodiment of the present invention will be described with reference to FIGS. 7A to 8F.

A fundamental configuration of a liquid crystal display device of the present invention is the same as the configuration of the first embodiment, and is different from that of the first embodiment only in that a light scattering body is included in a base material. Therefore, in the present embodiment, description of the fundamental configuration of the liquid crystal display device will be omitted, and only a light control film will be described.

Figure 7A:
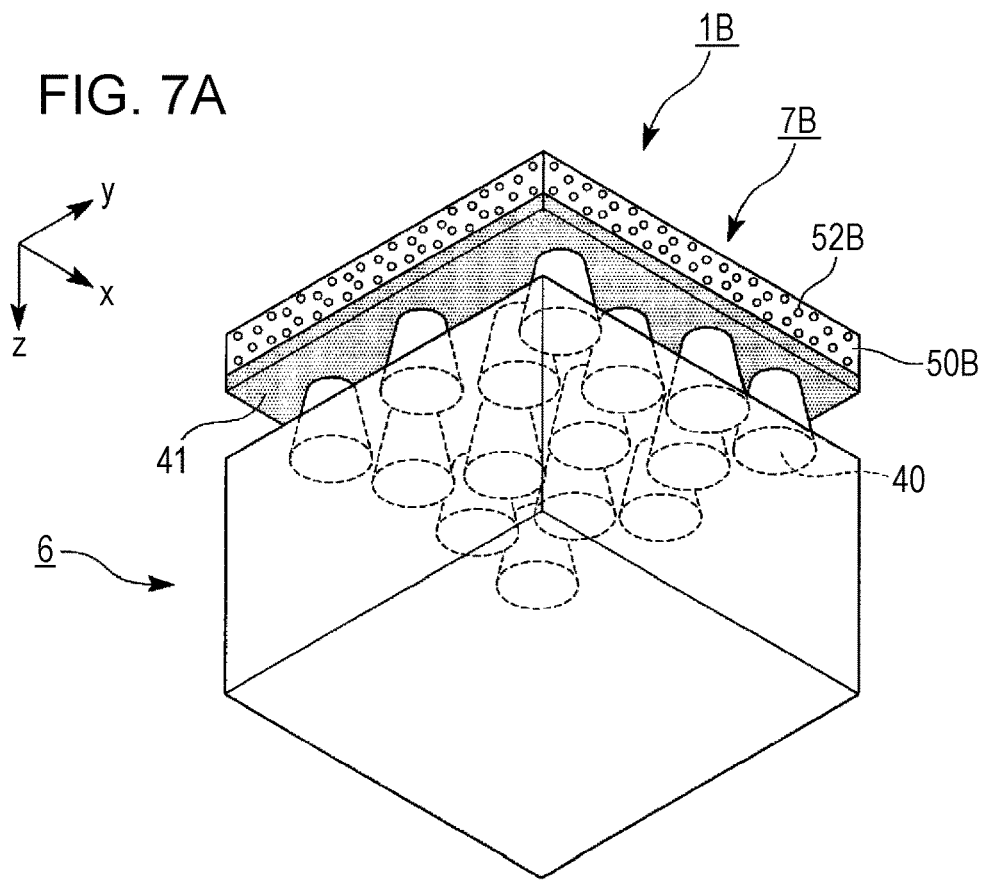
FIG. 7A is a schematic perspective view illustrating a liquid crystal display device of a second embodiment of the present invention.
Figure 7B:
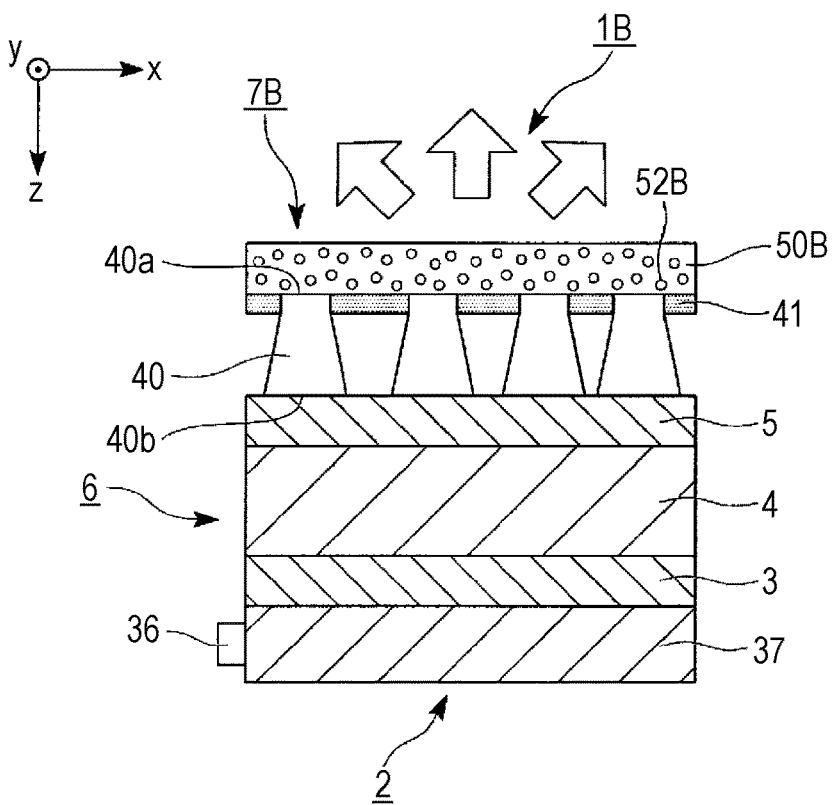
FIG. 7B is a schematic cross-sectional view illustrating the liquid crystal display device of the second embodiment of the present invention.

FIGS. 7A and 7B are schematic diagrams illustrating a liquid crystal display device of the present embodiment. FIG. 7A is a perspective view of a liquid crystal display device 1B of the present embodiment, and FIG. 7B is a cross-sectional view of the liquid crystal display device 1B of the present embodiment.

FIGS. 8A to 8F are cross-sectional views illustrating a light control film in a manufacturing step order.

In FIGS. 7A to 8F, constituent elements common to the drawings used in the first embodiment are given the same reference numerals, and detailed description thereof will be omitted.

In the first embodiment, the diffusion film 50 is disposed on the other surface (a surface on the viewing side) of the base material 39. In contrast, in a light control film 7B of the present embodiment, as illustrated in FIGS. 7A and 7B, a diffusion film is not disposed on a base material, and the base material itself functions as a diffusion film. In other words, a plurality of light scattering bodies 52B are dispersed in a base material 50B.

Figure 8A:
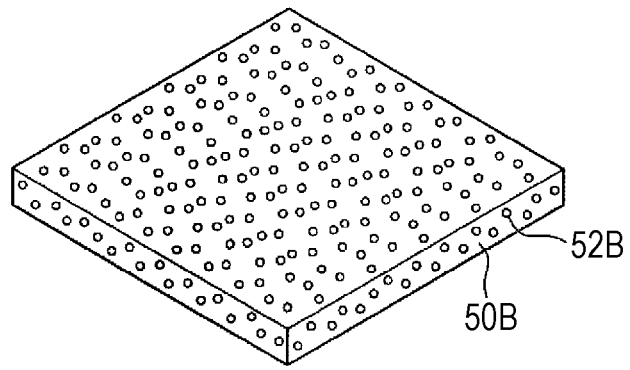
FIG. 8A is a perspective view illustrating a light control film of the liquid crystal display device of the second embodiment of the present invention in a manufacturing step order.

In a manufacturing step of the light control film 7B of the present embodiment, first, as illustrated in FIG. 8A, the base material 50B into which a plurality of light scattering bodies 52B are dispersed is prepared.

Figure 8B:
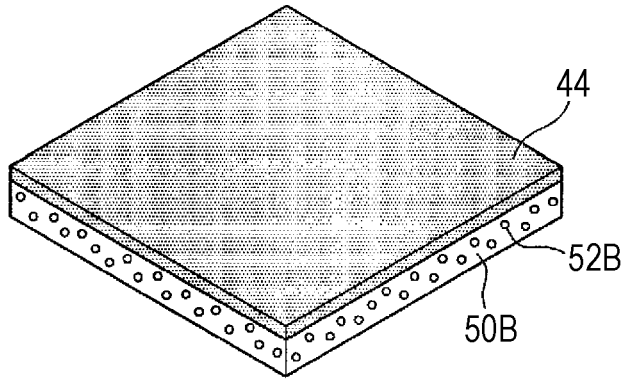
FIG. 8B is a perspective view illustrating the light control film of the liquid crystal display device of the second embodiment of the present invention in a manufacturing step order.

Next, as illustrated in FIG. 8B, a black negative resist containing carbon as a material of the light shielding layer is coated on one surface of the base material 50B by using a spin coating method, so as to form a coating film 44. Subsequently, the base material 39 provided with the coating film 44 is placed on a hot plate, and the coating film is prebaked.

Figure 8C:
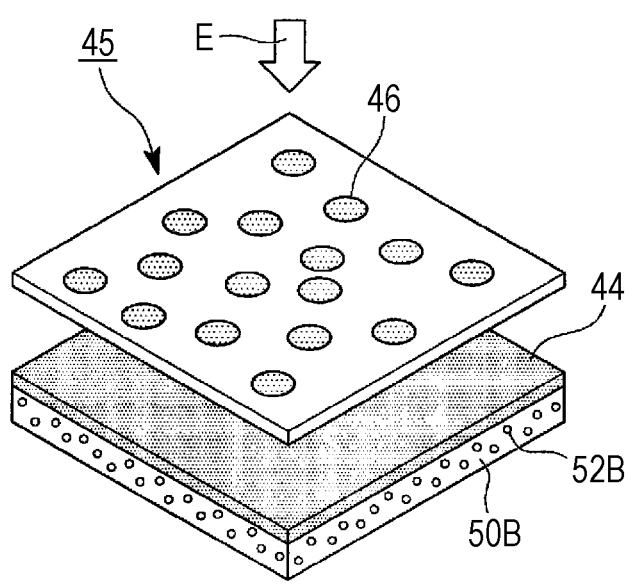
FIG. 8C is a perspective view illustrating the light control film of the liquid crystal display device of the second embodiment of the present invention in a manufacturing step order.

Next, as illustrated in FIG. 8C, the coating film 44 is irradiated with light E via a photomask 45 provided with a plurality of light shielding patterns 46 by using an exposure device, so as to perform exposure.

Figure 8D:
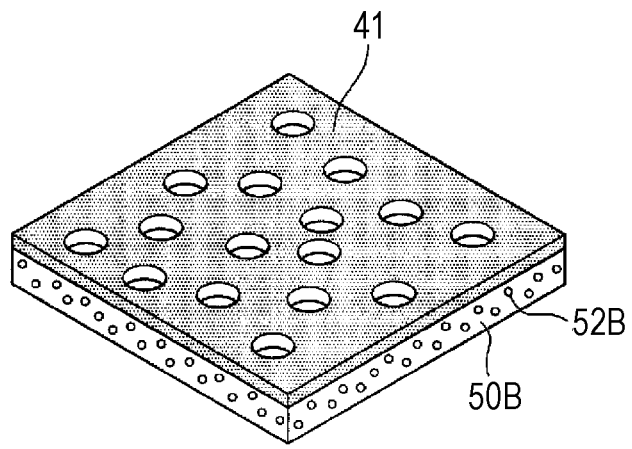
FIG. 8D is a perspective view illustrating the light control film of the liquid crystal display device of the second embodiment of the present invention in a manufacturing step order.

After exposure is performed by using the photomask 45, the coating film 44 formed from the black negative resist is developed by using a dedicated developer, and is dried so as to form the light shielding layer 41 with a plurality of circular openings on one surface of the base material 50B as illustrated in FIG. 8D. The circular openings correspond to formation regions of the light diffusion portions 40 in the subsequent step.

Figure 8E:
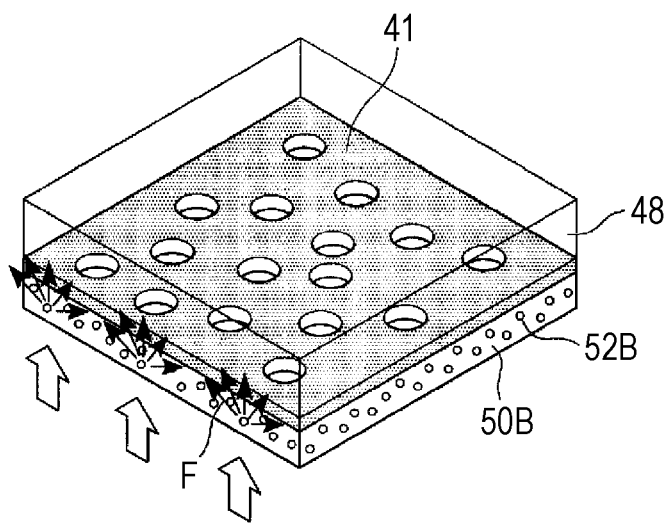
FIG. 8E is a perspective view illustrating the light control film of the liquid crystal display device of the second embodiment of the present invention in a manufacturing step order.

Next, as illustrated in FIG. 8E, a transparent negative resist made of an acrylic resin is coated as a material of the light diffusion portion on the upper surface of the light shielding layer 41 by using a spin coating method, so as to form a coating film 48.

Next, the base material 50B provided with the coating film 48 is placed on a hot plate, and the coating film 48 is prebaked.

Next, the coating film 48 is irradiated with diffused light F from the base material 50B side by using the light shielding layer 41 as a mask, so as to perform exposure. At this time, the exposure device which uses mixed rays including i rays of a wavelength of 365 nm, h rays of a wavelength of 404 nm, and g rays of a wavelength of 436 nm is used. An exposure amount is 600 mJ/cm$^2$. In the exposure step, parallel light or diffused light is used. In addition, in the present embodiment, the light scattering bodies 52B are dispersed in the base material 50B, and thus light emitted from the exposure device arrives at the coating film 48 as diffused light after passing through the base material 50B.

For this reason, the base material 50B is set to a predetermined haze value, and thus it is not necessary to dispose a diffusion plate on a path of light emitted from the exposure device as means for irradiating the base material 50B with the diffused light F. The exposure is performed with the diffused light F, and thus the coating film 48 is radially exposed from the openings of the light shielding layer 41 so that a reverse tapered side surface of the light diffusion portion 40 is formed.

Then, the base material 50B provided with the coating film 48 is placed on the hot plate, and post exposure baking (PEB) is performed on the coating film 48.

Figure 8F:
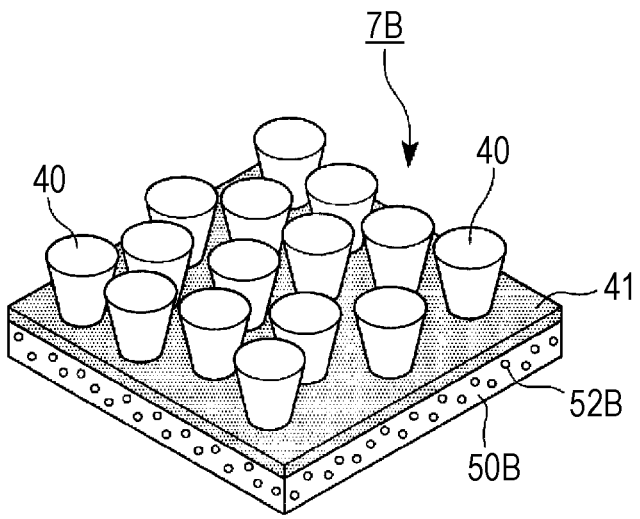
FIG. 8F is a perspective view illustrating the light control film of the liquid crystal display device of the second embodiment of the present invention in a manufacturing step order.

Subsequently, the coating film 48 formed from the transparent negative resist is developed by using a dedicated developer and is post-baked, so that a plurality of light diffusion portions 40 are formed on one surface of the base material 50B as illustrated in FIG. 8F.

Through the above-described steps, the light control film 7B of the present embodiment is completed.

Finally, the completed light control film 7B is attached to the liquid crystal display body 6 by using an optical adhesive or the like in a state in which the base material 50B is directed toward the viewing side and the light diffusion portion 40 opposes the second polarization plate 5 as illustrated in FIG. 7B.

The liquid crystal display device 1B of the present embodiment is completed due to the above-described steps.

According to the liquid crystal display device 1B of the present invention, the base material 50B itself functions as a diffusion film, and thus it is not necessary to provide a new adhesive layer or diffusion film. Therefore, it is possible to implement a simple and thin device. In addition, the base material 50B also functions as a diffusion plate in the management steps of the light control film 7B, and thus it is not necessary to dispose a diffusion plate on a path of light emitted from the exposure device when the light diffusion portion 40 is formed. Therefore, it is possible to simplify manufacturing steps.

Third Embodiment

Hereinafter, a third embodiment of the present invention will be described with reference to FIGS. 9A to 11B.

A fundamental configuration of a liquid crystal display device of the present invention is the same as the configuration of the first embodiment, and only a configuration of a light diffusion portion of a light control film is different from that of the first embodiment. Therefore, in the present embodiment, description of the fundamental configuration of the liquid crystal display device will be omitted, and only a light control film will be described.

Figure 9A:
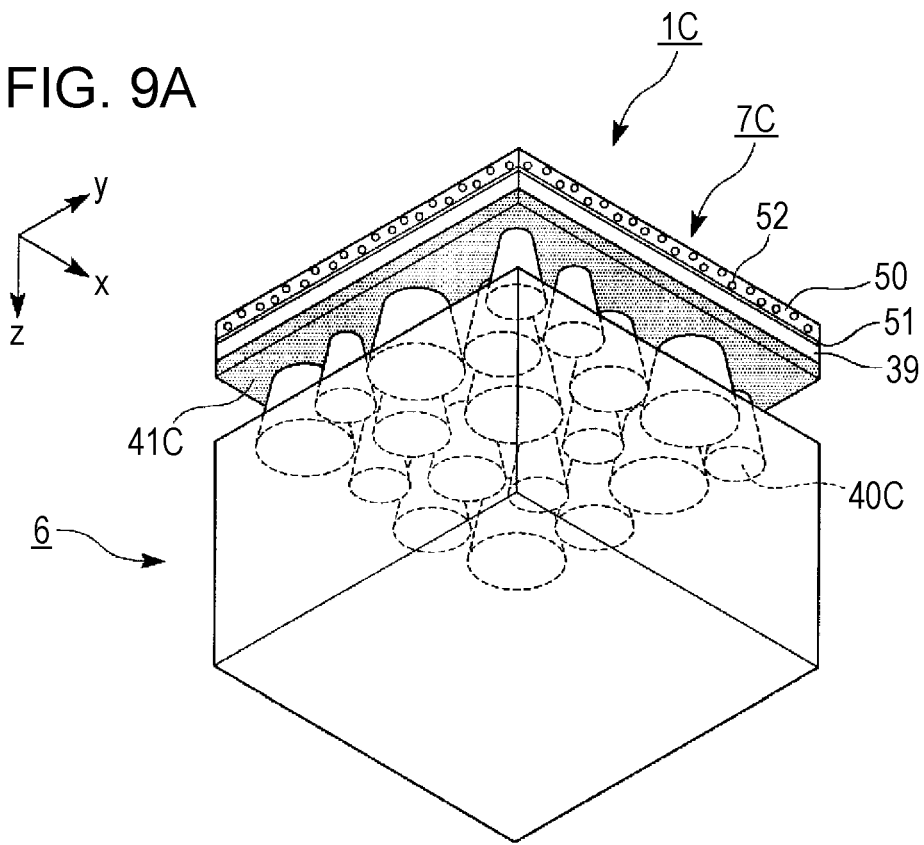
FIG. 9A is a schematic perspective view illustrating a liquid crystal display device of a third embodiment of the present invention.
Figure 9B:
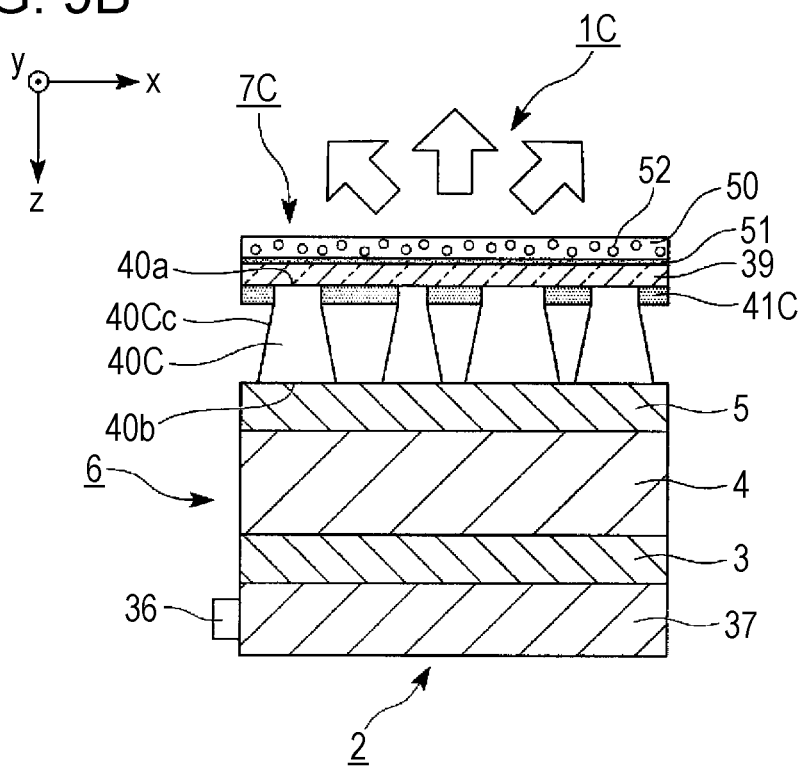
FIG. 9B is a schematic cross-sectional view illustrating the liquid crystal display device of the third embodiment of the present invention.

FIGS. 9A and 9B are schematic diagrams illustrating a liquid crystal display device of the present embodiment. FIG. 9A is a perspective view of a liquid crystal display device 10 of the present embodiment, and FIG. 9B is a cross-sectional view of the liquid crystal display device 10 of the present embodiment.

FIGS. 10A, 10B, 11A and 11B are diagrams illustrating an operation of a light control film.

In addition, in FIGS. 9A, 9B, 10A, 10B, 11A and 11B, constituent elements common to the drawings used in the first embodiment are given the same reference numerals, and detailed description thereof will be omitted.

In the first embodiment, the plurality of light diffusion portions 40 have the same dimensions. In contrast, in a light control film 7C of the present embodiment, as illustrated in FIG. 9A, dimensions (diameters) of a plurality of light diffusion portions 40C are different from each other. For example, diameters of the plurality of light diffusion portions 40C are distributed in a range of 15 µm to 25 µm. In other words, the plurality of light diffusion portions 40C have a plurality of kinds of dimensions.

In addition, in the same manner as in the first embodiment, the plurality of light diffusion portions 40C are randomly disposed in a plane. Other configurations are the same as those of the first embodiment.

Figure 10A:
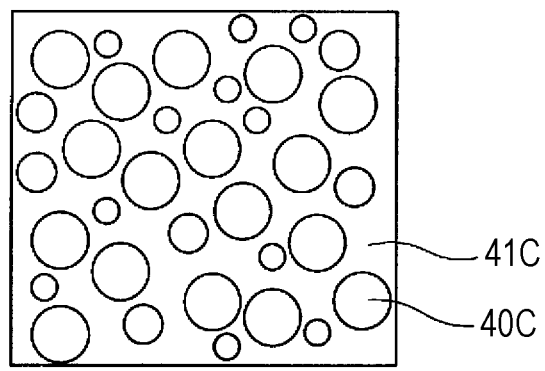
FIG. 10A is a schematic diagram illustrating an operation of a light control film of the third embodiment of the present invention.
Figure 10B:
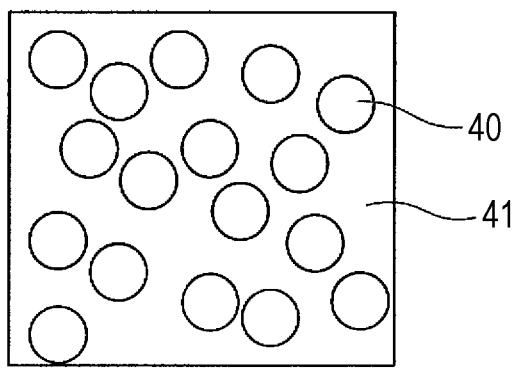
FIG. 10B is a schematic diagram illustrating an operation of the light control film of the third embodiment of the present invention.
Figure 11A:
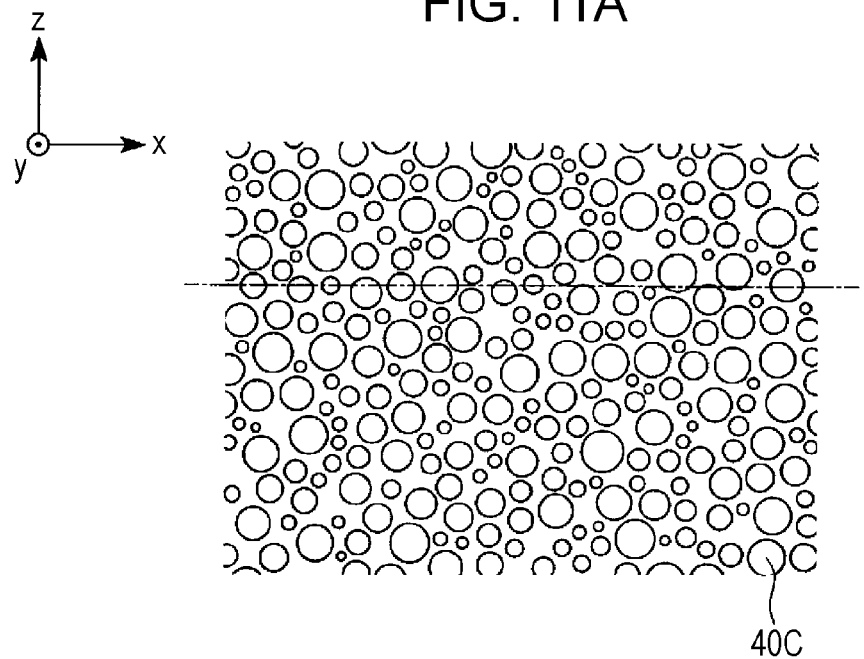
FIG. 11A is a schematic diagram illustrating an operation of the light control film of the third embodiment of the present invention.

In a case of the present embodiment, as illustrated in FIGS. 10A and 11A, a cross-sectional shape of the light diffusion portion 40C on the xy plane is a circular shape which is the same as that of the light diffusion portion 40 (refer to FIGS. 10B and 11B) of the first embodiment. Therefore, an operation in which the light control film 7C spreads an angle distribution of light in the xz plane is the same as in the first embodiment. However, whereas the plurality of light diffusion portions 40 all have the same dimensions in the first embodiment, as illustrated in FIGS. 10A and 11A, dimensions of the plurality of light diffusion portions 40C are different from each other in the present embodiment. As illustrated in FIG. 10B, if the light diffusion portion 40 has a constant shape, a light shielding part (light shielding layer) remains wide even if a pitch of the light diffusion portions is narrowed in order to increase a ratio of the light transmission parts (light diffusion portions). As a result, a ratio of light which is shield by the light shielding layer increases.

Figure 11B:
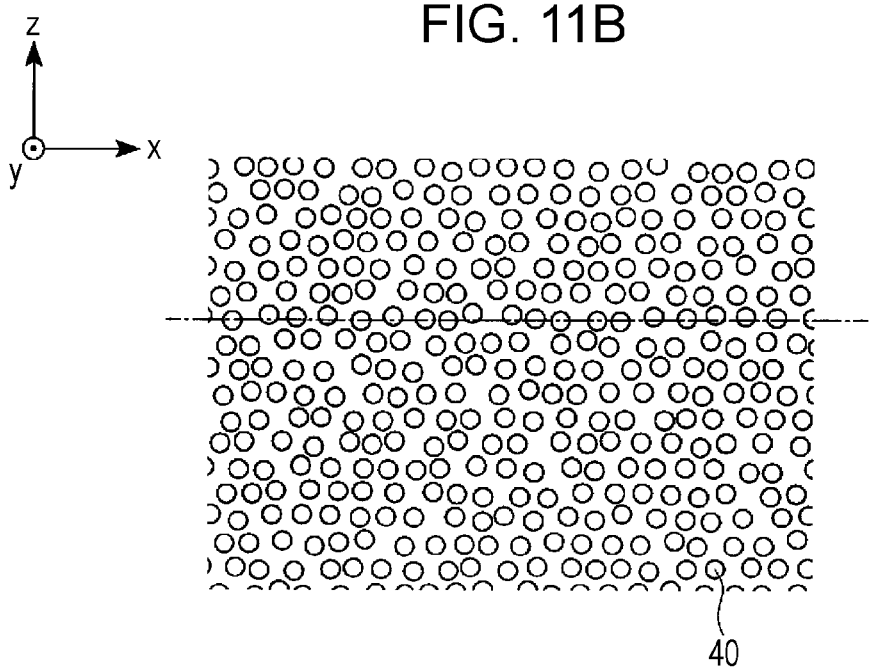
FIG. 11B is a schematic diagram illustrating an operation of the light control film of the third embodiment of the present invention.

In addition, as illustrated in FIG. 11B, if the light diffusion portions 40 with a constant shape are randomly disposed, there is the occurrence of a part where a plurality of light diffusion portions 40 are arranged in a line. In contrast, as illustrated in FIG. 11A, if the light diffusion portions 40C with different sizes and shapes are randomly disposed, a ratio in which the plurality of light diffusion portions 40C are arranged in a line is reduced.

In other words, a plurality of light diffusion portions have a plurality of kinds of dimensions, or the dimensions are changed at random, and thus an arrangement density of the light diffusion portions can be increased, for example, by burying circular light diffusion portions with a smaller diameter between circular light diffusion portions with a larger diameter. As a result, a ratio of light shielded by the light shielding layer can be reduced, and thus it is possible to increase light use efficiency.

According to the liquid crystal display device 10 of the present embodiment, since the plurality of light diffusion portions 40C are not only randomly disposed but sizes of the light diffusion portions 40C are also different from each other, it is possible to more reliably minimize moire fringes due to a diffraction phenomenon of light.

Fourth Embodiment

Hereinafter, a fourth embodiment of the present invention will be described with reference to FIGS. 12 to 14B.

A fundamental configuration of a liquid crystal display device of the present invention is the same as the configuration of the first embodiment, and only a shape of a light diffusion portion of a light control film is different from that of the first embodiment. Therefore, in the present embodiment, description of the fundamental configuration of the liquid crystal display device will be omitted, and only a light control film will be described.

Figure 12:
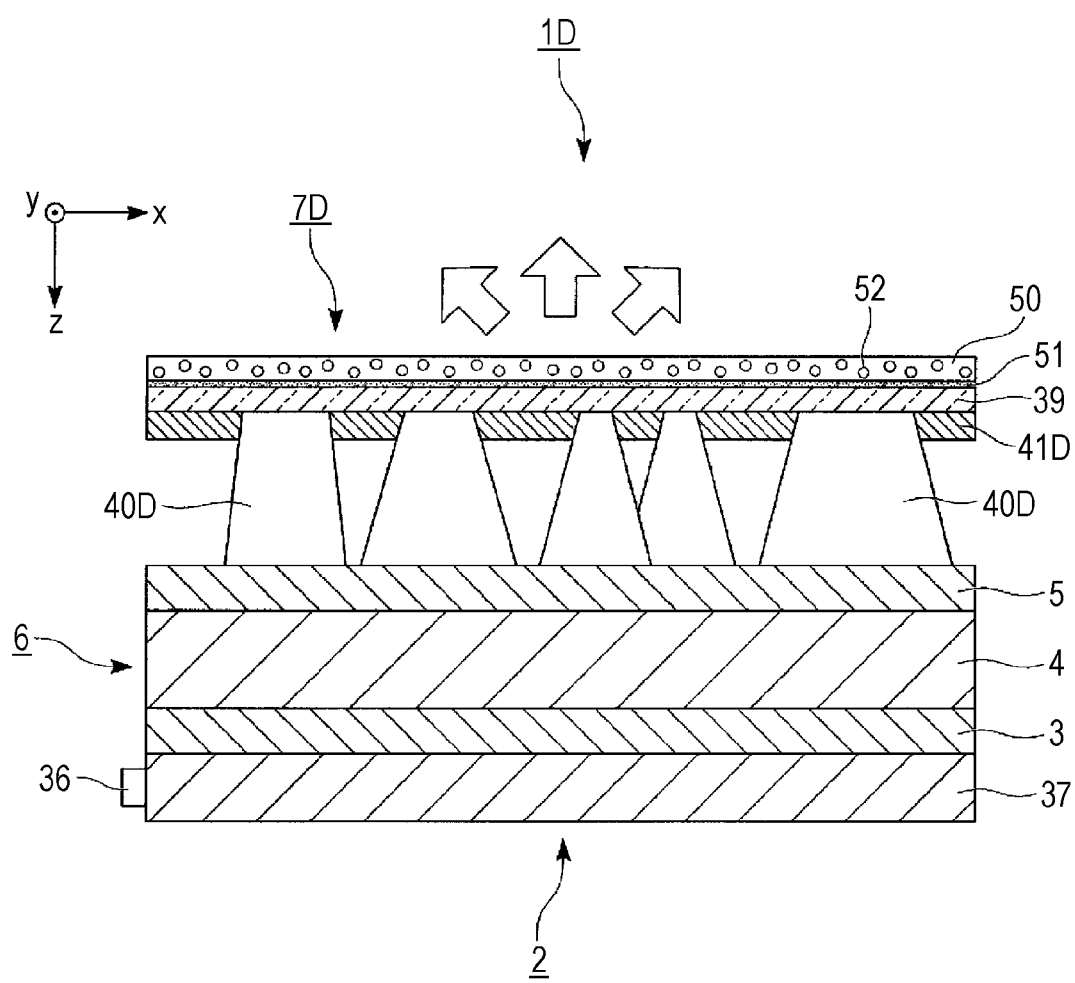
FIG. 12 is a cross-sectional view illustrating a liquid crystal display device of a fourth embodiment of the present invention.

FIG. 12 is a cross-sectional view illustrating a liquid crystal display device of the present embodiment.

Figure 13A:
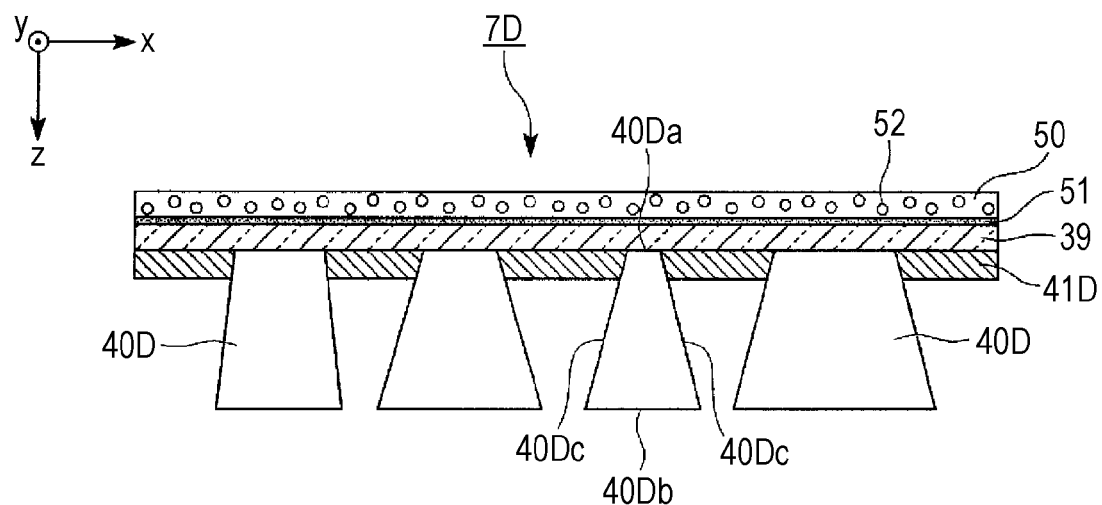
FIG. 13A is a schematic cross-sectional view illustrating a light control film of the liquid crystal display device of the fourth embodiment of the present invention.
Figure 13B:
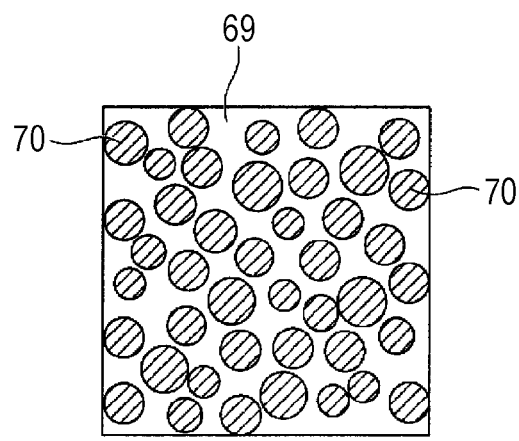
FIG. 13B is a schematic plan view illustrating the light control film of the liquid crystal display device of the fourth embodiment of the present invention.

FIG. 13A is a cross-sectional view of a light control film 7D of the present embodiment, and FIG. 13B is a plan view illustrating a photomask used for manufacturing the light control film.

Figure 14A:
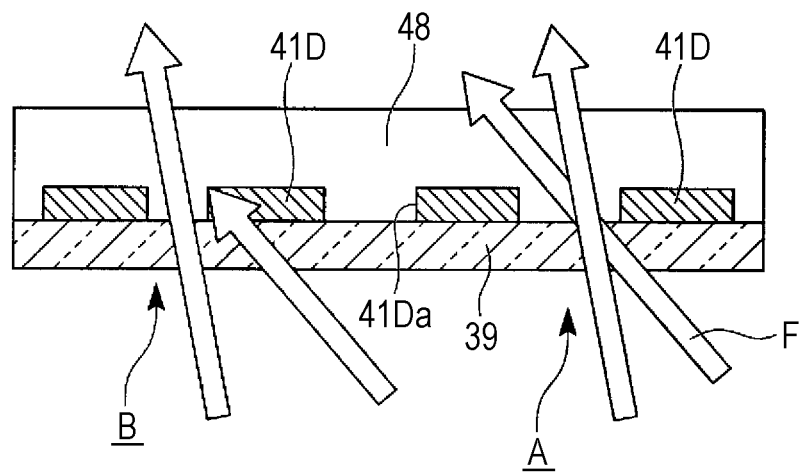
FIG. 14A is a cross-sectional view illustrating an operation in an exposure step of the light control film of the fourth embodiment of the present invention.
Figure 14B:
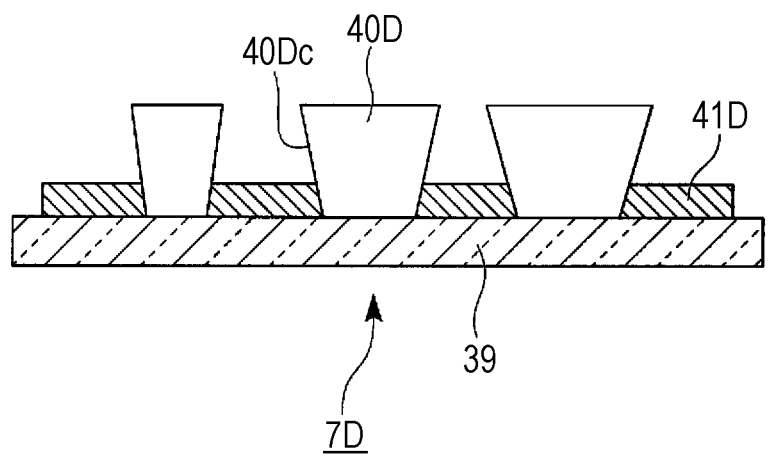
FIG. 14B is a cross-sectional view illustrating an operation in an exposure step of the light control film of the fourth embodiment of the present invention.

FIGS. 14A and 14B are diagrams illustrating a method for manufacturing the light control film of the present embodiment.

In addition, in FIGS. 12, 13A, 13B, 14A and 14B, constituent elements common to the drawings used in the first embodiment are given the same reference numerals, and detailed description thereof will be omitted.

In the first embodiment, a plurality of light diffusion portions all have the same shape. In contrast, in the light control film 7D of the present embodiment, as illustrated in FIGS. 12 and 13A, in a plurality of light diffusion portions 40D, dimensions (dimensions of openings of light shielding layers 41D) of light emission end surfaces 40Da are different from each other, and thus tilt angles of side surfaces 40Dc are also different from each other. In other words, in all of the plurality of light diffusion portions 40D, light emission end surfaces 40Da of the plurality of light diffusion portions 40D have a plurality of kinds of dimensions, and the side surfaces 40Dc of the plurality of light diffusion portions 40D have a plurality of tilt angles. In addition, tilt angles of the side surfaces 40Dc of the plurality of light diffusion portions 40D are different from each other, and thus dimensions of the light incidence end surfaces 40Db are also different from each other. Other configurations are the same as those of the first embodiment.

As illustrated in FIG. 13B, a photomask 69 used for forming the light shielding layer 41 is provided with a plurality of light shielding patterns 70 having different dimensions in which diameters are distributed in a range of 5 µm to 25 µm. If the light shielding layer 41F is formed by using the photomask 69, the light shielding layer 41D provided with a plurality of openings having different dimensions is obtained. Then, as illustrated in FIG. 14A, when the coating film 48 formed from a transparent negative resist is exposed from the base material 39 side by using the light shielding layer 41D as a mask, light which is incident to the base material 39 at a large incidence angle is hardly shielded by the light shielding layer 41D among the diffused light beams F at a location where a dimension of an opening 41Da of the light shielding layer 41D is large such as a location indicated by the reference sign A of FIG. 14A. For this reason, since the light which is incident to the base material 39 at a large incidence angle contributes to the exposure of the coating film 48 at this location, a tilt angle of the side surface 40Dc of the light diffusion portion 40D increases as illustrated in FIG. 14B.

On the other hand, light which is incident at a large incidence angle is easily shielded by the light shielding layer 41D at a location where a dimension of the opening 41Da of the light shielding layer 41D is small such as a location indicated by the reference sign B of FIG. 14A. For this reason, since the light which is incident to the base material 39 at a large incidence angle does not contribute to the exposure of the coating film 48 at this location, a tilt angle of the side surface 40Dc of the light diffusion portion 40D decreases as illustrated in FIG. 14B.

As mentioned above, by making dimensions of the openings 41Da of the light shielding layer 41D different, dimensions of the light emission end surfaces 40Da of the light diffusion portions 40D can be made different, and tilt angles of the side surfaces 40Dc can also be made different. Of course, as in the first embodiment, diffusion angles of diffused light may be changed depending on locations.

According to the liquid crystal display device 1D of the present embodiment, since tilt angles of the side surfaces 40Dc of the plurality of light diffusion portions 40D are different from each other, a range of a total reflection angle of light can be increased by complementing the plurality of light diffusion portions 40D in tilt angles of the side surfaces 40Dc are different from each other. As a result, when the liquid crystal display device 1D is observed while changing angles, luminance smoothly varies according to the observation angle, and thus it is possible to improve a viewing angle performance.

In addition, in the present embodiment, since the side surfaces 40Dc of the light diffusion portions 40D have a plurality of kinds of tilt angles, luminance smoothly varies, which is preferable. However, two kinds of tilt angles are only set by making tilt angles of at least some light diffusion portions different from tilt angles of the other light diffusion portions, and this can achieve an effect of improving a viewing angle performance.

Fifth Embodiment

Hereinafter, a fifth embodiment of the present invention will be described with reference to FIGS. 15 and 16.

A fundamental configuration of a liquid crystal display device of the present invention is the same as the configuration of the first embodiment, and only a shape of a light diffusion portion of a light control film is different from that of the first embodiment. Therefore, in the present embodiment, description of the fundamental configuration of the liquid crystal display device will be omitted, and only a light control film will be described.

Figure 15:
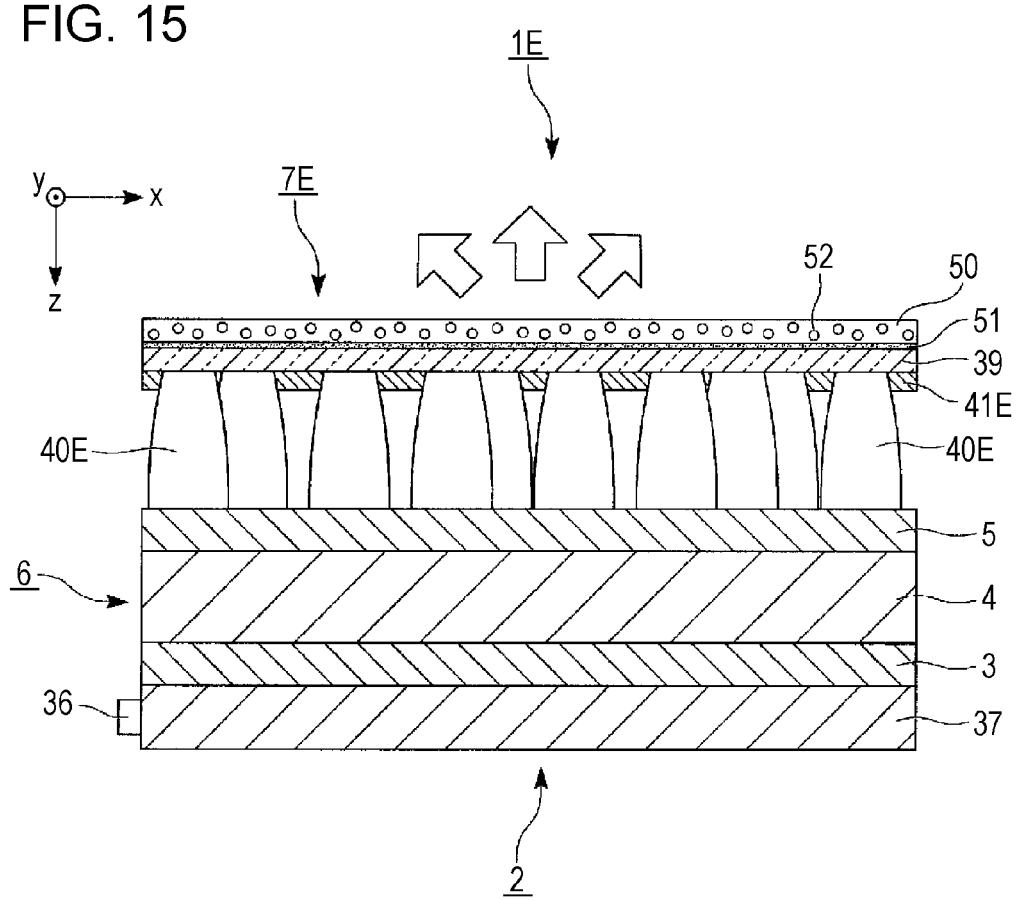
FIG. 15 is a cross-sectional view illustrating a liquid crystal display device of a fifth embodiment of the present invention.

FIG. 15 is a cross-sectional view illustrating a liquid crystal display device of the present embodiment.

Figure 16:
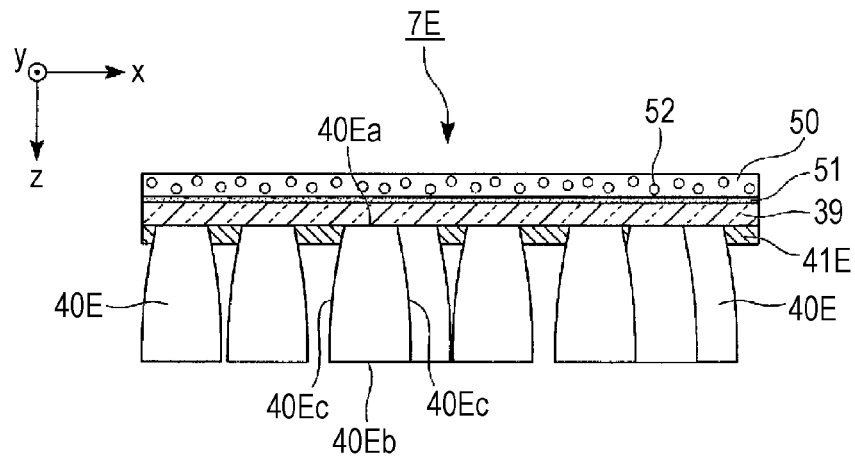
FIG. 16 is a cross-sectional view illustrating a light control film of the liquid crystal display device of the fifth embodiment of the present invention.

FIG. 16 is a cross-sectional view of a light control film of the present embodiment.

In addition, in FIGS. 15 and 16, constituent elements common to the drawings used in the first embodiment are given the same reference numerals, and detailed description thereof will be omitted.

In the above-described first embodiment, looking at a single light diffusion portion, the side surface of the light diffusion portion has a constant tilt angle. In contrast, in a light control film 7E of the present embodiment, as illustrated in FIGS. 15 and 16, a side surface 40Ec of a light diffusion portion 40E is smoothly curved from a light emission end surface 40Ea to a light incidence end surface 40Eb, and thus tilt angles are different depending on locations. Other configurations are the same as those of the first embodiment.

Also in the liquid crystal display device 1E of the present embodiment, the same effect as the effect in the first embodiment, in which moire does not occur, and display quality can be maintained.

In addition, in a case where a tilt angle of the side surface of the light diffusion portion is constant, display unevenness may be visually recognized depending on an observation angle when the observation angle is changed in a horizontal direction or a vertical direction of a screen. In the fourth embodiment, as a countermeasure for the display unevenness, all the side surfaces of the plurality of light diffusion portions have a plurality of kinds of tilt angles. In contrast, in the light control film 7E of the present embodiment, tilt angles are also different depending on locations of the side surface 40Ec in the respective light diffusion portions 40E, and thus a reflection angle distribution of light further spreads than in a case where a tilt angle of the side surface is constant. Accordingly, luminance smoothly varies according to an observation angle, and thus it is possible to improve a viewing angle performance.

Sixth Embodiment

Hereinafter, a sixth embodiment of the present invention will be described with reference to FIGS. 17 and 18.

A fundamental configuration of a liquid crystal display device of the present invention is the same as the configuration of the first embodiment, and only a shape of a light diffusion portion of a light control film is different from that of the first embodiment. Therefore, in the present embodiment, description of the fundamental configuration of the liquid crystal display device will be omitted, and only a light control film will be described.

Figure 17:
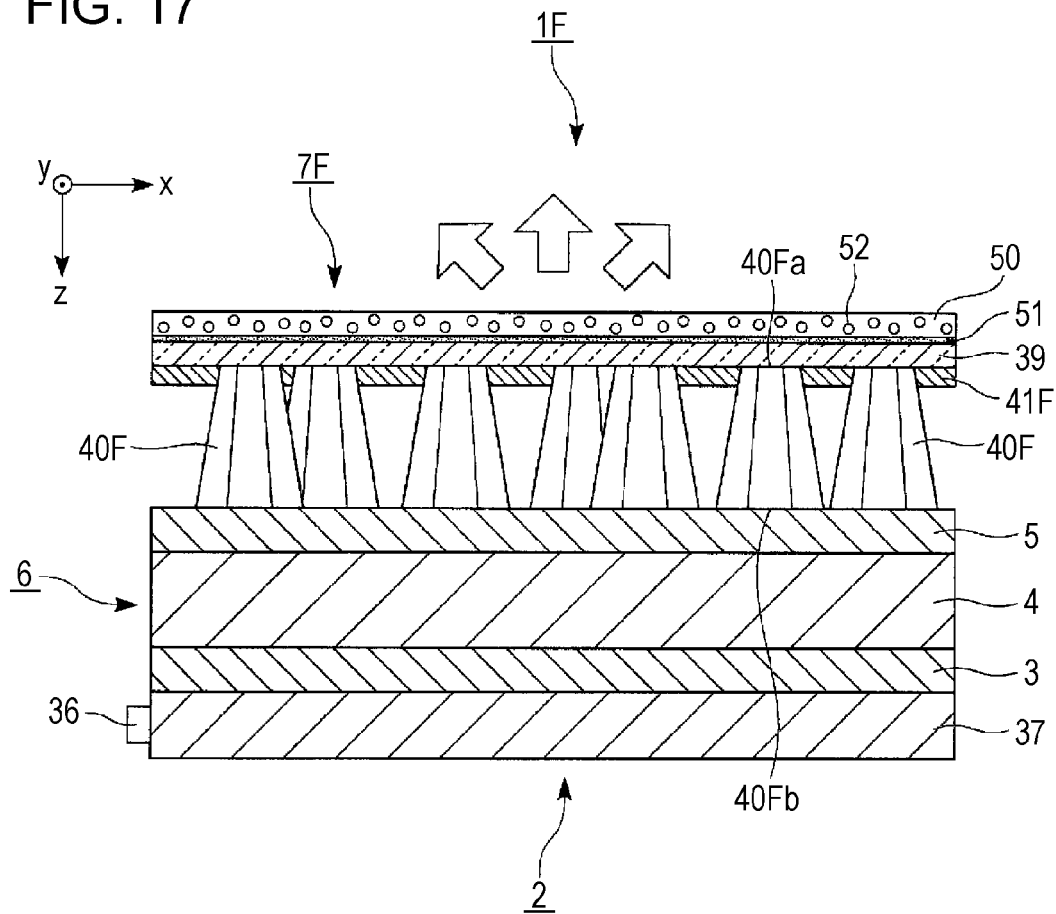
FIG. 17 is a cross-sectional view illustrating a liquid crystal display device of a sixth embodiment of the present invention.

FIG. 17 is a cross-sectional view illustrating a liquid crystal display device of the present embodiment.

Figure 18:
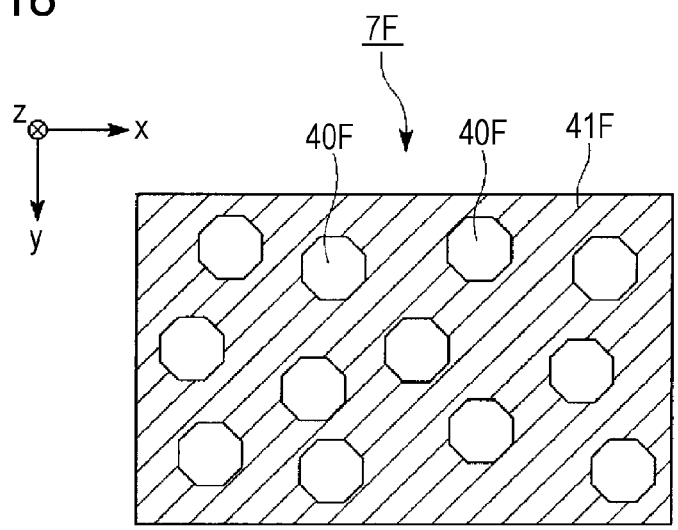
FIG. 18 is a plan view illustrating a light control film of the liquid crystal display device of the sixth embodiment of the present invention.

FIG. 18 is a plan view of a light control film of the present embodiment.

In addition, in FIGS. 17 and 18, constituent elements common to the drawings used in the first embodiment are given the same reference numerals, and detailed description thereof will be omitted.

In the first embodiment, each light diffusion portion has an approximately truncated cone shape, and both planar shapes of the light incidence end surface and the light emission end surface are circular shapes. In contrast, in a light control film 7F of the present embodiment, each light diffusion portion 40F has a truncated octangular pyramid as illustrated in FIGS. 17 and 18, and both planar shapes of a light incidence end surface 40Fb and a light emission end surface 40Fa are octagonal shapes. Among eight sides with an octagonal shape which is a planar shape of each light diffusion portion 40F, four sets of sides with two sides parallel to each other as a set are respectively disposed so as to be directed in a direction parallel to the x axis, a direction parallel to the y axis, a direction forming an angle of 45° with the x axis (an angle viewed in a counterclockwise direction with respect to the positive direction of the x axis), and a direction forming an angle of 135° with the x axis. Other configurations are the same as those of the first embodiment. When the light control film 7F with the above configuration is manufactured, a photomask with octagonal light shielding patterns may be used in a forming step of the light shielding layer 41F.

Also in the liquid crystal display device 1F of the present embodiment, the same effect as the effect in the first embodiment, in which moire does not occur, and display quality can be maintained.

In addition, in the first embodiment, a planar shape of the light diffusion portion is a circular shape, and thus light is diffused in all orientations centering on the direction normal to the liquid crystal display body 6, and a viewing angle widening effect is shown in all the orientations. In contrast, according to the present embodiment, since a planar shape of the light diffusion portion 40F is an octagonal shape, the above-described four sets of sides are respectively disposed so as to be directed in a direction parallel to the x axis, a direction parallel to the y axis, a direction forming an angle of 45° with the x axis, and a direction forming an angle of 135° with the x axis, light is diffused so as to concentrate on the four orientations.

For this reason, a viewing angle widening effect is shown in a horizontal direction, a vertical direction, and tilt directions in which a viewing angle performance is regarded to be considerably important in a liquid crystal display device. In addition, a planar shape of the light diffusion portion 40F is not limited to an octagonal shape, and may employ other polygonal shapes. In this case, since light is diffused so as to concentrate on specific directions depending on polygonal shapes and arrangements of sides, it is possible to provide a liquid crystal display device which shows an excellent viewing angle widening effect in the specific orientations.

Figure 19A:
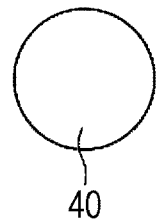
FIG. 19A is a plan view illustrating another example of a light diffusion portion of the light control film of the sixth embodiment of the present invention.
Figure 19B:
FIG. 19B is a plan view illustrating still another example of the light diffusion portion of the light control film of the sixth embodiment of the present invention.
Figure 19C:
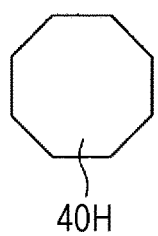
FIG. 19C is a plan view illustrating still another example of the light diffusion portion of the light control film of the sixth embodiment of the present invention.
Figure 19D:
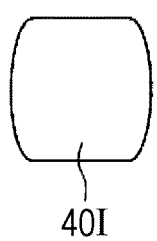
FIG. 19D is a plan view illustrating still another example of the light diffusion portion of the light control film of the sixth embodiment of the present invention.
Figure 19E:
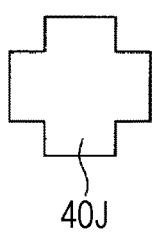
FIG. 19E is a plan view illustrating still another example of the light diffusion portion of the light control film of the sixth embodiment of the present invention.

In addition, in the first embodiment, an example of the light diffusion portion 40 whose planar shape is a circular shape has been described as illustrated in FIG. 19A, but, for example, as illustrated in FIG. 19B, a light diffusion portion 40G whose planar shape is a square shape may be used. Alternatively, as illustrated in FIG. 19C, a light diffusion portion 40H whose planar shape is a regular octagonal shape. Alternatively, as illustrated in FIG. 19D, a light diffusion portion 40I with a shape in which two opposing sides of a square are curved outwards may be used. Alternatively, as illustrated in FIG. 19E, a light diffusion portion 40J with a shape in which two rectangles are made to intersect each other in two perpendicular directions may be used.

Figure 19F:
FIG. 19F is a plan view illustrating still another example of the light diffusion portion of the light control film of the sixth embodiment of the present invention.
Figure 19G:
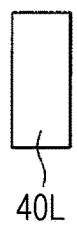
FIG. 19G is a plan view illustrating still another example of the light diffusion portion of the light control film of the sixth embodiment of the present invention.
Figure 19H:
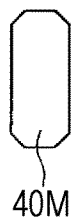
FIG. 19H is a plan view illustrating still another example of the light diffusion portion of the light control film of the sixth embodiment of the present invention.
Figure 19I:
FIG. 19I is a plan view illustrating still another example of the light diffusion portion of the light control film of the sixth embodiment of the present invention.
Figure 19J:
FIG. 19J is a plan view illustrating still another example of the light diffusion portion of the light control film of the sixth embodiment of the present invention.

Alternatively, as illustrated in FIG. 19F, a light diffusion portion 40K with an elongated elliptical shape may be used. Alternatively, as illustrated in FIG. 19G, a light diffusion portion 40L with an elongated rectangular shape may be used. Alternatively, as illustrated in FIG. 19H, a light diffusion portion 40M with an elongated octagonal shape may be used. Alternatively, as illustrated in FIG. 19I, a light diffusion portion 40N with a shape in which two opposing sides of an elongated rectangle are curved outwards may be used. Alternatively, as illustrated in FIG. 19J, a light diffusion portion 40P with a shape in which two rectangles having different aspect ratios are made to intersect each other in two perpendicular directions may be used. In addition, the shapes of FIGS. 19A to 19J may be rotated in a plurality of directions.

For example, in the square light diffusion portion 40G illustrated in FIG. 19B, light is diffused in a direction perpendicular to each side of the square. In addition, in the rectangular light diffusion portion 40L illustrated in FIG. 19G, diffusion of light in a direction perpendicular to the long side is stronger than diffusion of light in a direction perpendicular to the short side.

For this reason, it is possible to implement a light control film in which strengths of diffusion are different in the vertical direction (upper and lower directions) and the horizontal direction (left and right directions) depending on lengths of the sides. As mentioned above, in a case where anisotropy of a viewing angle is required, different light diffusion performances can be achieved by appropriately changing shapes of the light shielding portion.

Seventh Embodiment

Hereinafter, a seventh embodiment of the present invention will be described with reference to FIGS. 20A to 21E.

A fundamental configuration of a liquid crystal display device of the present invention is the same as the configuration of the first embodiment, and only configurations of a light control film and a light shielding layer are different from those of the first embodiment. Therefore, in the present embodiment, description of the fundamental configuration of the liquid crystal display device will be omitted, and only a light control film will be described.

Figure 20A:
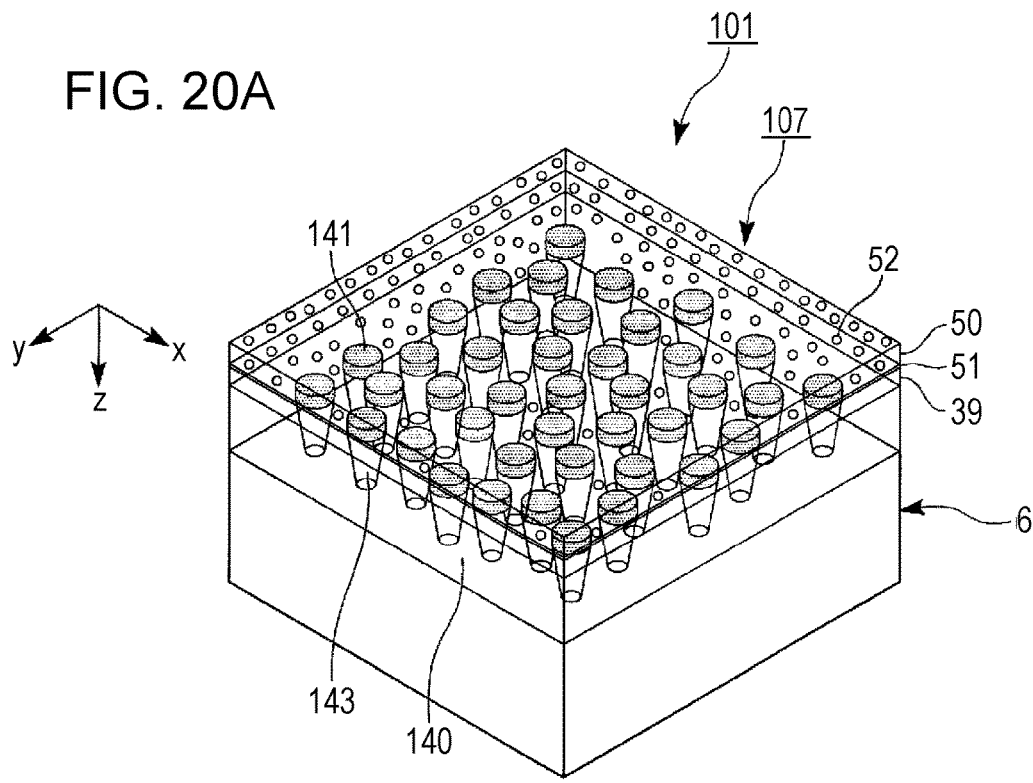
FIG. 20A is a schematic perspective view illustrating a liquid crystal display device of a seventh embodiment of the present invention.
Figure 20B:
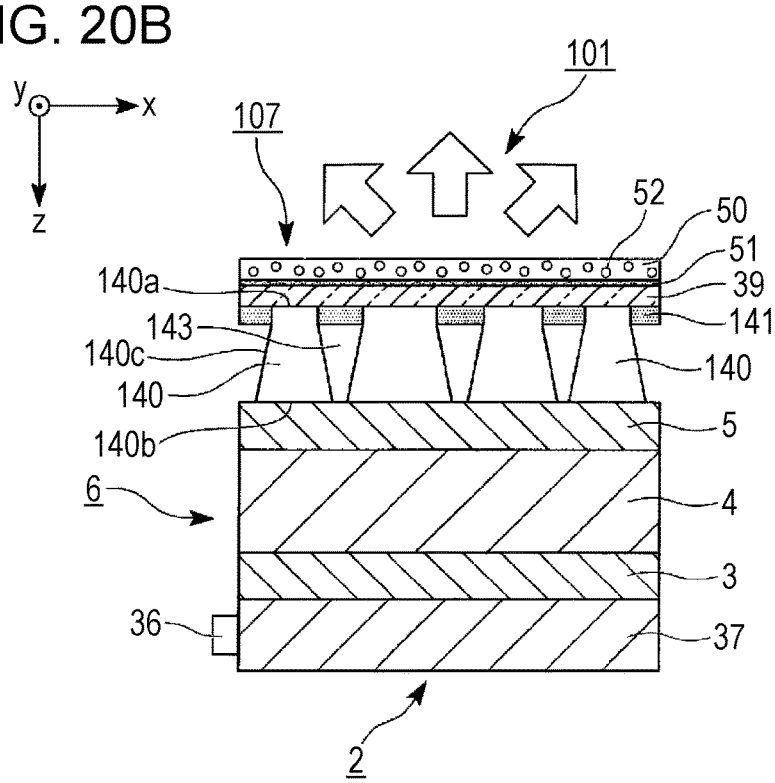
FIG. 20B is a schematic cross-sectional view illustrating the liquid crystal display device of the seventh embodiment of the present invention.

FIGS. 20A and 20B are schematic diagrams illustrating a liquid crystal display device of the present embodiment. FIG. 20A is a perspective view of a liquid crystal display device 101 of the present embodiment, and FIG. 20B is a cross-sectional view of the liquid crystal display device 101 of the present embodiment.

FIGS. 21A to 21E are cross-sectional views illustrating a light control film in a manufacturing step order.

In FIGS. 20A and 20B, and FIGS. 21A to 21E, constituent elements common to the drawings used in the first embodiment are given the same reference numerals, and detailed description thereof will be omitted.

In the first embodiment, there are provided a plurality of light diffusion portions 40 formed on one surface of the base material 39 and the light shielding layer 41 formed in the region other than the formation region of the light diffusion portions 40 on one surface of the base material 39, the plurality of light diffusion portions 40 are disposed so as to be dotted when viewed from the direction normal to one surface of the base material 39, and the light shielding layer 41 is continuously formed in the region other than the formation region of the light diffusion portion 40.

In contrast, a light control film 107 includes a plurality of light shielding layers 141 formed on one surface of the base material 39 and a light diffusion portion 140 formed in a region other than the formation region of the light shielding layers 141 on one surface of the base material 39, the plurality of light shielding layers 141 are disposed so as to be dotted when viewed from the direction normal to one surface of the base material 39, and the light diffusion portion 140 is continuously formed in the region other than the formation region of the light shielding layers 141.

The plurality of light shielding layers 141 are randomly (aperiodically) disposed so as to be dotted on the base material 39. Accordingly, a plurality of hollow portions 143 which are formed at the same positions as the plurality of light shielding layers 141 are also randomly disposed on the base material 39.

In the present embodiment, a planar shape of each light shielding layer 141 is a circular shape when viewed from the direction normal to the base material 39. A diameter of each light shielding layer 141 is, for example, 10 μm. The plurality of light shielding layers 141 all have the same diameter. The plurality of light shielding layers 141 are formed so as to be dotted on the base material 39, and thus the light diffusion portion 140 of the present embodiment is continuously formed on the base material 39.

In the formation region of the light shielding layers 141 of the light control film 107, the hollow portion 143 is formed so as to have a shape in which a cross-section area when cut along a plane parallel to one surface of the base material 39 is large on the light shielding layer 141 side and is reduced with increasing distance from the light shielding layer 141. In other words, the hollow portion 143 has a substantially truncated cone shape which is forward tapered when viewed from the base material 39 side. There is air in the hollow portions 143. A part other than the hollow portions 143 of the light control film 107, that is, the part where the light diffusion portion 140 is continuously present contributes to transmission of light. Light which is incident to the light diffusion portion 140 is totally reflected at an interface between the light diffusion portion 140 and the hollow portion 143, and is guided in a state of being substantially confined in the light diffusion portion 140 so as to be emitted outwards via the base material 39.

In a case of the present embodiment, since there is air in the hollow portions 143, if the light diffusion portion 140 is made of, for example, a transparent resin, a side surface 140c of the light diffusion portion 140 is an interface between the transparent resin and air. Here, a refractive index difference of an interface between inside and outside of the light diffusion portion 140 is greater in a case where the hollow portions 143 is filled with air than in a case where surroundings of the light diffusion portion 140 are filled with other typical low refractive index materials. Therefore, from the Snell's law, an incidence angle range in which light is totally reflected at the side surface 140c of the light diffusion portion 140 is wide. As a result, a light loss is further minimized, and thus high luminance can be obtained.

In addition, the hollow portions 143 may be filled with an inert gas such as nitrogen instead of air. Alternatively, the hollow portions 143 may be in a vacuum state.

Next, a method for manufacturing the liquid crystal display device 101 with the configuration will be described with reference to FIGS. 21A to 21E.

Hereinafter, manufacturing steps of the light control film 107 will be mainly described.

Figure 21A:
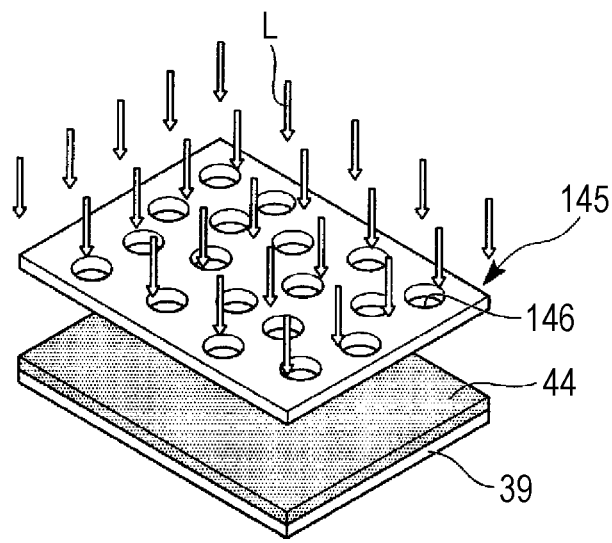
FIG. 21A is a perspective view illustrating a light control film of the liquid crystal display device of the seventh embodiment of the present invention in a manufacturing step order.

First, as illustrated in FIG. 21A, the base material 39 of polyethylene terephthalate, with 10 centimeter square and a thickness of 100 μm is prepared, and a black negative resist containing carbon as a material of the light shielding layer is coated on one surface of the base material 39 by using a spin coating method, so as to form a coating film 44 which is 150 nm thick.

Next, the base material 39 provided with the coating film 44 is placed on a hot plate, and the coating film is prebaked at a temperature of 90° C. Accordingly, a solvent in the black negative resist evaporates.

Next, the coating film 44 is irradiated with light E via a photomask 145 provided with a plurality of opening patterns 146 whose planar shape is a circular shape by using an exposure device, so as to perform exposure. At this time, the exposure device which uses mixed rays including i rays of a wavelength of 365 nm, h rays of a wavelength of 404 nm, and g rays of a wavelength of 436 nm is used. An exposure amount is 100 mJ/cm².

As illustrated in FIG. 21A, the photomask 145 used to form the light shielding layers 141 has a plurality of circular opening patterns 146 which are randomly disposed. When the photomask 145 is designed, first, the opening patterns 146 are regularly disposed at constant pitches, then, reference position data of each opening pattern 146 is made to fluctuate by using a random function so that positions of the opening patterns 146 vary, and by making the position of the opening pattern 146, the photomask 145 having a plurality of opening patterns 146 which are randomly disposed can be manufactured.

Figure 21B:
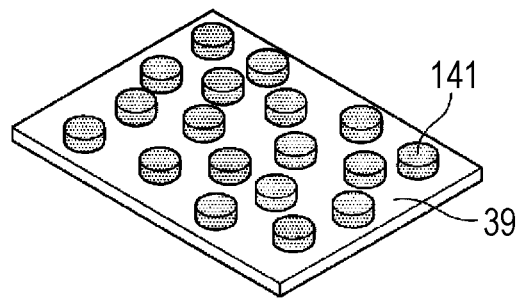
FIG. 21B is a perspective view illustrating the light control film of the liquid crystal display device of the seventh embodiment of the present invention in a manufacturing step order.

After exposure is performed by using the photomask 145, the coating film 44 formed from the black negative resist is developed by using a dedicated developer, and is dried at 100° C., so as to form a plurality of light shielding layers 141 whose planar shape is a circular shape on one surface of the base material 39 as illustrated in FIG. 21B. In a case of the present embodiment, in the next step, a transparent negative resist is exposed by using the light shielding layers 141 formed from the black negative resist as a mask, so as to form the hollow portions 143. For this reason, positions of the opening patterns 146 of the photomask 145 correspond to formation positions of the hollow portions 143. The circular light shielding layers 141 correspond to a region (hollow portions 143) where the light diffusion portion 140 is not formed in the subsequent step. The plurality of opening patterns 146 are all circular patterns with a diameter of 10 μm.

In addition, in the present embodiment, the light shielding layer 141 is formed according to a photolithography method using the black negative resist, but, alternatively, if a photomask in which the opening patterns 146 of the present embodiment and a light shielding pattern are reversed to each other, a positive resist with light absorptance may be used. Alternatively, the light shielding layer 141 which is patterned by using a deposition method, a printing method, or an ink jet method may be directly formed.

Figure 21C:
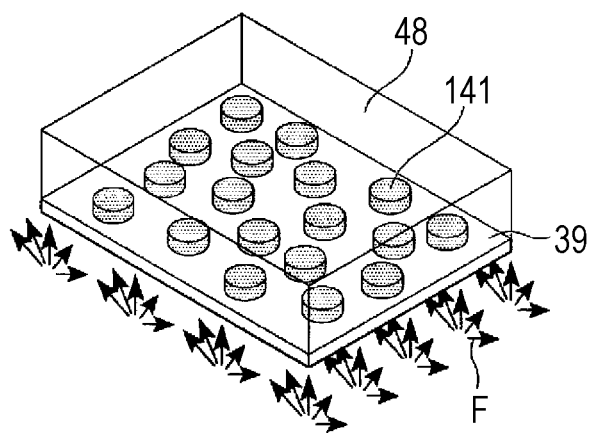
FIG. 21C is a perspective view illustrating the light control film of the liquid crystal display device of the seventh embodiment of the present invention in a manufacturing step order.

Next, as illustrated in FIG. 21C, a transparent negative resist made of an acrylic resin is coated as a material of the light diffusion portion on the upper surface of the light shielding layer 141 by using a spin coating method, so as to form a coating film 48 which is 25 μm thick. Next, the base material 39 provided with the coating film 48 is placed on a hot plate, and the coating film 48 is prebaked at a temperature of 95° C. Accordingly, a solvent in the transparent negative resist evaporates.

Next, the coating film 48 is irradiated with diffused light F from the base material 39 side by using the light shielding layer 141 as a mask, so as to perform exposure. At this time, the exposure device which uses mixed rays including i rays of a wavelength of 365 nm, h rays of a wavelength of 404 nm, and g rays of a wavelength of 436 nm is used. An exposure amount is 600 mJ/cm². In the exposure step, parallel light or diffused light is used.

In addition, as means for irradiating the base material 39 with the diffused light F using parallel light which is emitted from the exposure device, a diffusion plate with a haze of about 50 may be disposed on a path of light emitted from the exposure device. The exposure is performed with the diffused light F, and thus the coating film 48 is radially exposed so as to spread outwards from the non-formation region of the light shielding layer 141. Accordingly, the forward tapered hollow portions 143 are formed, and the reverse tapered side surface is formed at a part of the light diffusion portion 140 which is in contact with the hollow portion 143.

Then, the base material 39 provided with the coating film 48 is placed on the hot plate, and post exposure baking (PEB) is performed on the coating film 48 at a temperature of 95° C.

Figure 21D:
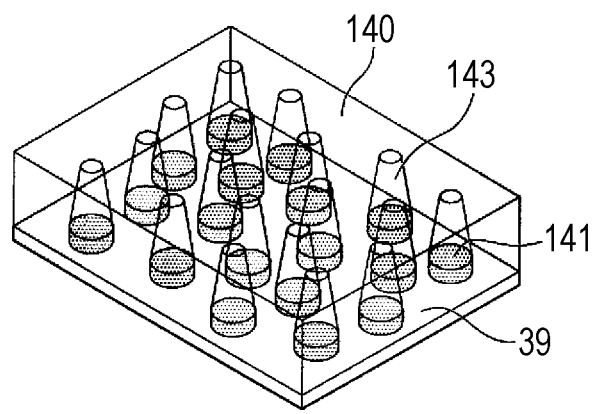
FIG. 21D is a perspective view illustrating the light control film of the liquid crystal display device of the seventh embodiment of the present invention in a manufacturing step order.

Subsequently, the coating film 48 formed from the transparent negative resist is developed by using a dedicated developer, and is post-baked at 100° C., so that a plurality of light diffusion portion 140 having the plurality of hollow portions 143 are formed on one surface of the base material 39 as illustrated in FIG. 21D.

Figure 21E:
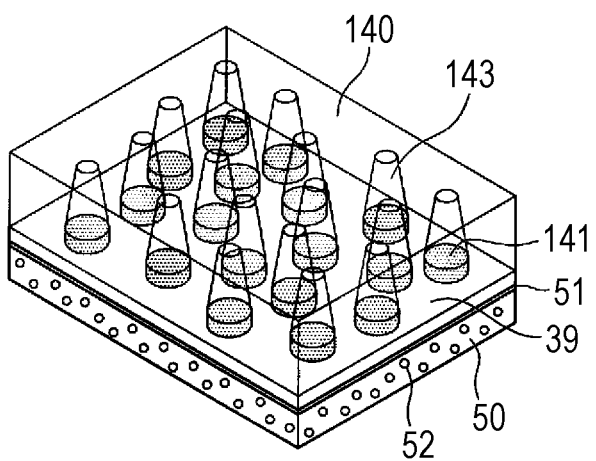
FIG. 21E is a perspective view illustrating the light control film of the liquid crystal display device of the seventh embodiment of the present invention in a manufacturing step order.

Next, as illustrated in FIG. 21E, a diffusion film 50 in which light scattering bodies 52 such as a plurality of acryl beads are dispersed in a binder resin such as an acrylic resin is disposed on the other surface of the base material 39 via an adhesive layer 51.

Through the above-described steps, the light control film 107 of the present embodiment is completed. In addition, in the above-described example, a liquid resist is coated when the light shielding layer 141 or the light diffusion portion 140 is formed, but, alternatively, a film-like resist may be attached to one surface of the base material 39.

Finally, the completed light control film 107 is attached to the liquid crystal display body 6 by using an optical adhesive or the like in a state in which the base material 39 is directed toward the viewing side and the light diffusion portion 140 opposes the second polarization plate 5 as illustrated in FIG. 20B.

The liquid crystal display device 101 of the present embodiment is completed due to the above-described steps.

Also in the liquid crystal display device 101 of the present embodiment, the same effect as the effect of the first embodiment in which a light control film can be manufactured without making a manufacturing process complex, can be achieved.

In addition, according to this configuration, since the plurality of light shielding layers 141 are randomly disposed in a plane, there is no occurrence of moire due to interference with a regular arrangement of the pixels of the liquid crystal panel 4, and display quality can be maintained.

In addition, according to this configuration, the plurality of hollow portions 143 provided in the light control film 107 are isolated, and the part serving as the light diffusion portion 140 has a shape which is continuously located in the surface. Accordingly, even if a density of the hollow portions 143 is increased, and a volume of the light diffusion portion 140 is reduced in order to increase an extent of light diffusion, a contact area between the light diffusion portion 140 and the base material 39 can be sufficiently secured, and thus adhesion between the light diffusion portion 140 and the base material 39 is strong. For this reason, defects of the light diffusion portion 140 due to an external force or the like hardly occur, and a desired light diffusion function can be obtained.

Further, since the transparent resin layer is irradiated with the light F from the rear surface side of the base material 39 by using the light shielding layer 140 as a mask, the light diffusion portion 140 is formed in a self alignment state in the region where the light shielding layers 141 are not formed. As a result, the light diffusion portion 140 does not overlap the light shielding layers 141, and light transmittance can be reliably maintained. Furthermore, fine alignment work is not necessary, and thus it is possible to reduce time required for the manufacturing.

In addition, according to this configuration, since volumes of the respective hollow portions 143 are the same as each other, a volume of the resin which is removed when the transparent resin layer is developed is constant. For this reason, a development speed of each hollow portion 143 is constant in a step of forming the respective hollow portions 143, and thus a desired tapered shape can be formed. As a result, uniformity of a minute shape of the light control film 107 is increased, and thus a yield is improved.

Figure 22A:
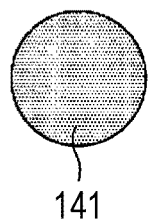
FIG. 22A is a plan view illustrating another example of a light shielding layer of the light control film of the seventh embodiment of the present invention.
Figure 22B:
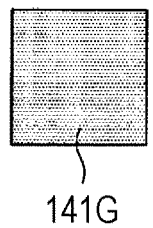
FIG. 22B is a plan view illustrating still another example of a light shielding layer of the light control film of the seventh embodiment of the present invention.
Figure 22C:
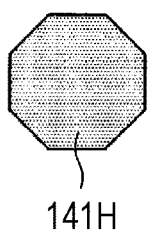
FIG. 22C is a plan view illustrating still another example of the light shielding layer of the light control film of the seventh embodiment of the present invention.
Figure 22D:
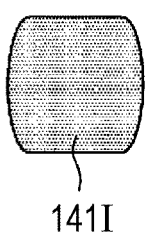
FIG. 22D is a plan view illustrating still another example of the light shielding layer of the light control film of the seventh embodiment of the present invention.
Figure 22E:
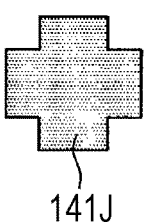
FIG. 22E is a plan view illustrating still another example of the light shielding layer of the light control film of the seventh embodiment of the present invention.

In addition, in the present embodiment, an example of the light shielding layer 141 whose planar shape is a circular shape has been described as illustrated in FIG. 22A, but, for example, as illustrated in FIG. 22B, a light shielding layer 141G whose planar shape is a square shape may be used. Alternatively, as illustrated in FIG. 22C, a light shielding layer 141H whose planar shape is a regular octagonal shape. Alternatively, as illustrated in FIG. 22D, a light shielding layer 141I with a shape in which two opposing sides of a square are curved outwards may be used. Alternatively, as illustrated in FIG. 22E, a light shielding layer 141J with a shape in which two rectangles are made to intersect each other in two perpendicular directions may be used.

Figure 22F:
FIG. 22F is a plan view illustrating still another example of the light shielding layer of the light control film of the seventh embodiment of the present invention.
Figure 22G:
FIG. 22G is a plan view illustrating still another example of the light shielding layer of the light control film of the seventh embodiment of the present invention.
Figure 22H:
FIG. 22H is a plan view illustrating still another example of the light shielding layer of the light control film of the seventh embodiment of the present invention.
Figure 22I:
FIG. 22I is a plan view illustrating still another example of the light shielding layer of the light control film of the seventh embodiment of the present invention.
Figure 22J:
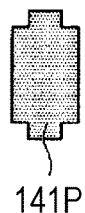
FIG. 22J is a plan view illustrating still another example of the light shielding layer of the light control film of the seventh embodiment of the present invention.

Alternatively, as illustrated in FIG. 22F, a light shielding layer 141K with an elongated elliptical shape may be used. Alternatively, as illustrated in FIG. 22G, a light shielding layer 141L with an elongated rectangular shape may be used. Alternatively, as illustrated in FIG. 22H, a light shielding layer 141M with an elongated octagonal shape may be used. Alternatively, as illustrated in FIG. 22I, a light shielding layer 141N with a shape in which two opposing sides of an elongated rectangle are curved outwards may be used. Alternatively, as illustrated in FIG. 22J, a light shielding layer 141P with a shape in which two rectangles having different aspect ratios are made to intersect each other in two perpendicular directions may be used. In addition, the shapes of FIGS. 22A to 22J may be rotated in a plurality of directions.

A planar shape of the light shielding layer 141 of the present embodiment is a circular shape as illustrated in FIG. 22A, and thus the side surface 140c of the light diffusion portion 140, that is, a cross-sectional shape of the reflective surface is also a circular shape. Therefore, light reflected at the side surface 140c of the light diffusion portion 140 is diffused in all orientations.

In contrast, in the square light shielding layer 141G illustrated in FIG. 22B, light is diffused in a direction perpendicular to each side of the square. In addition, in the rectangular light shielding layer 141L illustrated in FIG. 22G, diffusion of light in a direction perpendicular to the long side is stronger than diffusion of light in a direction perpendicular to the short side.

For this reason, it is possible to implement a light control film in which strengths of diffusion are different in the vertical direction (upper and lower directions) and the horizontal direction (left and right directions) depending on lengths of the sides. In addition, in the octagonal light shielding layer 141H illustrated in FIG. 22C, light can be diffused so as to concentrate on a vertical direction, a horizontal direction, and oblique 45° directions in which a viewing angle performance is regarded to be considerably important in a liquid crystal display device. As mentioned above, in a case where anisotropy of a viewing angle is required, different light diffusion performances can be achieved by appropriately changing shapes of the light shielding portion.

First Modification Example of Seventh Embodiment

Figure 23A:
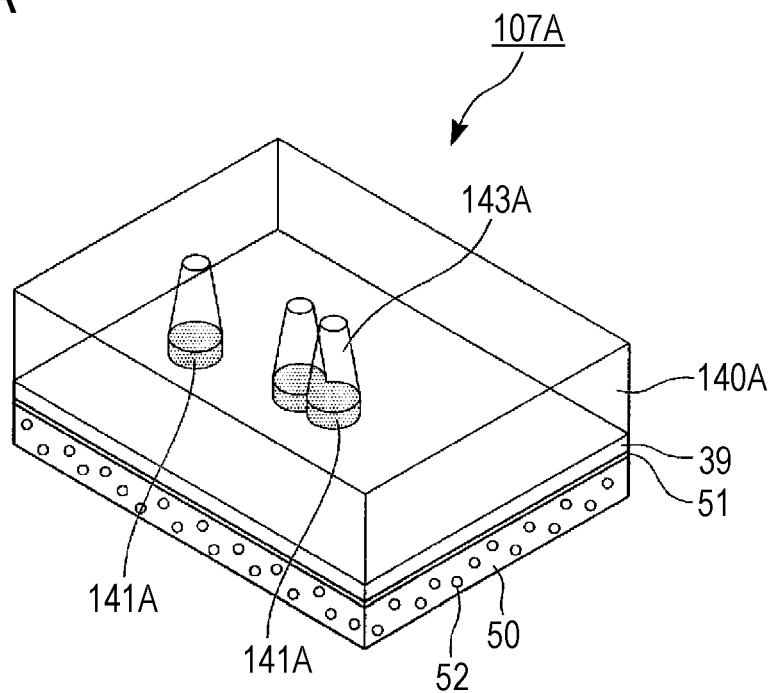
FIG. 23A is a schematic perspective view illustrating a first modification example of the light control film of the seventh embodiment of the present invention.
Figure 23B:
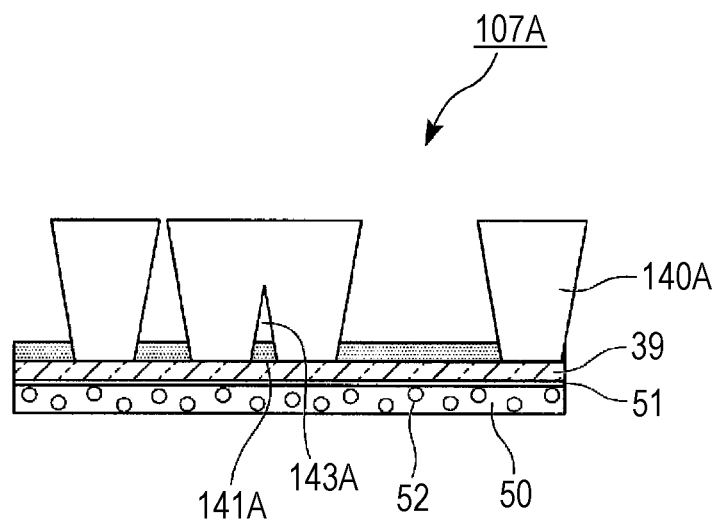
FIG. 23B is a schematic cross-sectional view illustrating the first modification example of the light control film of the seventh embodiment of the present invention.

FIGS. 23A and 23B are schematic diagrams illustrating a first modification example of the liquid crystal display device of the embodiment. FIG. 23A is a perspective view of a light control film 107A of the present modification example, and FIG. 23B is a cross-sectional view of the light control film 107A of the present modification example.

In the above-described embodiment, the plurality of light shielding layers 141 are formed separately on one surface of the base material 39, but, as in the light control film 107A illustrated in FIGS. 23A and 23B, at least some of the plurality of light shielding layers 141A may be connected to each other. In the present modification example, two light shielding layers 141A which are adjacent to each other are connected to each other, and hollow portions 143A formed in the region where the connected light shielding layers 141A are formed are also connected to each other. In addition, as illustrated in FIG. 23B, the hollow portion 143A may be blocked by the light diffusion portion 140A.

Also in this configuration, a contact area between the light diffusion portion 140A and the base material 39 can be sufficiently secured, and thus adhesion between the light diffusion portion 140A and the base material 39 is strong. In addition, if the light diffusion portions 140A are connected to each other, a ratio in which light incident to the light control film 107A is absorbed by the light shielding layers 141A is reduced, and thus light use efficiency is improved.

Eighth Embodiment

Hereinafter, an eighth embodiment of the present invention will be described with reference to FIGS. 24A to 25E.

A fundamental configuration of a liquid crystal display device of the present invention is the same as the configuration of the seventh embodiment, and is different from that of the seventh embodiment only in that a light scattering body is included in a base material. Therefore, in the present embodiment, description of the fundamental configuration of the liquid crystal display device will be omitted, and only a light control film will be described.

Figure 24A:
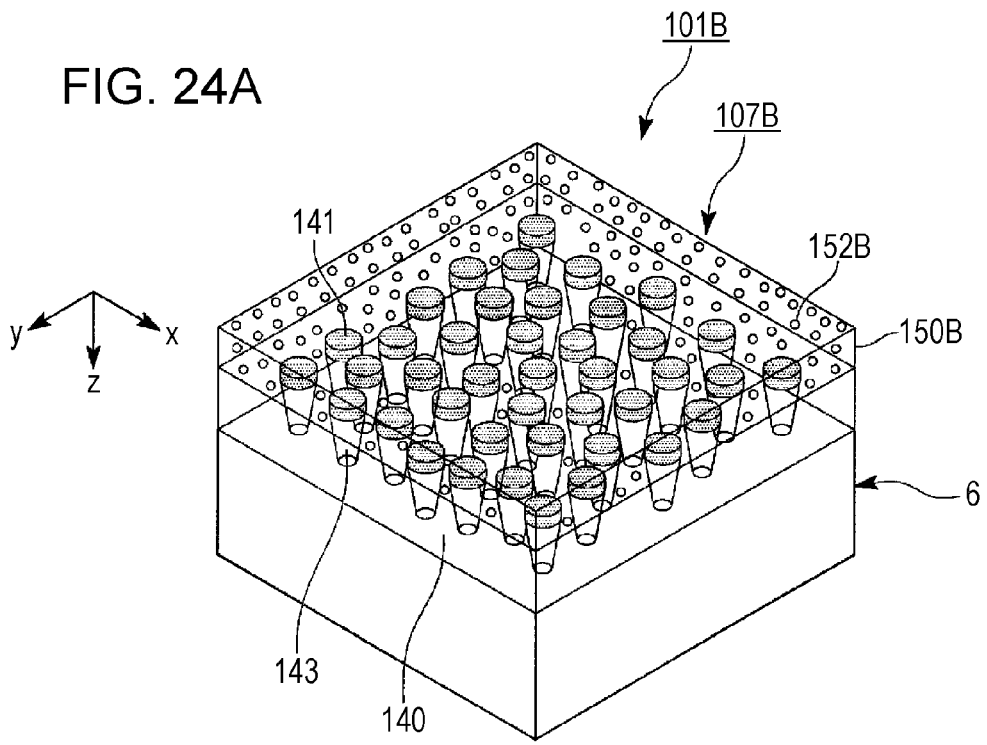
FIG. 24A is a schematic perspective view illustrating a liquid crystal display device of an eighth embodiment of the present invention.
Figure 24B:
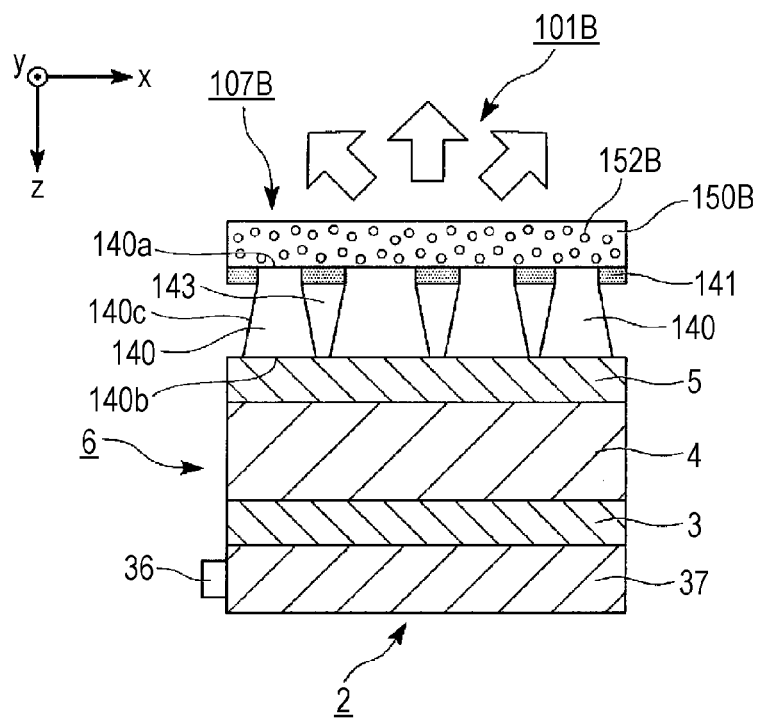
FIG. 24B is a schematic cross-sectional view illustrating the liquid crystal display device of the eighth embodiment of the present invention.

FIGS. 24A and 24B are schematic diagrams illustrating a liquid crystal display device of the present embodiment. FIG. 24A is a perspective view of a liquid crystal display device 101B of the present embodiment, and FIG. 24B is a cross-sectional view of the liquid crystal display device 101B of the present embodiment.

FIGS. 25A to 25E are cross-sectional views illustrating a light control film in a manufacturing step order.

In FIGS. 24A to 25E, constituent elements common to the drawings used in the seventh embodiment are given the same reference numerals, and detailed description thereof will be omitted.

In the seventh embodiment, the diffusion film 50 is disposed on the other surface (a surface on the viewing side) of the base material 39. In contrast, in a light control film 107B of the present embodiment, as illustrated in FIGS. 24A and 25B, a diffusion film is not disposed on a base material, and the base material itself functions as a diffusion film. In other words, a plurality of light scattering bodies 152B are dispersed in a base material 150B.

Figure 25A:
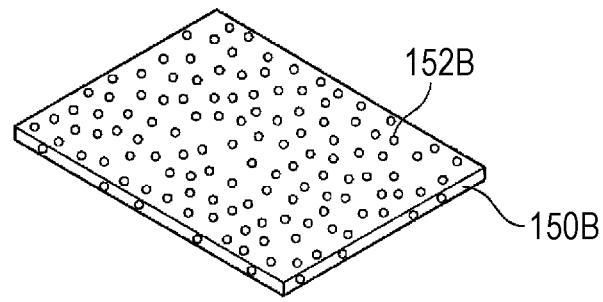
FIG. 25A is a perspective view illustrating a light control film of the liquid crystal display device of the eighth embodiment of the present invention in a manufacturing step order.
Figure 25B:
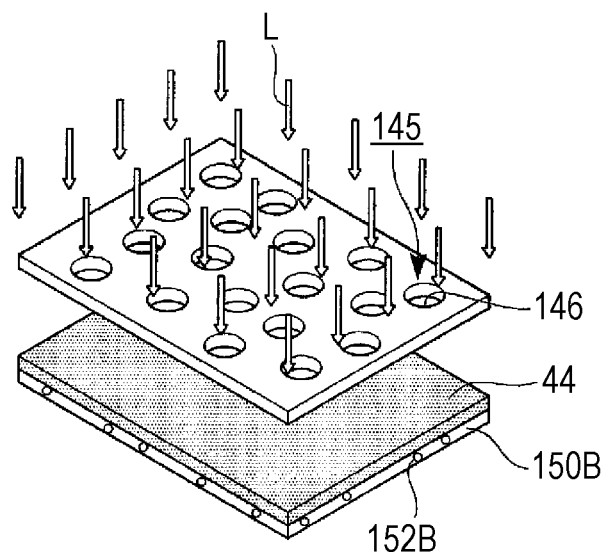
FIG. 25B is a perspective view illustrating the light control film of the liquid crystal display device of the eighth embodiment of the present invention in a manufacturing step order.

In a manufacturing step of the light control film 107B of the present embodiment, first, as illustrated in FIG. 25A, the base material 150B into which a plurality of light scattering bodies 152B are dispersed is prepared.

Next, as illustrated in FIG. 25B, a black negative resist containing carbon as a material of the light shielding layer is coated on one surface of the base material 150B by using a spin coating method, so as to form a coating film 44. Subsequently, the base material 39 provided with the coating film 44 is placed on a hot plate, and the coating film is prebaked.

Next, the coating film 44 is irradiated with light E via a photomask 145 provided with a plurality of opening patterns 146 by using an exposure device, so as to perform exposure.

Figure 25C:
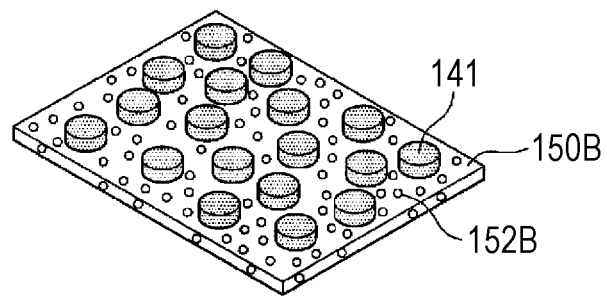
FIG. 25C is a perspective view illustrating the light control film of the liquid crystal display device of the eighth embodiment of the present invention in a manufacturing step order.

After exposure is performed by using the photomask 145, the coating film 44 formed from the black negative resist is developed by using a dedicated developer, and is dried so as to form the light shielding layer 141 whose planar shape is a circular shape on one surface of the base material 150B as illustrated in FIG. 25C.

Figure 25D:
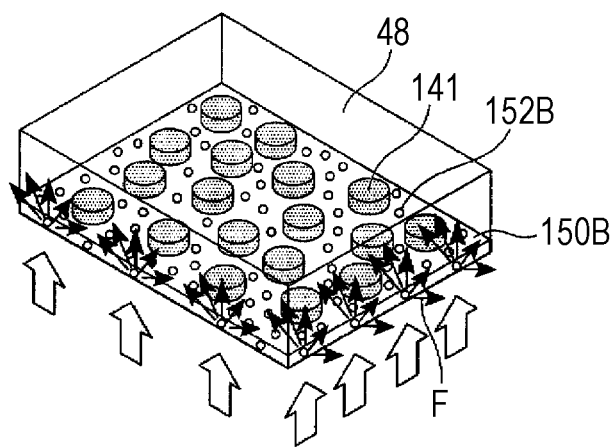
FIG. 25D is a perspective view illustrating the light control film of the liquid crystal display device of the eighth embodiment of the present invention in a manufacturing step order.

Next, as illustrated in FIG. 25D, a transparent negative resist made of an acrylic resin is coated as a material of the light diffusion portion on the upper surface of the light shielding layer 141 by using a spin coating method, so as to form a coating film 48. Next, the base material 150B provided with the coating film 48 is placed on a hot plate, and the coating film 48 is prebaked.

Next, the coating film 48 is irradiated with diffused light F from the base material 150B side by using the light shielding layer 141 as a mask, so as to perform exposure. At this time, the exposure device which uses mixed rays including i rays of a wavelength of 365 nm, h rays of a wavelength of 404 nm, and g rays of a wavelength of 436 nm is used. An exposure amount is 600 mJ/cm$^2$.

In the exposure step, parallel light or diffused light is used. In addition, in the present embodiment, the light scattering bodies 152B are dispersed in the base material 150B, and thus light emitted from the exposure device arrives at the coating film 48 as diffused light after passing through the base material 150B.

For this reason, the base material 150B is set to a predetermined haze value, and thus it is not necessary to dispose a diffusion plate on a path of light emitted from the exposure device as means for irradiating the base material 150B with the diffused light F. The exposure is performed with the diffused light F, and thus the coating film 48 is radially exposed outwards from the non-formation area of the light shielding layer 141. Accordingly, the forward tapered hollow portions 143 are formed, and the reverse tapered side surface is formed at a part of the light diffusion portion 140 which is in contact with the hollow portion 143.

Then, the base material 150B provided with the coating film 48 is placed on the hot plate, and post exposure baking (PEB) is performed on the coating film 48.

Figure 25E:
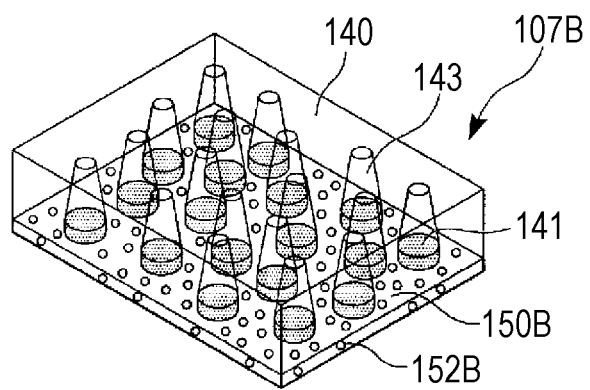
FIG. 25E is a perspective view illustrating the light control film of the liquid crystal display device of the eighth embodiment of the present invention in a manufacturing step order.

Subsequently, the coating film 48 formed from the transparent negative resist is developed by using a dedicated developer and is post-baked, so that a plurality of light diffusion portion 140 having a plurality of hollow portions 143 are formed on one surface of the base material 150B as illustrated in FIG. 25E.

Through the above-described steps, the light control film 107B of the present embodiment is completed.

Finally, the completed light control film 107B is attached to the liquid crystal display body 6 by using an optical adhesive or the like in a state in which the base material 150B is directed toward the viewing side and the light diffusion portion 140 opposes the second polarization plate 5 as illustrated in FIG. 24B.

The liquid crystal display device 101B of the present embodiment is completed due to the above-described steps.

According to the liquid crystal display device 101B of the present invention, the base material 150B itself functions as a diffusion film, and thus it is not necessary to provide a new adhesive layer or diffusion film. Therefore, it is possible to implement a simple and thin device. In addition, the base material 150B also functions as a diffusion plate in the management steps of the light control film 107B, and thus it is not necessary to dispose a diffusion plate on a path of light emitted from the exposure device when the light diffusion portion 140 is formed. Therefore, it is possible to simplify manufacturing steps.

Ninth Embodiment

Hereinafter, a ninth embodiment of the present invention will be described with reference to FIGS. 26A to 26B.

A fundamental configuration of a liquid crystal display device of the present invention is the same as the configuration of the seventh embodiment, and only configurations of a light control film and a light shielding layer are different from those of the seventh embodiment. Therefore, in the present embodiment, description of the fundamental configuration of the liquid crystal display device will be omitted, and only a light control film will be described.

Figure 26A:
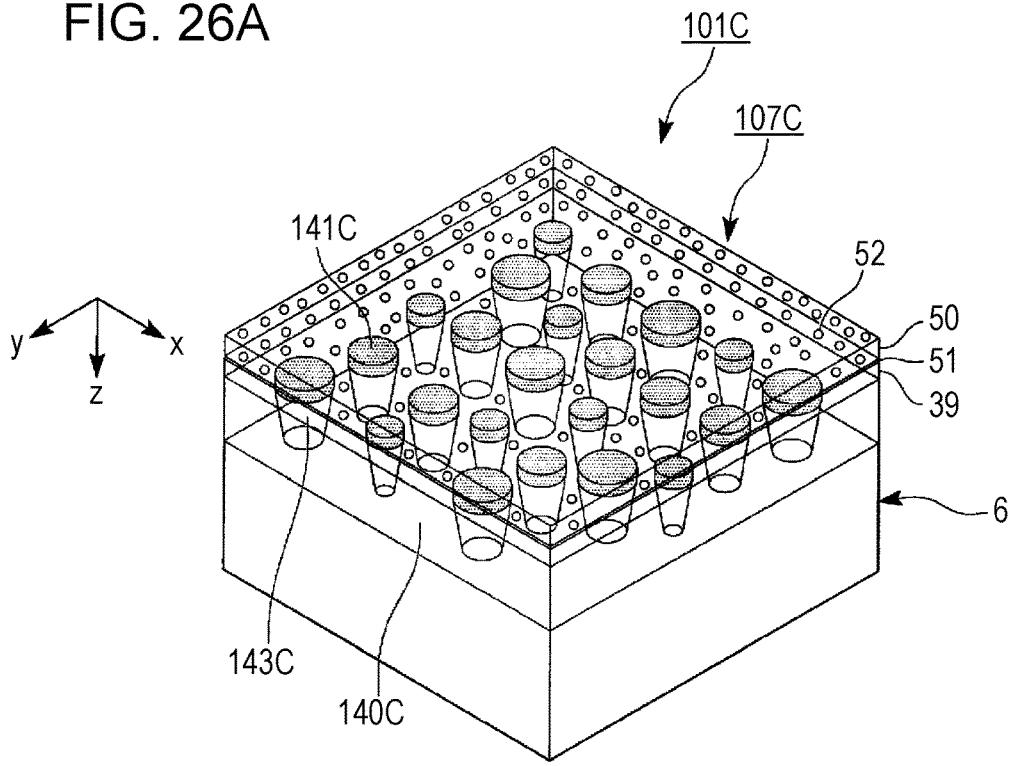
FIG. 26A is a schematic perspective view illustrating a liquid crystal display device of a ninth embodiment of the present invention.
Figure 26B:
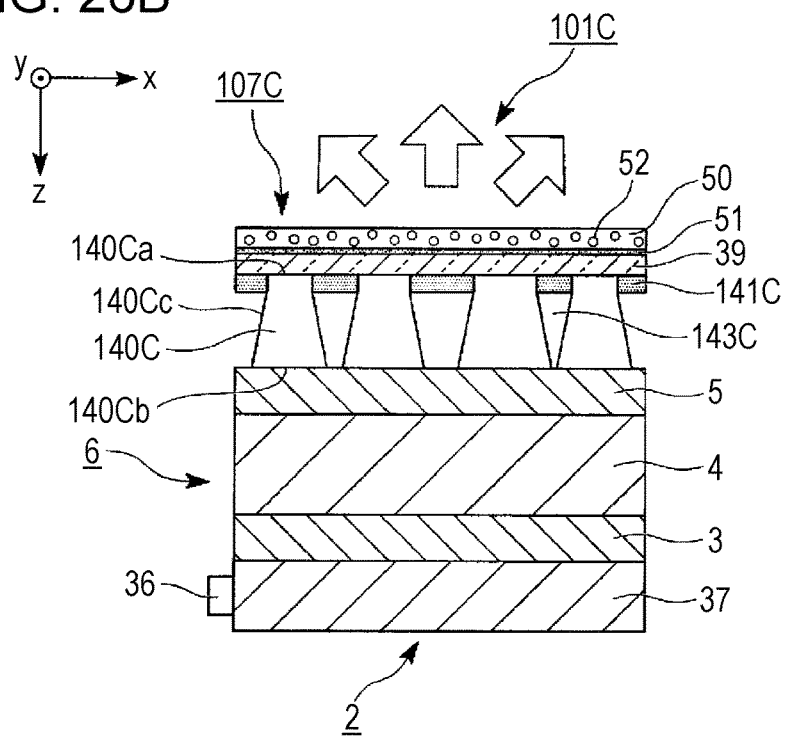
FIG. 26B is a schematic cross-sectional view illustrating the liquid crystal display device of the ninth embodiment of the present invention.

FIGS. 26A and 26B are schematic diagrams illustrating a liquid crystal display device of the present embodiment. FIG. 26A is a perspective view of a liquid crystal display device 101C of the present embodiment, and FIG. 26B is a cross-sectional view of the liquid crystal display device 101C of the present embodiment.

In addition, in FIGS. 26A and 26B, constituent elements common to the drawings used in the seventh embodiment are given the same reference numerals, and detailed description thereof will be omitted.

In the seventh embodiment, the plurality of light shielding layers 141 have the same dimensions. In contrast, in a light control film 107C of the present embodiment, as illustrated in FIG. 26A, dimensions (diameters) of a plurality of light shielding layers 141C are different from each other. For example, diameters of the plurality of light shielding layers 141C are distributed in a range of 10 μm to 25 μm. In other words, the plurality of light shielding layers 141C have a plurality of kinds of dimensions. In addition, in the same manner as in the seventh embodiment, the plurality of light shielding layers 141C are randomly disposed in a plane. Further, among the plurality of hollow portions 143C, a volume of at least one hollow portion 143C is different from volumes of other hollow portions 143C. Other configurations are the same as those of the seventh embodiment.

In a case of the present embodiment, since the plurality of light shielding layers 141C are not only disposed at random, but sizes of the light shielding layers 141C are different from each other, it is possible to more reliably minimize moire fringes due to a diffraction phenomenon of light. In addition, since a volume of at least one hollow portion 143C is different from volumes of other hollow portions 143C, it is possible to increase an arrangement density of the light shielding layers and to increase diffusion of light.

Tenth Embodiment

Hereinafter, a tenth embodiment of the present invention will be described with reference to FIG. 27.

A fundamental configuration of a liquid crystal display device of the present invention is the same as the configuration of the first embodiment, and is different from that of the first embodiment only in that a touch panel is provided. Therefore, in the present embodiment, description of the fundamental configuration of the liquid crystal display device will be omitted, and only a configuration of the touch panel will be described.

Figure 27:
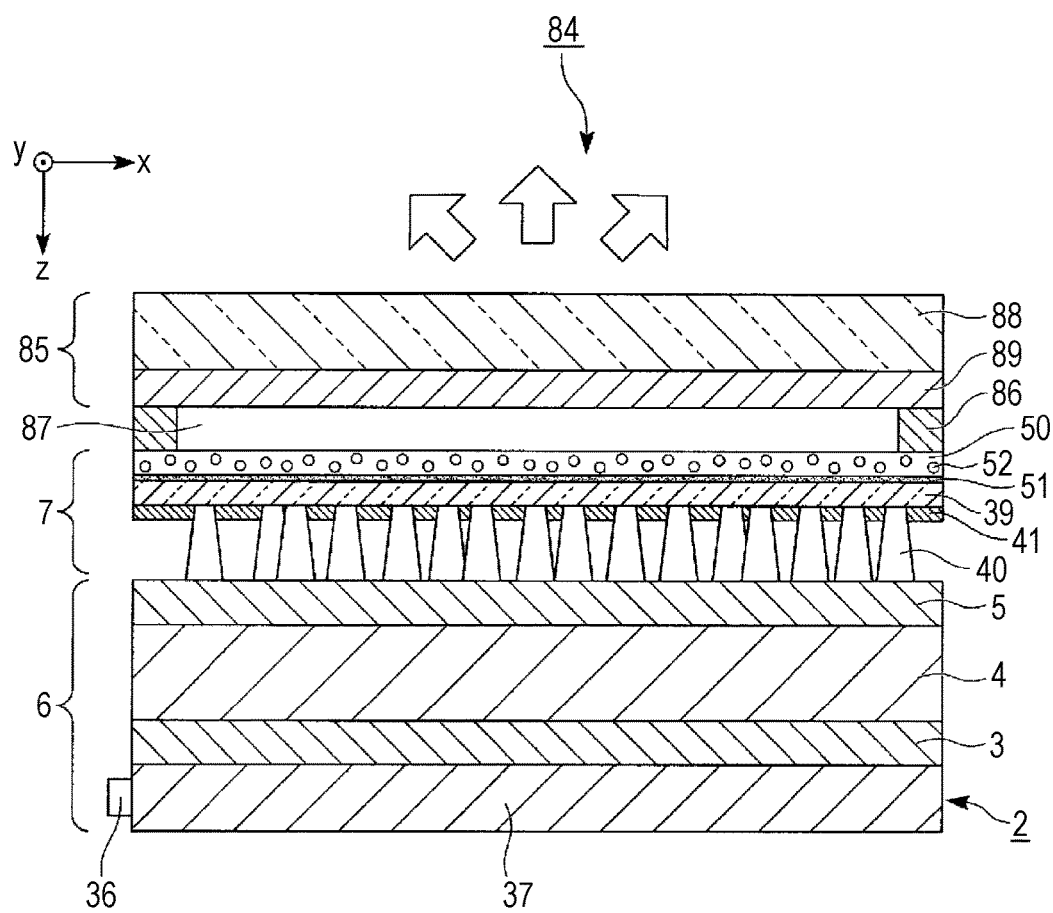
FIG. 27 is a cross-sectional view illustrating a liquid crystal display device of a tenth embodiment of the present invention.

FIG. 27 is a cross-sectional view illustrating a liquid crystal display device 84 of the present embodiment.

In addition, in FIG. 27, constituent elements common to the drawings used in the first embodiment are given the same reference numerals, and detailed description thereof will be omitted.

In the liquid crystal display device 84, as illustrated in FIG. 27, configurations from the backlight 2 to the light control film 7 are the same as those of the first embodiment. In addition, a touch panel 85 (information input device) is disposed on the base material 39 forming the light control film 7 on the viewing side. In the following description, the base material 39 forming the light control film 7 is referred to as a "light diffusion sheet base material".

The touch panel 85 is joined onto the light diffusion sheet base material 39 via an adhesive 86 such as a double-sided tape at a circumferential portion of the light diffusion sheet base material 39, and a gap corresponding to a thickness of the adhesive 86 is formed between the touch panel 85 and the light diffusion sheet base material 39. In other words, there is an air layer 87 between the touch panel 85 and the light diffusion sheet base material 39.

The touch panel 85 includes a base material 88 and a position detection electrode 89. In the following description, the base material 88 forming the touch panel 85 is referred to as a "touch panel base material". The position detection electrode 89 made of a transparent conductive material such as ITO or antimony-doped tin oxide (ATO) is formed on one surface of the touch panel base material 88 made of glass or the like. The position detection electrode 89 is formed by sputtering ITO, ATO, or the like, and has uniform sheet resistance of several hundreds to 2 kΩ/□.

In the present embodiment, the capacitance type touch panel 85 is used. In the capacitance type touch panel 85, a minute voltage is applied to four corner portions of the position detection electrode 89 in a plan view of the touch panel 85, for example. If the finger touches any position of an upper side of the position detection electrode 89, a point touched by the finger is grounded via a human electrostatic capacitor. Accordingly, voltages at the corner portions vary depending on resistance values between the grounded point and the four corner portions. A position detection circuit measures the voltage variation as a current variation, and detects the grounded point, that is, the position touched by the finger from the measured value.

In addition, a touch panel applicable to the present embodiment is not limited to a capacitance type touch panel, and any type of touch panel, such as a resistance film type, an ultrasonic type, or an optical type is applicable thereto.

According to the liquid crystal display device 84 of the present embodiment, the light control film 7 as in the first embodiment is provided, and thus it is possible to implement a liquid crystal device which has a good viewing angle performance and further has an information input function. For example, a user touches the touch panel 85 with the finger or a pen while viewing an image of a wide viewing angle, and thus can input information in an interactive form by using an information processing apparatus or the like.

FIG. 28 is a schematic configuration diagram illustrating an example of a manufacturing device of the light control film.

A manufacturing apparatus 150 illustrated in FIG. 28 transports the long base material 39 in a roll-to-roll method, and performs various processes during that time. In addition, the manufacturing apparatus 150 uses a print method or an ink jet method instead of the photolithography method using the photomask 45 when forming the light shielding layer 41.

A delivery roller 151 which delivers the base material 39 is provided at one end of the manufacturing apparatus 150, a winding roller 152 which winds the base material 39 is provided at the other end thereof, and the base material 39 is moved from the delivery roller 151 side toward the winding roller 152 side. A printing device 153, a first drying device 154, a coating device 155, a development device 156, and a second drying device 157 are sequentially disposed over the base material 39 from the delivery roller 151 side to the winding roller 152 side. An exposure device 158 is disposed under the base material 39.

The printing device 153 prints the light shielding layer 41 on the base material 39. The first drying device 154 dries the light shielding layer 41 which is formed through the printing. The coating device 155 coats a transparent negative resist on the light shielding layer 41. The development device 156 develops the exposed transparent negative resist with a developer. The second drying device 157 dries the base material 39 provided with the light diffusion portion 40 which is formed from the developed transparent resist. Subsequently, the base material 39 provided with the light diffusion portion 40 is joined to the second polarization plate 5 so that the light control film is integrally formed with the polarization plate.

Figure 29A:
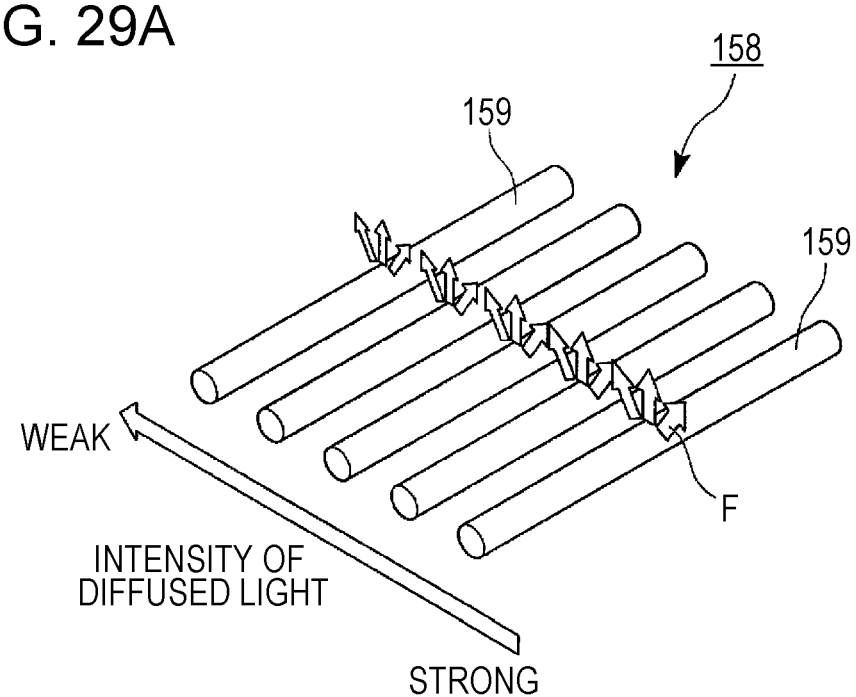
FIG. 29A is a perspective view illustrating a main part of the manufacturing device of the light control film.
Figure 29B:
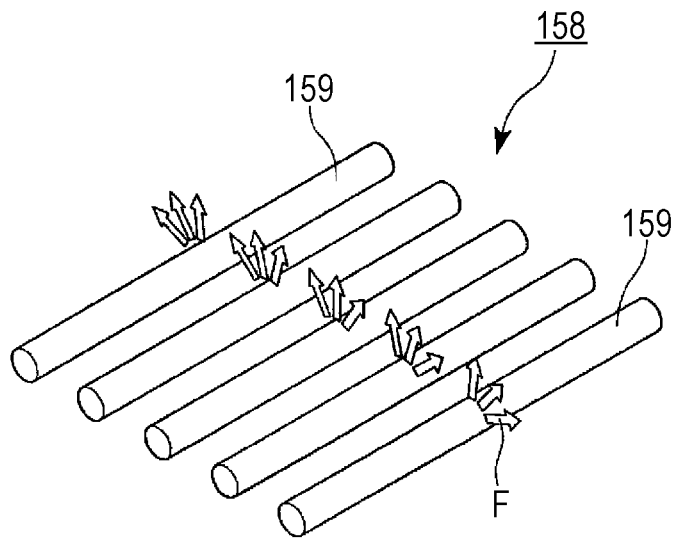
FIG. 29B is a perspective view illustrating a main part of the manufacturing device of the light control film.

The exposure device 158 performs exposure on coating films 149 and 150 of the transparent negative resist from the base material 39 side. FIGS. 29A and 29B are diagrams illustrating only the extracted the exposure device 158 part of the manufacturing apparatus 150. As illustrated in FIG. 29A, the exposure device 158 includes a plurality of light sources 159, and intensity of diffused light F may vary, for example, intensity of the diffused light F from each light source 159 is gradually weakened according to the progress of the base material 39. Alternatively, in the exposure device 158, as illustrated in FIG. 29B, an emission angle of the diffused light F from each light source 159 may gradually vary according to the progress of the base material 39. By using the exposure device 158, a tilt angle of the side surface of the light diffusion portion 40 can be controlled to a desired angle.

In addition, in the above-described example, a liquid resist is coated when the light shielding layer 41 or the light diffusion portion 40 is formed, but, alternatively, a film-like resist may be attached to one surface of the base material 39.

Finally, the completed light control film is attached to the liquid crystal display body 6 by using an optical adhesive or the like in a state in which the base material 39 is directed toward the viewing side and the light diffusion portion 40 opposes the second polarization plate 5 as illustrated in FIG. 2.

The liquid crystal display device of the present embodiment is completed due to the above-described steps.

In addition, the technical scope of the present invention is not limited to the above-described embodiments, and various modifications may be added within the scope without departing from the spirit of the present invention. For example, in the embodiments, the liquid crystal display device has been exemplified as a display body, but the present invention is not limited thereto, and is applicable to an organic electroluminescence display device, a plasma display, and the like.

In addition, in the embodiments, description has been made of an example in which the light control film is adhered onto the second polarization plate of the liquid crystal display body, but the light control film is not necessarily required to be in contact with the liquid crystal display body.

For example, other optical films or optical components may be interposed between the light control film and the liquid crystal display body. Alternatively, the light control film may be separated from the liquid crystal display body. In addition, in a case of an organic electroluminescence display device, a plasma display, or the like, the polarization plate is not necessary, and thus the light control film is not in contact with the polarization plate.

In addition, in the embodiments, at least one of an anti-reflection layer, a polarization filter layer, an antistatic layer, an anti-glare layer, and an anti-contamination layer may be provided on the viewing side of the base material of the light control film. According to the configuration, a function of reducing external light reflection, a function of preventing attachment of dust or contamination, a function of preventing damage, or the like can be added depending on the kind of layer provided on the viewing side of the base material, and it is possible to prevent degradation of a viewing angle performance over the time.

Further, in the embodiments, the light diffusion portion has a shape which is symmetric with respect to the central axis, but may not necessarily have a symmetric shape. For example, in a case where an asymmetric angle distance is required depending on an application or usage of a display device, for example, in a case where a viewing angle is desired to be widened only upward or rightward, a tilt angle of the side surface of the light diffusion portion may be asymmetric.

In addition, there may be a plurality of layers including light scattering bodies.

Further, specific configurations regarding an arrangement or a shape of the light diffusion portion or the light shielding layer, a dimension or a material of each portion of the light control film, and the like may be changed as appropriate.

INDUSTRIAL APPLICABILITY

The present invention is applicable to various display devices such as a liquid crystal display device, an organic electroluminescence display device, and a plasma display.

REFERENCE SIGNS LIST 1, 1B, 1C, 1D, 1E, 1F, 101, 101A, 101B, 101C, 84 LIQUID CRYSTAL DISPLAY DEVICE (DISPLAY DEVICE)
2 BACKLIGHT (LIGHT SOURCE)
4 LIQUID CRYSTAL PANEL (LIGHT MODULATION ELEMENT)
6 LIQUID CRYSTAL DISPLAY BODY (DISPLAY DEVICE)
7, 7A, 7B, 7C, 7D, 7E, 7F, 107, 107A, 107B, 107C LIGHT CONTROL FILM (LIGHT DIFFUSION MEMBER, VIEWING ANGLE WIDENING MEMBER)
39, 50B, 150B BASE MATERIAL
40, 40C, 40D, 40E, 40F, 40G, 40H, 40I, 40J, 40K, 40L, 40M, 40N, 40P, 140, 140A, 140C LIGHT DIFFUSION PORTION
40a, 400a, 40Da, 40Ea, 40Fa, 140a, 1400a LIGHT EMISSION END SURFACE
40b, 400b, 40Db, 40Eb, 40Fb, 140b, 1400b LIGHT INCIDENCE END SURFACE
40c, 40Cc, 40Ec, 40Dc, 140c, 140Cc SIDE SURFACE
41, 41C, 41D, 41E, 41F, 14I, 141A, 141C, 141G, 141H, 141I, 141J, 141K, 141L, 141M, 141N, 141P LIGHT SHIELDING LAYER
48 COATING FILM (NEGATIVE PHOTOSENSITIVE RESIN LAYER)
52, 52B, 152B LIGHT SCATTERING BODY
85 TOUCH PANEL (INFORMATION INPUT DEVICE)

The invention claimed is:
1. A light control film comprising at least:
a light-transmissive base material;
a light diffusion portion in a light diffusion region that defines a portion of one surface of the base material, the light diffusion portion having one plate shape;

a plurality of light shielding layers in a remaining region excluding the light diffusion region, and a low refractive index portion filled with a material having a refractive index lower than a refractive index of a material defining the light diffusion portion is in a space partitioned by the plurality of light shielding layers and an outer circumferential surface of the light diffusion portion, wherein the light diffusion portion is thicker than the plurality of light shielding layers between a light emission end surface which is in contact with the one surface of the base material and a light incidence end surface which is separated from the light emission end surface in a thickness direction, and an area of the light emission end surface is smaller than an area of the light incidence end surface, the low refractive index portion is defined by a plurality of hollow portions provided in the light diffusion portion, each of the plurality of hollow portions penetrating between the light incidence end surface and the light emission end surface, the each of the plurality of hollow portions having a truncated cone shape, the plurality of light shielding layers is farther away from the light incidence end surface than the low refractive index portion, the plurality of light shielding layers and the light diffusion portion are defined in a shape satisfying Expression (1) when an area of a portion where the plurality of light shielding layers is in contact with the one surface of the base material is S1, and an area of a portion where the low refractive index portion is exposed between the light incidence end surface is S2, where $(S1-S2)/S1 \times 100 \geq 50$ is Expression (1), and the plurality of light shielding layers are randomly arranged.

2. The light control film according to claim 1, wherein the outer circumferential surface of the light diffusion portion defines a tilted surface which extends from the light emission end surface to the light incidence end surface, and the tilted surface is tilted in a range of 41 degrees to 89 degrees with respect to the light incidence end surface.

3. The light control film according to claim 2, further comprising a light scattering layer including a light scattering body between the base material and the light diffusion portion.

4. The light control film according to claim 2, further comprising a light scattering layer including a light scattering body that overlaps another surface of the base material.

5. The light control film according to claim 1, wherein a planar shape of the portion where the plurality of light shielding layers is in contact with the one surface of the base material is an anisotropic shape having at least a major axis and a minor axis.

6. The light control film according to claim 1, wherein a planar shape of the portion where the plurality of light shielding layers is in contact with the one surface of the base material is defined to be a mixture of an isotropic shape and an anisotropic shape.

7. The light control film according to claim 1, wherein a planar shape of the portion where the plurality of light shielding layers is in contact with the one surface of the base material is a polygonal shape.

8. The light control film according to claim 1, wherein a planar shape of the portion where the plurality of light shielding layers is in contact with the one surface of the base material is a shape defined by a curve and a straight line.

9. The light control film according to claim 1, wherein the low refractive index material is air or an inert gas.

10. The light control film according to claim 1, wherein the plurality of light shielding layers includes a black resin including at least one of a light absorption pigment, a light absorption dye, and carbon black, or a metal, or includes a multilayer film of metal oxides.

11. The light control film according to claim 1, further comprising another light diffusion portion that is in another region that defines a portion of the one surface of the base material, the another light diffusion portion being adjacent to the light diffusion portion, wherein a first light incidence surface of the light diffusion portion is separated from a second light incidence surface of the another light diffusion portion.

12. The light control film according to claim 1, wherein
a first surface having the area S1 is opposed to a second surface having the area S2, and
all of the second surface is overlapped with the first surface in a plan view which is parallel to the first and the second surfaces.

13. The light control film according to claim 1, wherein the light diffusion portion includes a cylindrical portion that is perpendicular to the light emission end surface directly adjacent to the one surface of the base material and a conical portion between the cylindrical portion and the light incidence end surface, and
the cylindrical portion is integrally provided with the conical portion.

14. The light control film according to claim 1, wherein $(S1'-S2')/S1' \times 100 \geq 50$ is satisfied, where an area of a lower base of each of the plurality of hollow portions is S1', and an area of an upper base of each of the plurality of hollow portions is S2'.

15. A display device comprising:
the light control film according to claim 1; and
a display body joined to the light control film.

16. The display device according to claim 15, wherein the display body includes a plurality of pixels defining a display image, wherein each of the plurality of pixels includes at least a portion of the plurality of light shielding layers of a light diffusion member.

17. The display device according to claim 15, wherein the display body includes a light source and a light modulation element that modulates light from the light source, and wherein the light source emits directive light.

18. The display device according to claim 15, wherein the display body is a liquid crystal display element.

19. A method for manufacturing the light control film according to claim 1, the method comprising:
forming the plurality of light shielding layers to overlap the base material;
forming the plurality of hollow portions through which the base material is exposed to the plurality of light shielding layers; and
forming the light diffusion portion in which a light scattering body is dispersed by using the plurality of light shielding layers as a mask.

20. The method for manufacturing the light control film according to claim 19, wherein the plurality of light shielding layers is formed by using any one of a black resin, a black ink, a metal, and a multilayer film of a metal and a metal oxide.

* * * * *